(12) United States Patent
Sim et al.

(10) Patent No.: US 9,716,129 B1
(45) Date of Patent: Jul. 25, 2017

(54) MEMORY DEVICE AND ELECTRONIC APPARATUS INCLUDING THE SAME

(71) Applicant: SAMSUNG ELECTRONICS CO., LTD., Suwon-si, Gyeonggi-Do (KR)

(72) Inventors: Kyu-Rie Sim, Hwaseong-si (KR); Gwan-Hyeob Koh, Seoul (KR); Dae-Hwan Kang, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/285,922

(22) Filed: Oct. 5, 2016

(30) Foreign Application Priority Data

Jan. 27, 2016 (KR) .................. 10-2016-0010078

(51) Int. Cl.
*H01L 45/00* (2006.01)
*H01L 27/24* (2006.01)

(52) U.S. Cl.
CPC ...... *H01L 27/2481* (2013.01); *H01L 27/2427* (2013.01); *H01L 45/06* (2013.01); *H01L 45/126* (2013.01); *H01L 45/1233* (2013.01); *H01L 45/144* (2013.01)

(58) Field of Classification Search
None
See application file for complete search history.

(56) References Cited

U.S. PATENT DOCUMENTS

| 7,442,602 | B2 | 10/2008 | Park et al. |
| 7,651,906 | B2 | 1/2010 | Park et al. |
| 7,671,395 | B2 | 3/2010 | Park et al. |
| 8,054,674 | B2 | 11/2011 | Tamai et al. |
| 8,486,752 | B2 | 7/2013 | Chang |
| 8,609,503 | B2 | 12/2013 | Lee et al. |
| 8,664,631 | B2 * | 3/2014 | Hirota ............... H01L 45/04 257/2 |
| 8,804,398 | B2 | 8/2014 | Chung |
| 8,884,263 | B2 | 11/2014 | Oh et al. |
| 2008/0164454 | A1 * | 7/2008 | Chen ............ H01L 27/2409 257/4 |
| 2011/0233500 | A1 * | 9/2011 | Nishimura ...... H01L 27/2409 257/2 |
| 2013/0092894 | A1 * | 4/2013 | Sills ................ H01L 45/085 257/4 |
| 2013/0221309 | A1 * | 8/2013 | Lee ................. H01L 45/085 257/2 |

(Continued)

FOREIGN PATENT DOCUMENTS

KR 100689831 2/2007

*Primary Examiner* — Benjamin Sandvik
(74) *Attorney, Agent, or Firm* — F. Chau & Associates, LLC

(57) ABSTRACT

The inventive concept provides a memory device, in which memory cells are arranged to have a low variation in electrical characteristics and thereby enhanced reliability, an electronic apparatus including the memory device, and a method of manufacturing the memory device. In the memory device, memory cells at different levels may be covered with spacers having different thicknesses, and this may control resistance characteristics (e.g., set resistance) of the memory cells and to reduce a vertical variation in electrical characteristics of the memory cells. Furthermore, by adjusting the thicknesses of the spacers, a sensing margin of the memory cells may increase.

20 Claims, 38 Drawing Sheets

(56) References Cited

U.S. PATENT DOCUMENTS

| | | | |
|---|---|---|---|
| 2014/0239246 A1* | 8/2014 | Noda | H01L 27/2481 257/4 |
| 2014/0339489 A1 | 11/2014 | Kim | |
| 2015/0243708 A1 | 8/2015 | Ravasio et al. | |
| 2016/0181321 A1* | 6/2016 | Jung | H01L 45/06 257/4 |

* cited by examiner

MEMORY DEVICE AND ELECTRONIC APPARATUS INCLUDING THE SAME

CROSS-REFERENCE TO RELATED APPLICATION

This application claims the benefit under 35 U.S.C. §119 of Korean Patent Application No. 10-2016-0010078, filed on Jan. 27, 2016, in the Korean Intellectual Property Office, the disclosure of which is incorporated by reference herein in its entirety.

TECHNICAL FIELD

The inventive concept relates to a memory device and a method of fabricating the same, and more particularly, to a cross-point stack memory device and a method of fabricating the same.

DISCUSSION OF RELATED ART

To meet an increasing demand for small and lightweight electronic products, highly-integrated semiconductor devices are generally required. To this end, a three-dimensional (3D) cross-point stack memory device in which a memory cell is located at an intersection of two intersecting electrodes has been proposed. The proposed memory device may provide high-density data storage with minimal cell size. However, due to the increasing need for the downscaling of the cross-point stack memory device, it may need to further reduce the dimension of each layer in the memory device. In this case, to obtain the desired reliability of the memory device, it may need to control variations in electrical characteristics of the memory cells.

SUMMARY

The inventive concept provides a memory device configured to reduce variations in electrical characteristics of memory cells and thereby enhance reliability, an electronic apparatus including the memory device, and a method of manufacturing the memory device.

According to an aspect of the inventive concept, there is provided a memory device including a first electrode line layer provided on a substrate, the first electrode line layer including a plurality of first electrode lines which extend in a first direction and are spaced apart from each other, a second electrode line layer provided on the first electrode line layer, the second electrode line layer including a plurality of second electrode lines which extend in a second direction different from the first direction and are spaced apart from each other, a third electrode line layer provided on the second electrode line layer, the third electrode line layer including a plurality of first electrode lines, a first memory cell layer provided between the first and second electrode line layers, the first memory cell layer including a plurality of first memory cells arranged at respective intersections of the plurality of first electrode lines of the first electrode line layer and the plurality of second electrode lines, a second memory cell layer provided between the second and third electrode line layers, the second memory cell layer including a plurality of second memory cells arranged at respective intersections of the plurality of second electrode lines and the plurality of first electrode lines of the third electrode line layer, and spacers including first spacers covering side surfaces of the plurality of first memory cells and second spacers covering side surfaces of the plurality of second memory cells. Each of the plurality of first and second memory cells may include a selection device, an intermediate electrode, and a variable resistance pattern stacked in an upward or downward direction, and the first spacers may have a thickness different from that of the second spacers.

According to another aspect of the inventive concept, there is provided a memory device including a first electrode line layer provided on a substrate, the first electrode line layer including a plurality of first electrode lines which extend in a first direction and are spaced apart from each other, a second electrode line layer provided on the first electrode line layer, the second electrode line layer including a plurality of second electrode lines which extend in a second direction different from the first direction and are spaced apart from each other, a third electrode line layer provided on the second electrode line layer, the third electrode line layer including a plurality of first electrode lines, a first memory cell layer provided between the first and second electrode line layers, the first memory cell layer including a plurality of first memory cells arranged at respective intersections of the plurality of first electrode lines of the first electrode line layer and the plurality of second electrode lines, a second memory cell layer provided between the second and third electrode line layers, the second memory cell layer including a plurality of second memory cells arranged at respective intersections of the plurality of second electrode lines and the plurality of first electrode lines of the third electrode line layer, and spacers including first spacers covering side surfaces of the plurality of first memory cells and second spacers covering side surfaces of the plurality of second memory cells. Each of the plurality of first and second memory cells may include a selection device, an intermediate electrode, and a variable resistance pattern stacked in an upward or downward direction, and at least one of the plurality of first spacers and the plurality of second spacers may include a material exerting a compressive or tensile stress on the variable resistance patterns.

According to still another aspect of the inventive concept, there is provided an electronic apparatus including a processor configured to perform commands and to process data, a memory channel including at least one signal line connected to the processor, a first memory device connected to the processor through the memory channel, the first memory device including a first level memory having a first operation speed and a nonvolatile property, and a second memory device connected to the processor through the memory channel, the second memory device including a second level memory having a second operation speed that is faster than the first operation speed. The first level memory may include at least two memory cell layers, each of which has a cross-point structure and includes a plurality of memory cells and spacers respectively covering side surfaces of the plurality of memory cells. Each of the plurality of memory cells may include a selection device, an intermediate electrode, and a variable resistance pattern. The spacers covering the side surfaces of the plurality of memory cells in one of the at least two memory cell layers may have a thickness different from that of the spacers covering the side surfaces of the plurality of memory cells in at least one other of the at least two memory cell layers.

According to still another aspect of the inventive concept, there is provided a method of manufacturing a memory device, the method including: forming a first electrode line layer on a substrate, the first electrode line layer including a plurality of first electrode lines extending in a first direction and spaced apart from each other in a second direction different from the first direction; forming a first memory cell layer on the first electrode line layer, the first memory cell including a plurality of first memory cells, of which each includes a first lower electrode, a first selection device, a first intermediate electrode, a first heating electrode, and a first variable resistance pattern sequentially stacked, the plurality of first memory cells electrically connected to the plurality of first electrode lines and spaced apart from each other in the first and second directions; forming a first inner spacer on side surfaces of the first lower electrode and the first selection device for each of the plurality of first memory cells; forming a first spacer on side surfaces of the first inner spacer, the first immediate electrode, the first heating electrode, and the first variable resistance pattern for each of the plurality of first memory cells; forming a second electrode line layer on the first memory cell layer, the second electrode line layer including a plurality of second electrode lines extending in the second direction, spaced apart from each other in the first direction, and electrically connected to the plurality of first memory cells; forming a second memory cell layer on the second electrode line layer, the second memory cell including a plurality of second memory cells, of which each includes a second lower electrode, a second selection device, a second intermediate electrode, a second heating electrode, and a second variable resistance pattern sequentially stacked, the plurality of second memory cells electrically connected to the plurality of second electrode lines and spaced apart from each other in the first and second directions; forming a second inner spacer on side surfaces of the second lower electrode and the second selection device for each of the plurality of second memory cells; forming a second spacer on at least side surfaces of the second immediate electrode, the second heating electrode, and the second variable resistance pattern for each of the plurality of second memory cells; and forming a third electrode line layer on the second memory cell layer, the third electrode line layer including a plurality of third electrode lines extending in the first direction, spaced apart from each other in the second direction, and electrically connected to the plurality of second memory cells, in which the first spacer may have a thickness different from that of the second spacer.

BRIEF DESCRIPTION OF THE DRAWINGS

Exemplary embodiments of the inventive concept will be more clearly understood from the following detailed description taken in conjunction with the accompanying drawings in which.

Figure 1:
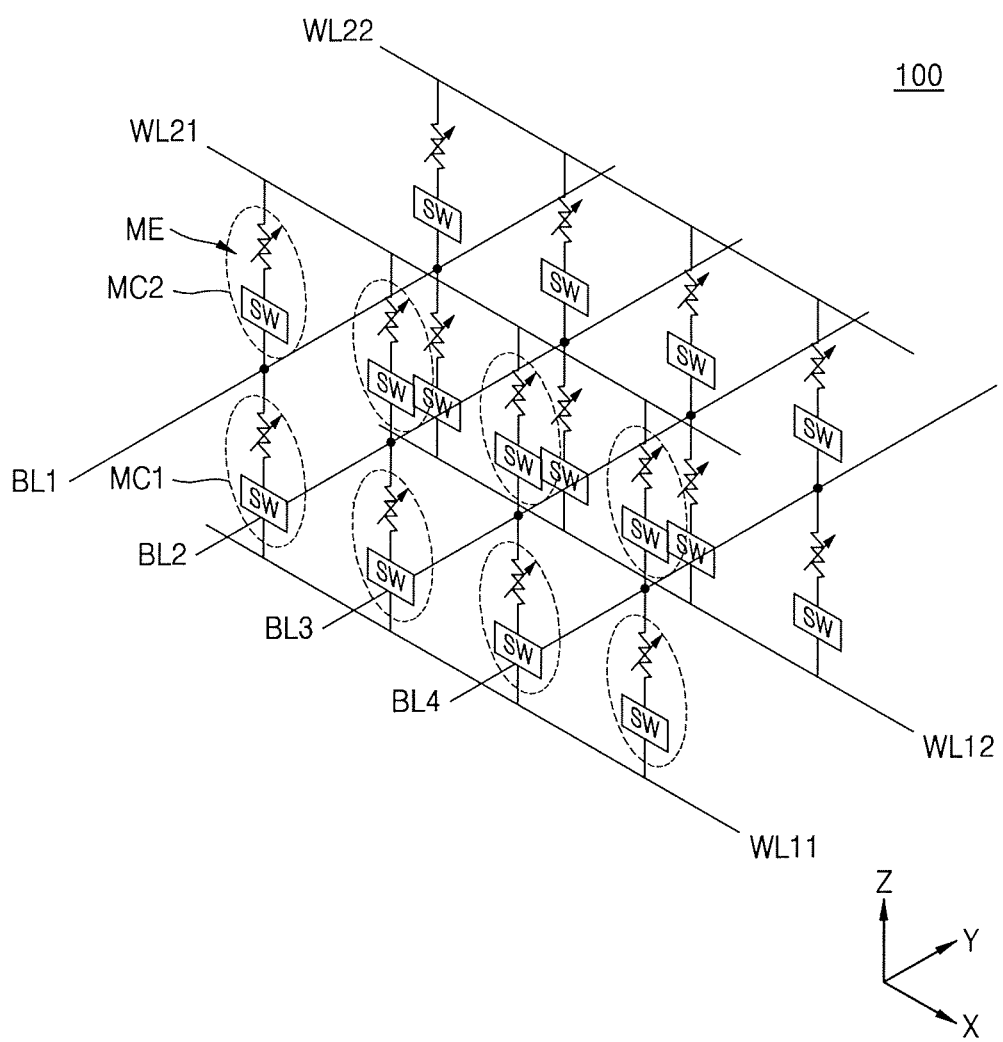
FIG. 1 is an equivalent circuit diagram of a memory device according to an exemplary embodiment of the inventive concept.

Since the drawings in FIGS. 1-24 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

The present invention will be described more fully hereinafter with reference to the accompanying drawings, in which exemplary embodiments of the inventive concept are shown.

FIG. 1 is an equivalent circuit diagram of a memory device 100 according to an exemplary embodiment of the inventive concept.

Referring to FIG. 1, the memory device 100 may include lower word lines WL11 and WL12, which extend in a first direction X and are spaced apart from each other in a second direction Y perpendicular to the first direction X, and upper word lines WL21 and WL22, which extend in the first direction X and are spaced apart from each other in the second direction Y and spaced apart from the lower word lines WL11 and WL12 in a third direction Z perpendicular to the first and second directions X and Y. In addition, the memory device 100 may include common bit lines BL1, BL2, BL3, and BL4, which are spaced apart from each other in the first direction X and spaced apart from the upper word lines WL21 and WL22 and the lower word lines WL11 and WL12 in the third direction Z, and are extending in the second direction Y.

First and second memory cells MC1 and MC2 may be provided, respectively, between the common bit lines BL1, BL2, BL3, and BL4 and the lower word lines WL11 and WL12, and between the common bit lines BL1, BL2, BL3, and BL4 and the upper word lines WL21 and WL22. For example, the first memory cells MC1 may be arranged at respective intersections of the common bit lines BL1, BL2, BL3, and BL4 and the lower word lines WL11 and WL12, and each of the first memory cells MC1 may include a variable resistance pattern ME for storing data and a selection device SW for selecting the variable resistance pattern ME. The second memory cells MC2 may be arranged at respective intersections of the common bit lines BL1, BL2, BL3, and BL4 and the upper word lines WL21 and WL22, and each of the second memory cells MC2 may also include the variable resistance pattern ME for storing data and the selection device SW for selecting the variable resistance pattern ME. Meanwhile, the selection device SW may be referred to as a switching device, isolation device, or an access device. The selection device SW may be used to access the variable resistance pattern ME during programming or reading of the variable resistance pattern ME.

The first and second memory cells MC1 and MC2 may have substantially the same structure and may be arranged in the third direction Z. For example, in the first memory cell MC1 arranged between the lower word line WL11 and the common bit line BL1, the selection device SW may be electrically connected to the lower word line WL11, the variable resistance pattern ME may be electrically connected to the common bit line BL1, and the variable resistance pattern ME and the selection device SW may be connected in series to each other. Similarly, in the second memory cell MC2 arranged between the upper word line WL21 and the common bit line BL1, the variable resistance pattern ME may be electrically connected to the upper word line WL21, the selection device SW may be electrically connected to the common bit line BL1, and the variable resistance pattern ME and the selection device SW may be connected in series to each other.

The inventive concept is not limited to the above example. For instance, unlike that shown in FIG. 1, in each of the first and second memory cells MC1 and MC2, positions of the selection device SW and the variable resistance pattern ME may be exchanged for each other. In addition, when viewed along the third direction Z, the first and second memory cells MC1 and MC2 may be arranged to have a symmetrical arrangement about a corresponding one of the common bit lines BL1, BL2, BL3, and BL4. For example, the first and second memory cells MC1 and MC2 may be symmetrically arranged about the common bit line BL1 in such a way that the variable resistance pattern ME and the selection device SW of the first memory cell MC1 may be connected to the lower word line WL11 and the common bit line BL1, respectively, and the variable resistance pattern ME and the selection device SW of the second memory cell MC2 may be connected to the upper word line WL21 and the common bit line BL1, respectively.

Hereinafter, a method of operating the memory device 100 will be described briefly. For example, in the case where a voltage is applied to the variable resistance pattern ME of the first memory cell MC1 or the second memory cell MC2 through the word lines WL11, WL12, WL21, and WL22 and the common bit lines BL1, BL2, BL3, and BL4, a current may flow through the variable resistance pattern ME. The variable resistance pattern ME may include, for example, a phase-change material (PCM) layer which is reversibly switchable between a first state and a second state. However, the variable resistance pattern ME is not limited thereto, and any variable resistance material whose resistance can be changed by a voltage applied thereto may be used as the variable resistance pattern ME. For example, if at least one of the first and second memory cells MC1 and MC2 is selected, resistance of the variable resistance pattern ME of the selected memory cell may be reversibly switched between a first state and a second state by a voltage applied to the variable resistance pattern ME.

Digital data, such as "0" or "1", may be stored in the first and second memory cells MC1 and MC2, depending on a change in resistance of the variable resistance pattern ME. Similarly, with the resistance of the variable resistance patterns ME changed back to their original values, the stored digital data may be erased from the first and second memory cells MC1 and MC2. For example, a high-resistance state "0" and a low-resistance state "1" may be written as data in the first and second memory cells MC1 and MC2. Here, an operation of changing a high-resistance state "0" into a low-resistance state "1" may be referred to as a "set operation", and an operation of changing a low-resistance state "1" into a high-resistance state "0" may be referred to as a "reset operation". However, digital data stored in the first and second memory cells MC1 and MC2 according to an exemplary embodiment of the inventive concept are not limited to the high-resistance state "0" and the low-resistance state "1", but various resistance states may be stored in the first and second memory cells MC1 and MC2. For example, by applying voltage of different amplitudes to certain material, the electrical resistance may be switched to multiple values. These multiple resistance values instead of binary resistance states may be used to store data.

The first and second memory cells MC1 and MC2 may be selectively addressed by selecting the word lines WL11, WL12, WL21, and WL22 and the common bit lines BL1, BL2, BL3, and BL4, and the first and second memory cells MC1 and MC2 may be programmed by applying signals to the word lines WL11, WL12, WL21, and WL22 and the common bit lines BL1, BL2, BL3, and BL4. Also, resistances (or programmed data) of the variable resistance patterns of the first and second memory cells MC1 and MC2 may be determined by measuring currents flowing through the common bit lines BL1, BL2, BL3, and BL4.

Figure 2:
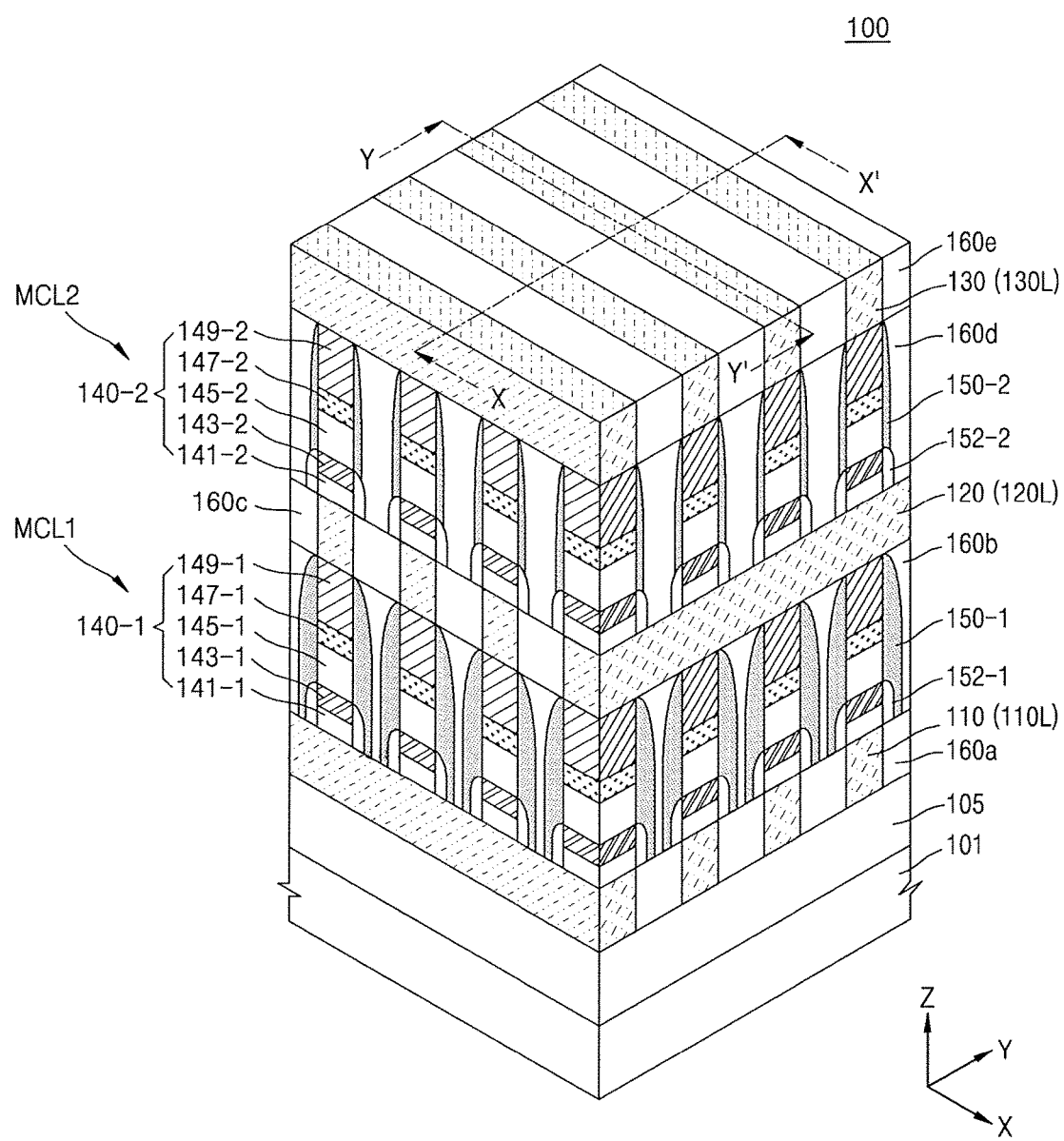
FIG. 2 is a perspective view of a memory device according to an exemplary embodiment of the inventive concept.
Figure 3:
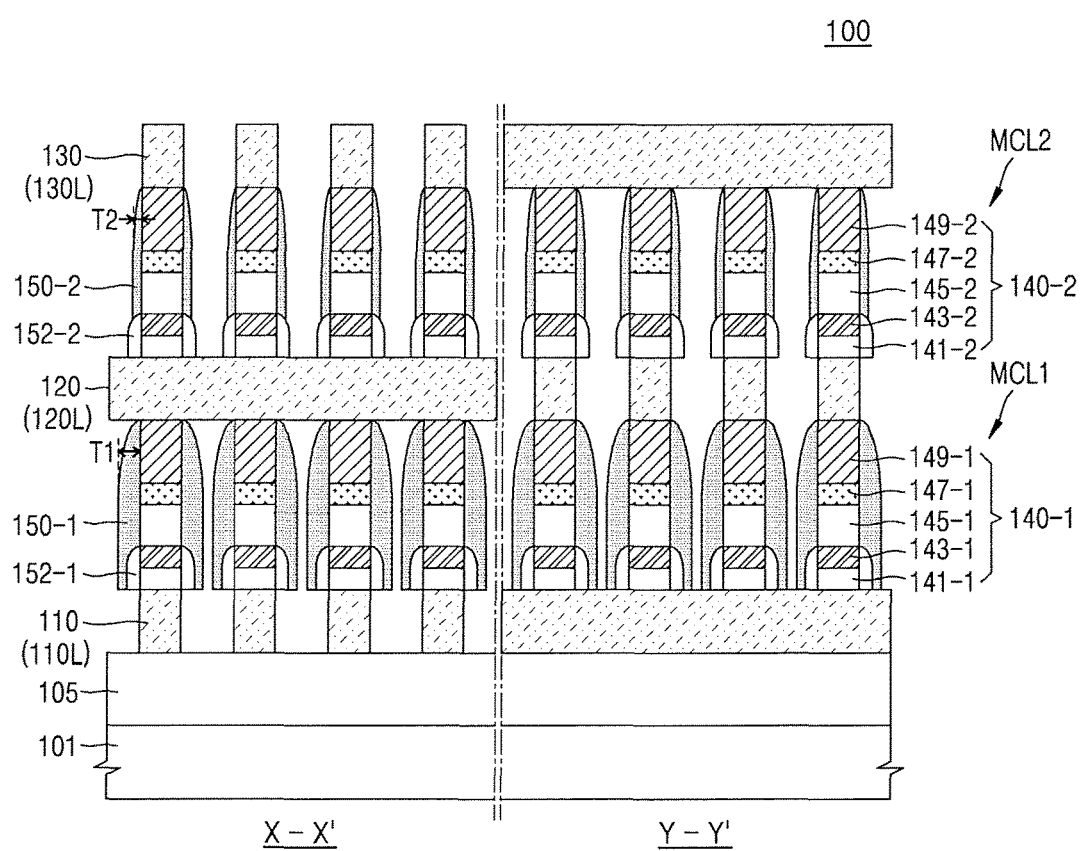
FIG. 3 is a sectional view taken along lines X-X' and Y-Y' of FIG. 2.

FIG. 2 is a perspective view of a memory device according to an exemplary embodiment of the inventive concept, and FIG. 3 is a sectional view taken along lines X-X' and Y-Y' of FIG. 2. To reduce complexity in the drawings and to provide a better understanding of the inventive concept, insulating layers 160*a*, 160*b*, 160*c*, 160*d*, and 160*e* are omitted from FIG. 3.

Referring to FIGS. 2 and 3, the memory device 100 may include a substrate 101, a first electrode line layer 110L, a second electrode line layer 120L, a third electrode line layer 130L, a first memory cell layer MCL1, a second memory cell layer MCL2, first spacers 150-1, and second spacers 150-2.

As shown in FIGS. 2 and 3, an interlayered insulating layer 105 may be arranged on the substrate 101. The interlayered insulating layer 105 may be formed of an oxide material (e.g., silicon oxide) or a nitride material (e.g., silicon nitride), and may be used to electrically separate the first electrode line layer 110L from the substrate 101. Although, in the memory device 100 according to the present embodiment, the interlayered insulating layer 105 is arranged on the substrate 101, this is just an example of the present embodiment. For example, in the memory device 100 according to the present embodiment, an integrated circuit layer may be arranged on the substrate 101, and memory cells may be arranged on the integrated circuit layer. The integrated circuit layer may include, for example, a peripheral circuit for operation of the memory cells and/or a core circuit for calculation. Here, the structure, in which an integrated circuit layer including a peripheral circuit and/or a core circuit is arranged on a substrate and memory cells are arranged on the integrated circuit layer, may be called a 'cell-on-peripheral (COP) structure'.

The first electrode line layer 110L may include a plurality of first electrode lines 110, which extend in a first direction X and are provided to be parallel to each other and spaced apart from each other in a second direction Y that is different from the first direction X. The second electrode line layer 120L may include a plurality of second electrode lines 120, which extend in the second direction Y and are provided to be parallel to each other and spaced apart from each other in the first direction X. In addition, the third electrode line layer 130L may include a plurality of third electrode lines 130, which extend in the first direction X and are provided to be parallel to each other and spaced apart from each other in the second direction Y. Although the third electrode lines 130 are different from the first electrode lines 110 in their positions in the third direction Z, the third electrode lines 130 may be substantially the same as the first electrode lines 110 in terms of extension direction or arrangement. In this sense, the third electrode lines 130 may be referred to as "the first electrode lines of the third electrode line layer 130L".

In operational aspects of a memory device, the first and third electrode lines 110 and 130 may serve as word lines, and the second electrode lines 120 may serve as bit lines. Alternatively, the first and third electrode lines 110 and 130 may serve as the bit lines, and the second electrode lines 120 may serve as the word lines. In the case where the first and third electrode lines 110 and 130 serve as the word lines, the first electrode lines 110 may serve as lower word lines and the third electrode lines 130 may serve as upper word lines. In addition, the second electrode lines 120 may be shared by the lower word lines and the upper word lines. That is, the second electrode lines 120 may serve as common bit lines.

Each of the first electrode lines 110, the second electrode lines 120, and the third electrode lines 130 may include, for example, metals, conductive metal nitrides, conductive metal oxides, or combinations thereof. For example, each of the first electrode lines 110, the second electrode lines 120, and the third electrode lines 130 may be formed of or include tungsten (W), tungsten nitride (WN), gold (Au), silver (Ag), copper (Cu), aluminum (Al), titanium aluminum nitride (TiAlN), iridium (Ir), platinum (Pt), palladium (Pd), ruthenium (Ru), zirconium (Zr), rhodium (Rh), nickel (Ni), cobalt (Co), chromium (Cr), Tin (Sn), zinc (Zn), indium tin oxide (ITO), alloys thereof, or combinations thereof. Also, each of the first electrode lines 110, the second electrode lines 120, and the third electrode lines 130 may include a metal layer and a conductive barrier layer covering at least a portion of the metal layer. The conductive barrier layer may be formed of or include, for example, Ti, TiN, Ta, TaN, or combinations thereof.

The first memory cell layer MCL1 may include a plurality of first memory cells 140-1, which are spaced apart from each other in the first and second directions X and Y and may serve as the first memory cells MC1 of FIG. 1. The second memory cell layer MCL2 may include a plurality of second memory cells 140-2, which are spaced apart from each other in the first and second directions X and Y and may serve as the second memory cells MC2 of FIG. 1. As shown in FIG. 2, the first electrode lines 110 and the second electrode lines 120 may be provided to intersect each other, and the second electrode lines 120 and the third electrode lines 130 may be provided to intersect each other. The first memory cells 140-1 may be provided between the first electrode line layer 110L and the second electrode line layer 120L and at respective intersections of the first electrode lines 110 and the second electrode lines 120, and may be connected to the first electrode lines 110 and the second electrode lines 120. The second memory cells 140-2 may be provided between the second and third electrode line layers 120L and 130L and at respective intersections of the second and third electrode lines 120 and 130, and may be connected to the second and third electrode lines 120 and 130.

Each of the first and second memory cells 140-1 and 140-2 may be provided to have a pillar-shaped structure with a rectangular section. Of course, the structures of the first and second memory cells 140-1 and 140-2 are not limited thereto. For example, the first and second memory cells 140-1 and 140-2 may be provided to have various pillar structures with circular, elliptical, and polygonal sections. Also, the first and second memory cells 140-1 and 140-2 may be provided to have a decreasing width in an upward or downward direction, depending on the method used to form them. For example, in the case where the first and second memory cells 140-1 and 140-2 are formed via an etching process, the first and second memory cells 140-1 and 140-2 may be formed to have a decreasing width in an upward direction. In the case where the first and second memory cells 140-1 and 140-2 are formed via a damascene process, the first and second memory cells 140-1 and 140-2 may be formed to have a decreasing width in a downward direction. In the case where the etching or damascene process is controlled to achieve a substantially vertical profile, the vertical difference in width of each of the first and second memory cells 140-1 and 140-2 may be reduced or removed. Although the first and second memory cells 140-1 and 140-2 are illustrated as having a vertical side surface profile so as to reduce complexity in the drawings, the first and second memory cells 140-1 and 140-2 may be provided to have a structure, whose bottom width is larger or smaller than its top width.

Each of the first memory cells 140-1 and each of the second memory cells 140-2 may include, respectively, a lower electrode 141-1 and a lower electrode 141-2, a selection device 143-1 and a selection device 143-2, an intermediate electrode 145-1 and an intermediate electrode 145-2, a heating electrode 147-1 and a heating electrode 147-2, and a variable resistance pattern 149-1 and a variable resistance pattern 149-2. Since the first and second memory cells 140-1 and 140-2 have substantially the same structure, the following description will be given with reference to the first memory cells 140-1, for convenience of description.

In an exemplary embodiment of the inventive concept, the variable resistance pattern 149-1 (or ME of FIG. 1) may include a phase-change material whose phase can be reversibly switched between amorphous and crystalline states, depending on a heating time. In general, phase-change materials may exist in an amorphous and one or sometimes several crystalline phases, and they can be rapidly and repeatedly switched between these phases. For example, the variable resistance pattern 149-1 may include a material whose phase can be reversibly changed using Joule's heat, which is generated when a voltage is applied to both terminals of the variable resistance pattern 149-1, and whose resistance can be changed by such a change in phase. In detail, the phase-change material may be in a high-resistance state when it has an amorphous phase and may be in a low-resistance state when it has a crystalline phase. In the memory device, the high- and low-resistance states of the variable resistance pattern 149-1 may be defined and stored as "data 0" and "data 1", respectively.

In an exemplary embodiment of the inventive concept, the variable resistance pattern 149-1 may include at least one of the elements in group VI of the periodic table (e.g., chalcogen elements) and optionally a chemical modifier containing at least one of the chemical elements in group III, IV or V. For example, the variable resistance pattern 149-1 may be formed of or include Ge—Sb—Te (germanium-antimony-tellurium, GST). Here, in the above chemical formula, the hyphen (-) is used to represent all chemical mixtures or compounds, in which listed elements are contained. For example, the expression "Ge—Sb—Te" may represent various materials such as $Ge_2Sb_2Te_5$, $Ge_2Sb_2Te_7$, $Ge_1Sb_2Te_4$, and $Ge_1Sb_4Te_7$.

The variable resistance pattern 149-1 may include other various phase-change materials, other than the above material (i.e., Ge—Sb—Te (GST)). Compositions of the phase-change materials for the variable resistance pattern 149-1 may contain mixtures of various elements which include, but are not limited to: germanium (Ge), antimony (Sb), tellurium (Te), indium (In), selenium (Se), Gallium (Ga), arsenic (As), aluminum (Al), bismuth (Bi), Tin (Sn), oxygen (O), sulfur (S), nitrogen (N), gold (Au), palladium (Pd), titanium (Ti), cobalt (Co), silver (Ag), and nickel (Ni). For example, the variable resistance pattern 149-1 may include at least one of Ge—Te, Sb—Te, In—Se, Ga—Sb, GeSb, In—Sb, As—Te, Al—Te, Bi—Sb—Te (BST), In—Sb—Te (IST), Ge—Sb—Te (GST), Te—Ge—As, Te—Sn—Se, Ge—Se—Ga, Bi—Se—Sb, Ga—Se—Te, Sn—Sb—Te, In—Sb—Ge, In—Ge—Te, Ge—Sn—Te, Ge—Bi—Te, Ge—Te—Se, As—Sb—Te, Sn—Sb—Bi, Ge—Te—O, GeSbTeN, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, GeBiSbTe, Sb—Te—Bi—Se, Ag—In—Sb—Te, Ge—Sb—Se—Te, Ge—Sn—Sb—Te, Ge—Te—Sn—Ni, Ge—Te—Sn—Pd, Ge—Te—Sn—Pt, GeInSbTe, In—Sn—Sb—Te, As—Ge—Sb—Te, and a combination thereof.

The variable resistance pattern 149-1 may be formed to have various chemical stoichiometric compositions. A crystallization temperature, a melting temperature, and a crystallization energy of the variable resistance pattern 149-1 may vary depending on the chemical stoichiometric composition, and thus, by changing the chemical stoichiometric composition, a phase-change speed and a data retention property of the variable resistance pattern 149-1 may be controlled.

The variable resistance pattern 149-1 may further include, for example, at least one of carbon (C), nitrogen (N), silicon (Si), oxygen (O), bismuth (Bi), boron (B), indium (In), and tin (Sn), which are used as an impurity. A driving current of the memory device 100 may be changed due to the presence of the impurity. In addition, the variable resistance pattern 149-1 may further include a metallic element. For example, the variable resistance pattern 149-1 may include at least one of aluminum (Al), gallium (Ga), zinc (Zn), titanium (Ti), chromium (Cr), manganese (Mn), iron (Fe), cobalt (Co), nickel (Ni), molybdenum (Mo), ruthenium (Ru), palladium (Pd), hafnium (Hf), lanthanum (LA), tantalum (Ta), iridium (Ir), platinum (Pt), zirconium (Zr), thallium (Tl), lead (Pb), and polonium (Po). The presence of the metallic element may lead to an increase in electric and thermal conductivities of the variable resistance pattern 149-1, and thus, the crystallization speed and the set speed of the variable resistance pattern 149-1 may increase. Also, in the case where the metallic element is contained in the variable resistance pattern 149-1, the data retention property of the variable resistance pattern 149-1 may be enhanced.

The variable resistance pattern 149-1 may have a multi-layered structure, in which two or more layers having different physical properties are stacked. The number or thicknesses of the layers of the variable resistance pattern 149-1 may be variously changed. A barrier layer may be further provided between the layers of the variable resistance pattern 149-1. The barrier layer may be configured to prevent a material from being diffused between the layers of the variable resistance pattern 149-1. For example, the barrier layer may prevent a material from being diffused from a previously-formed layer of the layers into a later-formed layer of the layers. The barrier layer may include, but is not limited to: SiN, TiN, $Ta_2O_5$, WN, TaN, TiSiN, TaSiN, highly nitrogen doped GST, or a combination thereof.

The variable resistance pattern 149-1 may be provided to include a plurality of layers, which are alternatingly stacked on each other and contain different materials from each other, to thereby have a super lattice structure. For example, the variable resistance pattern 149-1 may include first and second layers, which are formed of Ge—Te and Sb—Te, respectively, and are alternatingly stacked on each other. However, the materials for the first and second layers are not limited to Ge—Te and Sb—Te, and the afore-described various materials may be used for the first and second layers.

As described above, the variable resistance pattern 149-1 may include the phase-change material, but the inventive concept is not limited thereto. For example, the variable resistance pattern 149-1 of the memory device 100 according to the present embodiment may include various other materials exhibiting the variable resistance property.

In an exemplary embodiment of the inventive concept, the variable resistance pattern 149-1 may contain a transition metal oxide, and in this case, the memory device 100 may be a resistive random access memory (ReRAM). In the case where the variable resistance pattern 149-1 contains the transition metal oxide, a programming operation may be performed to create or destroy at least one electric path in the variable resistance pattern 149-1. The variable resistance pattern 149-1 may have a low resistance when the electric path is created and may have a high resistance when the electric path is destroyed. Such a difference in resistance level of the variable resistance pattern 149-1 may be used to store data in the memory device 100.

In the case where the variable resistance pattern 149-1 is formed of the transition metal oxide, the transition metal oxide may include at least one of metallic elements (e.g., Ta, Zr, Ti, Hf, Mn, yttrium (Y), Ni, Co, Zn, niobium (Nb), Cu, Fe, and Cr). For example, the transition metal oxide may include one or more layers, each of which is formed of at least one of $Ta_2O_{5-x}$, $TiO_{2-x}$, $HfO_{2-x}$, $MnO_{2-x}$, $Y_2O_{3-x}$, $NiO_{1-y}$, $Nb_2O_{5-x}$, $CuO_{1-y}$, and $Fe_2O_{3-x}$. In the materials listed above, the unknown parameters (i.e., x and y) may be selected to satisfy the condition of $0 \leq x \leq 1.5$ and $0 \leq y \leq 0.5$, but the inventive concept is not limited thereto.

In an exemplary embodiment of the inventive concept, the variable resistance pattern 149-1 may have a magnetic tunnel junction (MTJ) structure, in which two magnetic electrodes and a dielectric material interposed therebetween are provided, and in this case, the memory device 100 may be a magnetic RAM (MRAM).

The two magnetic electrodes described above may serve as a magnetization fixed layer and a magnetization free layer, and the dielectric material interposed therebetween may serve as a tunnel barrier layer. The magnetization fixed layer may have a fixed magnetization direction, and the magnetization free layer may have a magnetization direction that can be switched to be parallel or antiparallel to that of the magnetization fixed layer. The magnetization directions of the magnetization fixed layer and the magnetization free layer may be parallel to a surface of the tunnel barrier layer, but the inventive concept is not limited thereto. For example, the magnetization fixed layer and the magnetization free layer may have magnetization directions that are perpendicular to a surface of the tunnel barrier layer.

In the case where the magnetization directions of the magnetization free layer and the magnetization fixed layer are parallel to each other, the variable resistance pattern 149-1 may have a first resistance. By comparison, in the case where the magnetization directions of the magnetization free layer and the magnetization fixed layer are antiparallel to each other, the variable resistance pattern 149-1 may have a second resistance. Such a difference in resistance level of the variable resistance pattern 149-1 may be used to store data in the memory device 100. The magnetization direction of the magnetization free layer may be changed using a spin torque of electrons in a program current.

Each of the magnetization fixed layer and the magnetization free layer may include a magnetic material. Here, the magnetization fixed layer may further include an antiferromagnetic material, allowing a ferromagnetic material in the magnetization fixed layer to have a fixed magnetization direction. The tunnel barrier layer may be formed of or include at least one of oxide materials, each of which contains, for example, one of Mg, Ti, Al, MgZn, and MgB, but the inventive concept is not limited thereto. Examples of ferromagnetic material may include, but are not limited to: Fe, Ni, Co, and many of their alloys. Examples of antiferromagnetic may include, but are not limited to: MnO, FeO, CoO, NiO, Cr, Mn, $MnO_4$, MnS, $FeCl_3$, and $MnF_2$.

The selection device 143-1 (or SW of FIG. 1) may serve as a current adjustment layer controlling a flow of current passing therethrough. The selection device 143-1 may include a layer whose resistance can be changed by a voltage applied to both sides of the selection device 143-1. For example, the selection device 143-2 may include an ovonic threshold switching (OTS) material exhibiting an OTS property. With regard to the function of the selection device 143-1 including the OTS material, when a voltage lower than a threshold voltage $V_T$ is applied to the selection device 143-1, the selection device 143-1 may be in a high-resistance state preventing a current from flowing therethrough, and when a voltage higher than the threshold voltage $V_T$ is applied to the selection device 143-1, the selection device 143-1 may be in a low-resistance state, allowing a current to flow therethrough. Also, in the case where a current flowing through the selection device 143-1 is smaller than a holding current, the selection device 143-1 may be switched to the high-resistance state. The OTS property of the selection device 143-1 will be described in more detail with reference to FIG. 6.

The selection device 143-1 may include a chalcogenide material serving as the OTS material. The OTS materials and phase-change materials (PCM) may be in the same class, but the OTS materials are usually frozen in the amorphous phase. In an exemplary embodiment of the inventive concept, the chalcogenide material may include at least one of the elements in group VI of the periodic table (e.g., chalcogen elements) and optionally a chemical modifier containing at least one of the chemical elements in group III, IV or V. Sulfur (S), selenium (Se), and tellurium (Te) may be typical chalcogen elements, which may be included in the selection device 143-1. The presence of a divalent bond and lone pair electrons may be regarded as characteristic features of the chalcogen elements. In the chalcogenide materials, chalcogen elements may be bonded with each other through divalent bonding to form a chain structure and a cyclic structure, and the lone pair electrons may serve as an electron source for forming a conductive filament. For example, trivalent or tetravalent modifiers (e.g., aluminum (Al), gallium (Ga), indium (In), germanium (Ge), tin (Sn), silicon (Si), phosphorus (P), arsenic (As), and antimony (Sb)) may be contained in the chain and cyclic structures of the chalcogen elements to adjust structural rigidity of the chalcogenide material, and the chalcogenide material may be classified into a switching material and a phase-change material, based on its crystallization or another structural rearrangement ability.

In an exemplary embodiment of the inventive concept, the selection device 143-1 may contain silicon (Si), tellurium (Te), arsenic (As), germanium (Ge), indium (In), or any combination thereof. For example, compounds of the selection device 143-1 may contain about 14 at. % silicon (Si), about 39 at. % tellurium (Te), about 37 at. % arsenic (As), about 9 at. % germanium (Ge), and about 1 at. % indium (In). Here, the atomic percent "at. %" may be given by the percentage of one kind of atom relative to the total number of atoms, and this term will be used having the same meaning below.

In an exemplary embodiment of the inventive concept, the selection device 143-1 may include silicon (Si), tellurium (Te), arsenic (As), germanium (Ge), sulfur (S), selenium (Se), or combinations thereof. For example, the compounds of the selection device 143-1 may contain about 5 at. % silicon (Si), about 34 at. % tellurium (Te), about 28 at. % arsenic (As), about 11 at. % germanium (Ge), about 21 at. % sulfur (S), and about 1 at. % selenium (Se).

In an exemplary embodiment of the inventive concept, the selection device 143-1 may include tellurium (Te), arsenic (As), germanium (Ge), sulfur (S), selenium (Se), antimony (Sb), or combinations thereof. For example, the compositions for the selection device 143-1 may contain about 21 at. % tellurium (Te), about 10 at. % arsenic (As), about 15 at. % germanium (Ge), about 2 at. % sulfur (S), about 50 at. % selenium (Se), and about 2 at. % antimony (Sb).

In the memory device 100 according to an exemplary embodiment of the inventive concept, the selection device 143-1 is not limited to the OTS material. For example, the selection device 143-1 may include various materials capable of providing a switching function or a device selection function. As an example, the selection device 143-1 may include, for example, a diode, a tunnel junction, a PNP diode, a bipolar junction transistor (BJT), or a mixed ionic-electronic conduction (MIEC) device.

The heating electrode 147-1 may be arranged between the intermediate electrode 145-1 and the variable resistance pattern 149-1. The heating electrode 147-1 may be used to heat the variable resistance pattern 149-1 in the set or reset operation. The heating electrode 147-1 may be formed of or include a conductive material, which does not react with the variable resistance pattern 149-1 and generate a sufficient amount of heat to change a phase of the variable resistance pattern 149-1. In an exemplary embodiment of the inventive concept, the heating electrode 147-1 may be formed of or include, for example, TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, carbon (C), silicon carbide (SiC), silicon carbon nitride (SiCN), carbon nitride (CN), titanium carbon nitride (TiCN), tantalum carbon nitride (TaCN), high melting point metals containing combinations thereof, or nitrides thereof. However, the material for the heating electrode 147-1 is not limited thereto.

In an exemplary embodiment of the inventive concept, the heating electrode 147-1 may be formed of carbon-based materials which include, but are not limited to: amorphous carbon (C), graphene, graphite, carbon nanotube (CNT), amorphous diamond-like carbon (DLC), silicon carbide (SiC), boron carbide (BC), silicon carbon nitride (SiCN), carbon nitride (CN), titanium carbon nitride (TiCN), tantalum carbon nitride (TaCN), and other similar carbon-based materials.

The lower electrode 141-1 and the intermediate electrode 145-1 may be in contact with the selection device 143-1, and may serve as a current path and may be formed of a conductive material. For example, each of the lower electrode 141-1 and the intermediate electrode 145-1 may be formed of or include, for example, a metal, a conductive metal nitride, a conductive metal oxide, or combinations thereof. As an example, the lower electrode 141-1 and the intermediate electrode 145-1 may include a TiN layer, but the inventive concept is not limited thereto. In an exemplary embodiment of the inventive concept, each of the lower electrode 141-1 and the intermediate electrode 145-1 may include a conductive layer, which is formed of metals or conductive metal nitrides, and at least one conductive barrier layer, which is formed to cover at least a portion of the conductive layer. The conductive barrier layer may be formed of or include, for example, a metal oxide, a metal nitride, or combinations thereof, but the inventive concept is not limited thereto.

In general, when the selection device 143-1 is based on the OTS property, the selection device 143-1 may include a chalcogenide material that is in an amorphous state. However, the down-scaling of the memory device 100 may lead to a reduction in thickness, width, and distance of the variable resistance pattern 149-1, the selection device 143-1, the heating electrode 147-1, the lower electrode 141-1 and/or the intermediate electrode 145-1. Accordingly, when a phase of the variable resistance pattern 149-1 is changed by heat generated in the heating electrode 147-1 during operations of the memory device 100, the selection device 143-1 adjacent to the heating electrode 147-1 may be affected by the heating process. For example, the selection device 143-1 may be partially crystallized by heat generated in the heating electrode 147-1 adjacent thereto. That is, there may be deterioration or damage of the selection device 143-1.

By comparison, in the memory device 100 according to the present embodiment, the intermediate electrode 145-1 may be thickly formed to prevent heat generated in the heating electrode 147-1 from being transferred to the selection device 143-1. For such thermal insulation, the intermediate electrode 145-1 may be formed to be thicker than the lower electrode 141-1, as shown in FIGS. 2 and 3. For example, the intermediate electrode 145-1 may have a thickness in a range of about 10 nm to about 100 nm. However, the thickness of the intermediate electrode 145-1 is not limited to this range. Also, for the thermal insulation, the intermediate electrode 145-1 may include at least one thermal barrier layer. The thickness of the barrier layer may be in a range of about 1 nm to about 50 nm. In the case where the intermediate electrode 145-1 includes two or more thermal barrier layers, the intermediate electrode 145-1 may have a structure, in which the thermal barrier layers and electrode layers are alternatingly stacked.

The first spacers 150-1 may be provided to enclose side surfaces of the first memory cells 140-1. The second spacers 150-2 may be provided to enclose side surfaces of the second memory cells 140-2. Since the first and second spacers 150-1 and 150-2 are provided to enclose the side surfaces of the first and second memory cells 140-1 and 140-2, the first and second spacers 150-1 and 150-2 may be used to protect the first and second memory cells 140-1 and 140-2 (in particular, the variable resistance patterns 149-1 and 149-2 and/or the selection devices 143-1 and 143-2). For example, the first and second spacers 150-1 and 150-2 may prevent the first and second memory cells 140-1 and 140-2 from being unnecessarily contaminated or etched in a subsequent process (e.g., in a cleaning process or a metal patterning process). For example, the first and second spacers 150-1 and 150-2 may have etch resistance toward the etchant used in the subsequent process.

The first and second spacers 150-1 and 150-2 may exert a tensile or compressive stress on the first and second memory cells 140-1 and 140-2, thereby enhancing the current characteristics of the first and second memory cells 140-1 and 140-2. The tensile or compressive stress exerted on the first and second memory cells 140-1 and 140-2 from the first and second spacers 150-1 and 150-2 will be described in more detail with reference to FIGS. 18 to 21.

The first and second spacers 150-1 and 150-2 may be formed of or include, for example, at least one material of, oxides (e.g., silicon oxide ($SiO_2$) or aluminum oxide ($Al_2O_3$)), nitrides (e.g., silicon nitride ($Si_3N_4$)), and oxynitride (e.g., silicon oxynitride), which are capable of protecting the first and second memory cells 140-1 and 140-2. The first and second spacers 150-1 and 150-2 may be formed using at least one conformal deposition method (e.g., thermal and plasma chemical vapor deposition (CVD) or atomic layer deposition (ALD) techniques).

In the memory device 100 according to the present embodiment, the first spacer 150-1 may have a first thickness T1, and the second spacer 150-2 may have a second thickness T2. As shown in FIGS. 2 and 3, the first thickness T1 of the first spacer 150-1 may be greater than the second thickness T2 of the second spacer 150-2. Here, the thickness of each of the first and second spacers 150-1 and 150-2 may be defined as a thickness measured in a direction normal to the side surface of each of the first and second memory cells 140-1 and 140-2. For example, the thickness of each of the first and second spacers 150-1 and 150-2 may be defined as a thickness of a portion that is substantially parallel to the side surfaces of the first and second memory cells 140-1 and 140-2. In addition, the first thickness T1 of the first spacer 150-1 may be a thickness measured in a direction normal to a side surface of the variable resistance pattern 149-1 of the first memory cell 140-1, and the second thickness T2 of the second spacer 150-2 may be a thickness measured in a direction normal to a side surface of the variable resistance pattern 149-2 of the second memory cell 140-2. That is, the thicknesses are measure at the locations that the spacers are covering the variable resistance patterns.

In the memory device 100 according to the present embodiment, by thickly forming the first spacers 150-1 of the first memory cells 140-1 and thinly forming the second spacers 150-2 of the second memory cells 140-2, resistance characteristics of the first and second memory cells 140-1 and 140-2 may be enhanced. This may reduce the variation in electrical characteristics between the first and second memory cells 140-1 and 140-2, which are provided at different levels or layers in the memory device 100 according to the present embodiment.

In the case where the memory device has a three-dimensional (3D) cross-point stack structure, memory cells in the memory device may suffer from an increase in variation in electrical characteristics and a reduction in sensing margin (S/M). In detail, when compared with the conventional single-layer structure, the 3D stack structure may have an increased memory cell density and an increased vertical variation in characteristics of memory cells, which are responsible for the increased variation in electrical characteristics of the memory cells found in the 3D stack structure. The vertical variation in memory cell characteristics will be described in more detail with reference to FIG. 5.

The reduction of the S/M may result from the down-scaling of the memory device. That is, the down-scaling of the memory device may lead to an increase in the set resistance, without any substantial change in the reset resistance, and consequently a reduction in ratio between the set and reset resistances (i.e., in the sensing margin). In general, the set resistance of the memory device may be low (e.g., of order kΩ), and the reset resistance may be very high (e.g., of order MΩ). Given that decreasing of an area causes an increase in electric resistance, the down-scaling of the memory device (i.e. decreasing an area in the memory device) may lead to an increase in the set resistance, but there may be substantially no change in the reset resistance. Simply, in the case where a current path is formed of a conductor, an amount of a current may vary depending on a sectional area of the current path, whereas, in the case where the current path is formed of an insulator, there may be no current flowing through the current path, regardless of its sectional area.

For the 3D cross-point stack structure of the memory device, it may need to control a variation in electrical characteristics of memory cells and it may also need to increase or maximize the S/M of the memory device. In the memory device 100 according to the present embodiment, since spacers covering memory cells at different levels are formed to have different thicknesses, they may increase or maximize an S/M of a memory device and may reduce a variation in electrical characteristics of the memory cells. For example, in the case where the first and second spacers 150-1 and 150-2 are formed to have substantially the same thickness, a set resistance of the first memory cells 140-1 of the first memory cell layer MCL1 may be higher than that of the second memory cells 140-2 of the second memory cell layer MCL2. In this case, if the first spacers 150-1 of the first memory cells 140-1 are thickly formed and the second spacers 150-2 of the second memory cells 140-2 are thinly formed, a difference in set resistance between the first and second memory cells 140-1 and 140-2 may be reduced or removed. In the opposite case, a difference in set resistance between the first and second memory cells 140-1 and 140-2 may be reduced or removed by thinly forming the first spacers 150-1 of the first memory cells 140-1 and by thickly forming the second spacers 150-2 of the second memory cells 140-2.

Based on the reason described above, the adjustment of the spacer thickness may be used to control the set resistance of the memory cells. However, for the same reason as described with reference to the down-scaling, the adjustment of the spacer thickness may result in a minute change in reset resistance of the memory cells. Accordingly, the adjustment of the spacer thickness may affect a variation in electrical characteristics of memory cells or an S/M property through a change in set resistance of memory cells. Changes in set and reset resistances caused by a change of a spacer thickness will be described in more detail with reference to FIG. 4.

The memory device 100 according to an exemplary embodiment of the inventive concept may further include a first inner spacer 152-1 and a second inner spacer 152-2. The first inner spacer 152-1 may be provided to cover the lower electrode 141-1 and the selection device 143-1 of the first memory cell 140-1, and the second inner spacer 152-2 may be provided to cover the lower electrode 141-2 and the selection device 143-2 of the second memory cell 140-2. The first and second inner spacers 152-1 and 152-2 may be formed, using a process separated from that for the first and second spacers 150-1 and 150-2, for more effective protection of the selection devices 143-1 and 143-2. However, in an exemplary embodiment of the inventive concept, the first and second inner spacers 152-1 and 152-2 may be omitted.

As shown in FIGS. 2 and 3, the first inner spacer 152-1 may be covered with the first spacer 150-1, whereas the second inner spacer 152-2 may not be covered with the second spacer 150-2. However, in an exemplary embodiment of the inventive concept, the second inner spacer 152-2 may also be covered with the second spacer 150-2. Furthermore, although the first and second inner spacers 152-1 and 152-2 are illustrated to have substantially the same structure and substantially the same thickness, they may be formed to have different structures and/or different thicknesses.

As described above, thicknesses of the first and second spacers 150-1 and 150-2 may be adjusted to control a variation in electrical characteristics (e.g., set resistance) of memory cells, but this adjustment or control may be mainly related to resistance characteristics of the variable resistance patterns 149-1 and 149-2. In other words, this means that the controlling of the thicknesses of the first and second spacers 150-1 and 150-2 may be used to change a crystalline state of each of the variable resistance patterns 149-1 and 149-2 or to control a resistance corresponding to such a crystalline state (i.e., set and reset resistances corresponding to the crystalline and amorphous states, respectively).

In the memory device 100 according to the present embodiment, the control of variation in electrical characteristics through the adjustment of the spacer thickness is not limited to the control of the resistance of the variable resistance patterns 149-1 and 149-2. For example, the adjustment of the spacer thickness may be used to control current characteristics of the selection devices 143-1 and 143-2. Meanwhile, since, unlike the variable resistance patterns 149-1 and 149-2, the selection devices 143-1 and 143-2 do not have the phase changeable material, the control of the current characteristics of the selection devices 143-1 and 143-2 may mean the control of threshold voltages of the selection devices 143-1 and 143-2.

The current characteristics of the selection devices 143-1 and 143-2 may be controlled by adjusting the thicknesses of the first spacer 150-1 and the second spacer 150-2. However, the current characteristics of the selection devices 143-1 and 143-2 may be controlled by adjusting thicknesses of the first and second spacers 150-1 and 150-2 and/or the first and second inner spacers 152-1 and 152-2.

As shown in FIG. 2, a first insulating layer 160a may be arranged between the first electrode lines 110, and a second insulating layer 160b may be arranged between the first memory cells 140-1 of the first memory cell layer MCL1. Also, a third insulating layer 160c may be arranged between the second electrode lines 120, a fourth insulating layer 160d may be arranged between the second memory cells 140-2 of the second memory cell layer MCL2, and a fifth insulating layer 160e may be arranged between the third electrode lines 130. The first to fifth insulating layers 160a-160e may be formed of the same insulating material, but in an exemplary embodiment of the inventive concept, at least one of the first to fifth insulating layers 160a-160e may be formed of an insulating material different from those of the others. The first to fifth insulating layers 160a-160e may be formed of a dielectric material (e.g., oxide or nitride) and may separate devices in each layer electrically from each other. Meanwhile, air gaps may be formed instead of at least one of the second and fourth insulating layers 160b and 160d. In the case where the air gaps are formed, an insulating liner having a specific thickness may be formed between the air gaps and the first memory cells 140-1 and/or between the air gaps and the second memory cells 140-2.

In the memory device 100 according to the present embodiment, since the spacers 150-1 and 150-2 of the first and second memory cells 140-1 and 140-2 at different levels or layers are formed to have different thicknesses, resistance (e.g., set resistance) of the first and second memory cells 140-1 and 140-2 may be controlled. Accordingly, by adjusting the thicknesses of the spacers 150-1 and 150-2 of the first and second memory cells 140-1 and 140-2, a vertical variation in resistance characteristics of the first and second memory cells 140-1 and 140-2 of the memory device 100 according to the present embodiment may be reduced. In addition, by adjusting the thicknesses of the spacers 150-1 and 150-2 of the first and second memory cells 140-1 and 140-2, an S/M of the first and second memory cells 140-1 and 140-2 of the memory device 100 according to the present embodiment may increase. Accordingly, by adjusting the thicknesses of the spacers 150-1 and 150-2, a memory device having a 3D cross-point stack structure (e.g., a high integration density) and enhanced reliability may be realized.

Figure 4:
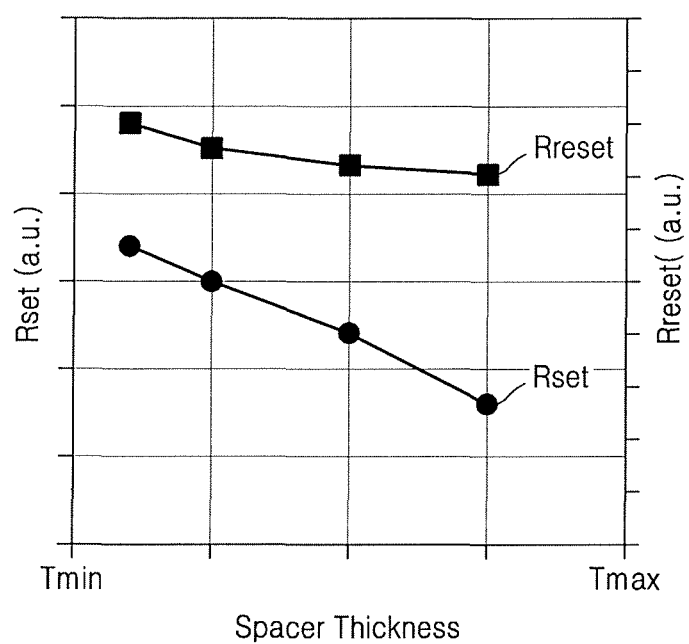
FIG. 4 is a graph showing variations in set and reset resistances (Rset and Rreset) of a memory cell, caused by a variation in thickness of a spacer according to an exemplary embodiment of the inventive concept.

FIG. 4 is a graph showing variations in set and reset resistances (Rset and Rreset) of a memory cell, caused by a variation in thickness of a spacer (or a spacer thickness). In FIG. 4, the x-axis represents the spacer thickness, and the left- and right-hand y-axes represent the set resistance (●) and the reset resistance (■). The spacer thickness and the set and reset resistances are relative values, which are given in arbitrary units (a.u.) to allow for a relative comparison therebetween.

Referring to FIG. 4, as the spacer thickness increased, both the set and reset resistances decreased. Here, as described above, the spacer thickness is defined as a thickness measured in a direction normal to the side surface of each of the first and second memory cells 140-1 and 140-2. As shown, the increase in the spacer thickness led to a difference in reduction rate between the set and reset resistances. For example, the increase in the spacer thickness led to a large reduction of the set resistance but a small reduction of the reset resistance. This result may be obtained for the same reason as that for the change of the resistance associated with a down-scaling of a memory device. In other words, when the memory cell has the set resistance (i.e., a relatively low resistance), the resistance of the memory cell may be easily changed by a change in area, structure, or any external environment. By comparison, when the memory cell has the reset resistance (i.e., a very high resistance), the resistance of the memory cell may be scarcely affected by a change in area, structure, or any external environment.

As described above, the S/M is defined as a ratio between the set resistance and the reset resistance, it is obvious that, if the reset resistance does not change and the set resistance increases, the S/M will decrease. For example, in the graph of FIG. 4, the S/M decreases in a left direction (i.e., toward Tmin) and increases in a right direction (i.e., toward Tmax). Accordingly, in the present embodiment, by controlling the spacer thickness of the memory device 100 and the ratio between the set and reset resistances, the S/M may be increased or maximized. Furthermore, such an increase of the S/M may greatly enhance the reliability of the memory device 100.

In the memory device 100 according to the present embodiment, the spacers 150-1 and 150-2 having different thicknesses may be formed to cover the first and second memory cells 140-1 and 140-2 provided at different levels or layers, and such a difference in thickness between the spacers 150-1 and 150-2 may be used to control the resistance (in particular, the set resistance) of the first and second memory cells 140-1 and 140-2 at different levels or layers. Accordingly, in the memory device 100 according to the present embodiment, by controlling the thicknesses of the spacers 150-1 and 150-2, the S/M of the first and second memory cells 140-1 and 140-2 may increase, and consequently, a memory device with enhanced reliability may be realized.

Figure 5:
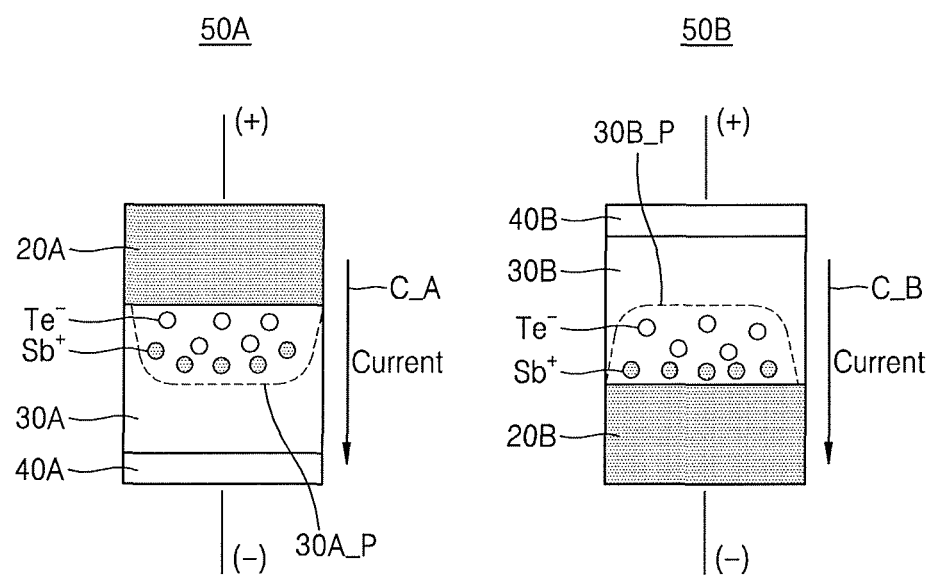
FIG. 5 is a diagram schematically illustrating ion diffusion paths, which are formed in a variable resistance pattern by a voltage applied to a memory cell according to an exemplary embodiment of the inventive concept.

FIG. 5 is a diagram schematically illustrating ion diffusion paths, which are formed in a variable resistance pattern by a voltage applied to a memory cell.

Referring to FIG. 5, a first memory cell 50A may include a first electrode 20A, a variable resistance pattern 30A, and a second electrode 40A, which are sequentially stacked. The first electrode 20A may include a conductive material capable of generating a sufficient amount of heat, which is required to change a phase of the variable resistance pattern 30A, and may serve as the heating electrodes 147-1 and 147-2 of FIGS. 2 and 3. In the case where a positive voltage is applied to the first electrode 20A and a negative voltage is applied to the second electrode 40A, an electric current flowing from the first electrode 20A to the second electrode 40A through the variable resistance pattern 30A may be produced in the memory cell 50A, as depicted by an arrow C_A.

In the case where a current flows through the first electrode 20A, heat may be generated in the first electrode 20A, and thus, a change in phase of the variable resistance pattern 30A may start to occur at a portion 30A_P, which is adjacent to an interface between the first electrode 20A and the variable resistance pattern 30A. For example, in a "reset" operation, the portion 30A_P of the variable resistance pattern 30A may be changed from a crystalline state (i.e., the low-resistance state) to an amorphous state (i.e., the high-resistance state), and thus, there may be a difference in diffusion speed between cations and anions in the portion 30A_P, when a voltage is applied thereto. In more detail, cations (e.g., antimony ions ($Sb^+$)) in the portion 30A_P of the variable resistance pattern 30A may have a diffusion speed higher than that of anions (e.g., tellurium ions ($Te^-$)). This may lead to an increase in an amount of antimony ions ($Sb^+$) diffusing toward the second electrode 40A, to which the negative voltage is applied. For example, a diffusion speed of antimony ions (Sb+) in a direction toward the second electrode 40A may be higher than that of tellurium ions ($Te^-$) in a direction toward the first electrode 20A.

By comparison, a second memory cell 50B may include a first electrode 20B, a variable resistance pattern 30B, and a second electrode 40B, and negative and positive voltages are respectively applied to the first and second electrodes 20B and 40B to generate a current flowing from the second electrode 40B to the first electrode 20B through the variable resistance pattern 30B, as depicted by an arrow C_B.

In the case where a current flows through the first electrode 20B, heat may be generated in the first electrode 20B, and thus, a change in phase of the variable resistance pattern 30B may start to occur at a portion 30B_P, which is adjacent to an interface between the first electrode 20B and the variable resistance pattern 30B. Here, in the portion 30B_P of the variable resistance pattern 30B, a diffusion speed of antimony ions ($Sb^+$) may be faster than that of tellurium ions (Te⁻), and thus, there may be an increase in an amount of antimony ions (Sb⁺) diffusing toward the first electrode 20B, to which a negative voltage is applied.

In the case of the second memory cell 50B, antimony ions (Sb⁺) may have an increased concentration near an interface between the first electrode 20B and the variable resistance pattern 30B. For example, there may be a local variation in concentration of the variable resistance pattern 30B. By comparison, in the case of the first memory cell 50A, tellurium ions (Te⁻) may have an increased concentration near an interface between the first electrode 20A and the variable resistance pattern 30A. For example, there may be a local variation in concentration of the variable resistance pattern 30A.

An ion or vacancy distribution in the variable resistance patterns 30A and 30B may vary, depending on a magnitude of a voltage to be applied to the variable resistance patterns 30A and 30B, a direction of a current flowing through the variable resistance patterns 30A and 30B, and geometry of the variable resistance patterns 30A and 30B and the first electrodes 20A and 20B. That is, a concentration of ions or vacancies may be locally changed in the variable resistance patterns 30A and 30B, and thus, even when the variable resistance patterns 30A and 30B are applied with substantially the same voltage, there may be a variation in resistance of the variable resistance patterns 30A and 30B and the memory cells 50A and 50B may exhibit different operational characteristics (e.g., different resistance characteristics).

Although the ion diffusion paths for antimony ions (Sb⁺) and tellurium ions (Te⁻) have been briefly described with reference to FIG. 5, the inventive concept is not limited thereto. In particular, similar to the variable resistance patterns 149-1 of the first memory cells 140-1 described with reference to FIGS. 2 and 3, the variable resistance patterns 30A and 30B may be doped, for example, with at least one of tellurium (Te), selenium (Se), germanium (Ge), antimony (Sb), bismuth (Bi), lead (Pb), tin (Sn), indium (In), silver (Ag), arsenic (As), sulfur (S), phosphorus (P), and mixtures thereof, and may be doped with impurities such as, for example, nitrogen (N), oxygen (O), silicon (Si), carbon (C), boron (B), dysprosium (Dy), or combinations thereof. Accordingly, ion diffusion in the variable resistance patterns 30A and 30B may vary depending on a kind and composition of a material contained in the variable resistance patterns 30A and 30B and a kind and concentration of impurities, and thus, a variation in operational characteristics of the memory cells 50A and 50B may increase.

Referring back to FIGS. 2 and 3, a plurality of the first memory cells 140-1 and a plurality of the second memory cells 140-2 may be vertically spaced apart from each other with respect to the second electrode lines 120. In the case where a positive reset voltage Vreset is applied to the second electrode lines 120 and a ground voltage is applied to the first and third electrode lines 110 and 130, substantially the same voltage (i.e., the reset voltage Vreset) may be applied to the first memory cells 140-1 and the second memory cell 140-2. However, the first memory cells 140-1 and the second memory cells 140-2 may be provided below and on the second electrode lines 120, and thus, as described above, a portion of the variable resistance pattern 149-1, which is positioned adjacent to an interface between the variable resistance patterns 149-1 and the heating electrodes 147-1 of the first memory cells 140-1, may differ from a portion of the variable resistance pattern 149-2, which is positioned adjacent to an interface between the variable resistance patterns 149-2 and the heating electrodes 147-2 of the second memory cells 140-2, in terms of ion distribution or concentration distribution. Accordingly, the first and second memory cells 140-1 and 140-2 may have different operational characteristics (e.g., different resistance characteristics) from each other.

In the memory device 100 according to the present embodiment, since the spacers 150-1 and 150-2 are formed on the side surfaces of the first and second memory cells 140-1 and 140-2, they may prevent the variable resistance patterns 149-1 and 149-2 and/or the selection devices 143-1 and 143-2 from deteriorating or being contaminated or damaged. Furthermore, since the spacers 150-1 and 150-2 covering the first and second memory cells 140-1 and 140-2 at different levels or layers are formed to have different thicknesses, a vertical variation in resistance or current characteristics of the first and second memory cells 140-1 and 140-2 at the different levels or layers may be reduced or minimized.

Since the memory device 100 according to the present embodiment includes the selection devices 143-1 and 143-2 including the OTS material, a process for forming a transistor or a diode may be omitted. For example, in the case where a diode is provided, it is necessary to perform a high temperature thermal treatment process for activating impurities contained in the diode, but the high temperature thermal treatment process may lead to damage or contamination of the variable resistance patterns 149-1 and 149-2 containing the phase-change material. By comparison, in the case of the memory device 100 according to the present embodiment, it is unnecessary to perform complex processes for forming a transistor or a diode, and thus, it may prevent the variable resistance patterns 149-1 and 149-2 from being damaged or contaminated by the complex processes. Accordingly, the use of the memory device 100 according to the present embodiment may realize a highly-reliable semiconductor device.

In the case where a transistor or a diode is provided as a selection device, it is necessary to provide the transistor or the diode in a substrate, and this may lead to a difficulty in realizing a stack-type memory device including a plurality of vertically-stacked layers. In particular, since there is a risk that the variable resistance patterns 149-1 and 149-2 may be damaged or contaminated by the high temperature thermal treatment for activating the diode, it may be very difficult to realize a cross-point stack structure, in which the diodes are provided on the variable resistance patterns 149-1 and 149-2. However, in the case where the selection devices 143-1 and 143-2 with the OTS property are used instead of the diodes, the memory device 100 according to the present embodiment can be realized in the form of a 3D cross-point stack structure including a plurality of vertically-stacked layers. Accordingly, the memory device 100 can have a greatly increased integration density.

Figure 6:
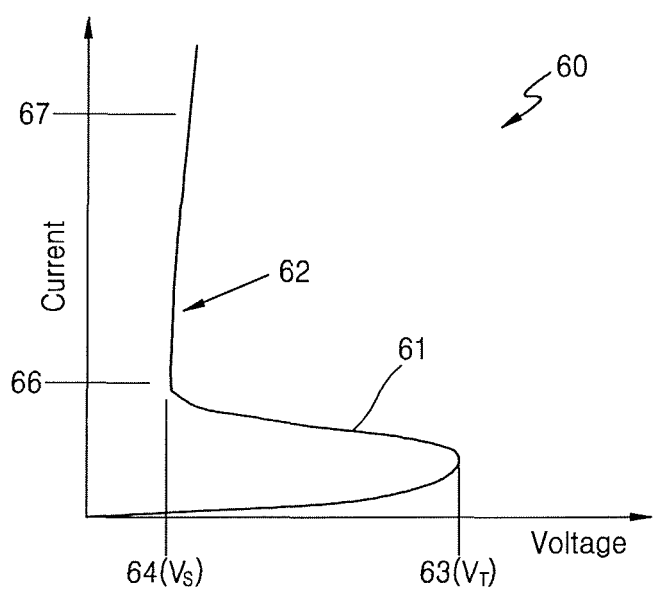
FIG. 6 is a graph schematically showing a voltage-current curve of a selection device exhibiting an ovonic threshold switching (OTS) property.

FIG. 6 is a graph schematically showing a voltage-current behavior of a selection device exhibiting an OTS property.

Referring to FIG. 6, a first curve 61 shows a voltage-current behavior of a selection device, when there is substantially no current passing through the selection device. Here, the selection device may serve as a switching device having a threshold voltage $V_T$ (or a first voltage level 63). The current flowing through the selection device may be substantially negligible, while a voltage applied to the selection device gradually increases from a state of zero voltage and zero current to the threshold voltage $V_T$ (i.e., the first voltage level 63). However, if the applied voltage exceeds the threshold voltage $V_T$, the current passing through the selection device may abruptly increase, and the applied voltage may drop to a saturation voltage $V_S$ (or a second voltage level 64).

A second curve 62 shows a voltage-current behavior of the selection device, when there is a current passing through the selection device. If the current passing through the selection device exceeds a first current level 66, the voltage applied to the selection device may increase up to a level that is slightly higher than the second voltage level 64. For example, even if the current passing through the selection device increases from the first current level 66 to a considerably higher level (e.g., a second current level 67), the voltage applied to the selection device may slightly increase from the second voltage level 64. That is, once the current starts to flow through the selection device, the voltage applied to the selection device may be maintained around the saturation voltage $V_S$ (i.e., the second voltage level 64). If the current is reduced to a holding current level (i.e., the first current level 66) or lower, the selection device may be switched again to a resistive state, and thus, the current may be effectively blocked until the voltage is increased to the threshold voltage $V_T$.

FIGS. 7 to 14, 15A, and 15B are sectional views of memory devices according to an exemplary embodiment of the inventive concept and corresponding to the sectional view of FIG. 3. In the description that follows, descriptions of features identical to those of FIGS. 2 to 3 will be kept to a minimum or omitted in order to avoid redundancy.

Figure 7:
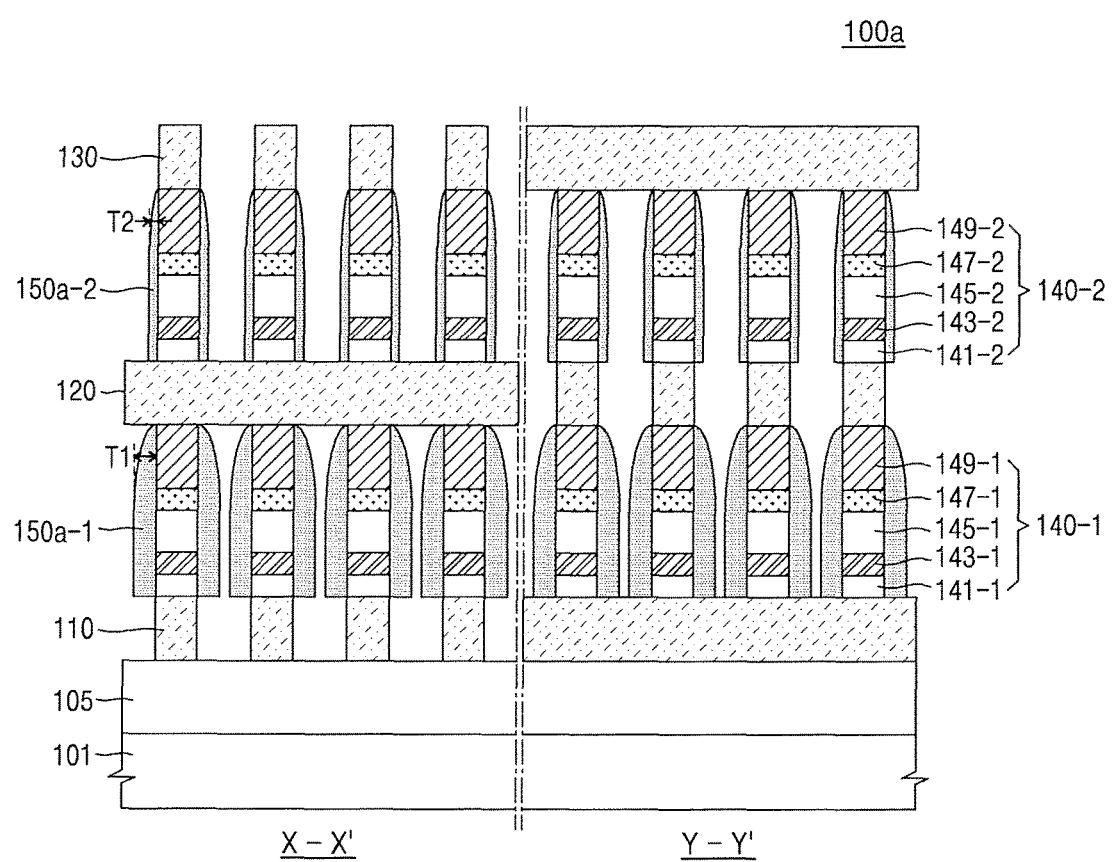
FIGS. 7 to 14, 15A, and 15B are sectional views of memory devices according to an exemplary embodiment of the inventive concept and corresponding to the sectional view of FIG. 3.

Referring to FIG. 7, a memory device 100*a* according to an exemplary embodiment of the inventive concept may be different from the memory device 100 of FIG. 3, in that the inner spacer is not provided. For example, in the memory device 100 of FIG. 3, the first inner spacer 152-1 may be provided to enclose the lower electrode 141-1 and the selection device 143-1 of the first memory cells 140-1, and the second inner spacer 152-2 may be provided to enclose the lower electrode 141-2 and the selection device 143-2 of the second memory cells 140-2.

By comparison, the first and second inner spacers may not be provided in the memory device 100*a* according to the present embodiment. Accordingly, the lower electrode 141-1 and the selection device 143-1 of the first memory cell 140-1, along with the intermediate electrode 145-1, the heating electrode 147-1, and the variable resistance pattern 149-1, may be enclosed by a first spacer 150*a*-1, and the lower electrode 141-2 and the selection device 143-2 of the second memory cell 140-2, along with the intermediate electrode 145-2, the heating electrode 147-2, and the variable resistance pattern 149-2, may be enclosed by a second spacer 150*a*-2.

In the memory device 100*a* according to the present embodiment, the first spacer 150*a*-1 may be thickly formed, and the second spacer 150*a*-2 may be thinly formed. Accordingly, a reduction in resistance of the first memory cells 140-1 may be larger than that of the second memory cells 140-2. In other words, in the case where the spacer is not formed or is formed to have the same thickness, the resistance of the first memory cells 140-1 may be higher than that of the second memory cells 140-2. In such a case, like the memory device 100*a* according to the present embodiment, by thickly forming the spacer 150*a*-1 of the first memory cells 140-1 and thinly forming the spacers 150*a*-2 of the second memory cells 140-2, a difference in resistance between the first and second memory cells 140-1 and 140-2 may be reduced, and consequently the vertical variation in resistance characteristics of the first and second memory cells 140-1 and 140-2 at different levels or layers may be reduced. In the opposite case, the first spacer 150*a*-1 may be thinly formed, and the second spacer 150*a*-2 may be thickly formed. Thus, the thickness of the first spacer 150*a*-1 or the second spacer 150*a*-2 may be adjusted so that the first and second memory cells 140-1 and 140-2 may have substantially the same resistance. By controlling the thicknesses of the spacers 150*a*-1 and 150*a*-2, the S/M of the first and second memory cells 140-1 and 140-2 may increase and consequently, a memory device with enhanced reliability may be realized. Alternatively, or in addition, at least one of the first spacer 150*a*-1 and the second spacer 150*a*-2 may independently comprise one of a material exerting a compressive stress and a material exerting a tensile stress on the corresponding variable resistance pattern 149-1 and 149-2, and the compressive or tensile stress property of the first spacer 150*a*-1 or the second spacer 150*a*-2 may be adjusted so that the first and second memory cells 140-1 and 140-2 may have substantially the same resistance. Accordingly, the memory device 100*a* may have enhanced reliability. The effect of tensile or compressive stress exerted on the memory cell to reduce or increase resistance will be described in more detail with reference to FIGS. 18 to 21.

In the memory device 100*a* according to the present embodiment, the first and second inner spacers may not be provided, and thus, when there is a need to control current characteristics (e.g., threshold voltage) of the selection devices 143-1 and 143-2, a method of adjusting thicknesses of the first and second spacers 150*a*-1 and 150*a*-2 may be used to enhance the current characteristics of the selection devices 143-1 and 143-2.

Figure 8:
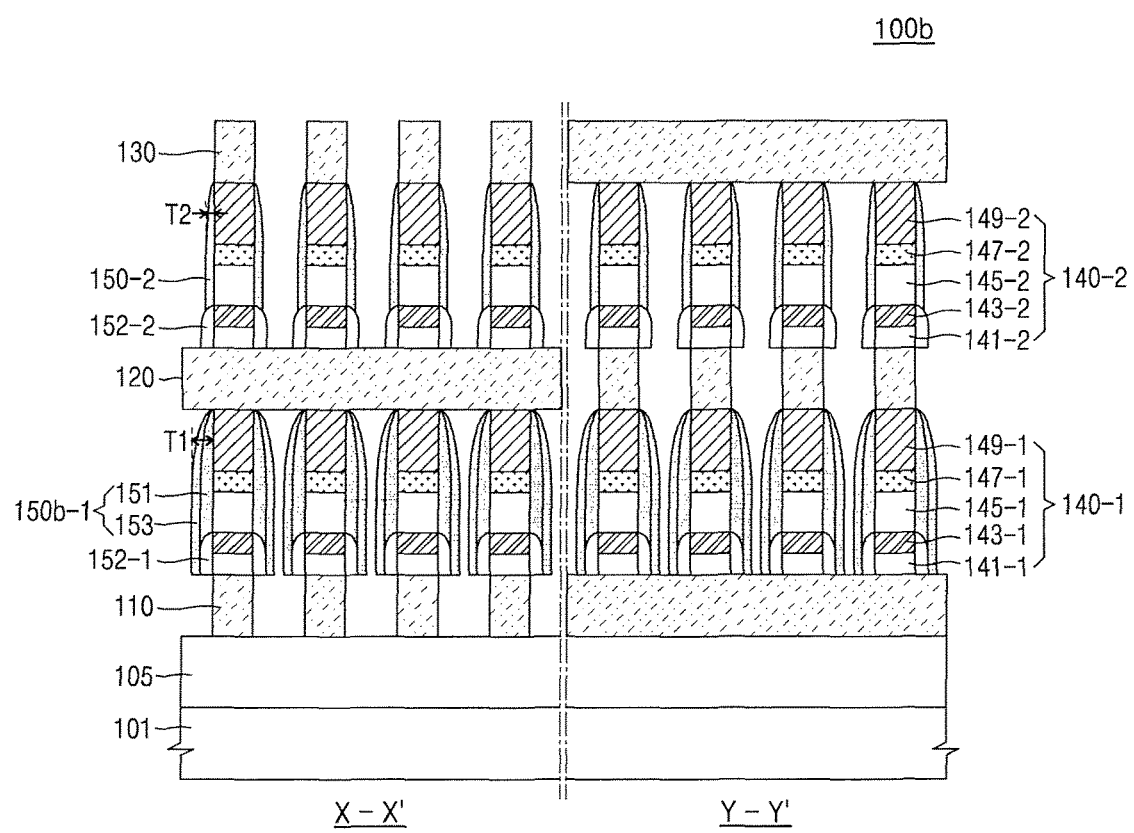

Referring to FIG. 8, a memory device 100*b* according to an exemplary embodiment of the inventive concept may be different from the memory device 100 of FIG. 3, in that a first spacer 150*b*-1 is formed to have a multi-layered structure. For example, in the case of the memory device 100 of FIG. 3, the first spacer 150-1 may be formed of a single layer. By comparison, in the memory device 100*b* according to the present embodiment, the first spacer 150*b*-1 may have a double-layer structure including an inner layer 151 and an outer layer 153. Since the first spacer 150*b*-1 has the multi-layered structure, electric characteristics of the first memory cells 140-1 (in particular, of the variable resistance pattern 149-1 and/or the selection device 143-1) may be more precisely controlled. In other words, by variously changing a material property of each of the layers constituting the first spacer 150*b*-1, resistance characteristics of the first memory cells 140-1 may be variously controlled. For example, even when the first spacers 150*b*-1 are formed to have the same thickness, the resistance characteristics of the first memory cells 140-1 may be changed, depending on whether the inner layer 151 is formed of a tensile stress material or a compressive stress material.

In the memory device 100*b* according to an exemplary embodiment of the inventive concept, the first spacer 150*b*-1 may have a multi-layered structure including three or more layers. Furthermore, the second spacer 150-2 may also have a multi-layered structure including two or more layers. However, like the memory device 100 of FIG. 3, the first spacer 150*b*-1 may be formed to be thicker than the second spacer 150-2. To reduce the vertical variation in resistance characteristics of the first and second memory cells 140-1 and 140-2, it may require to properly select a tensile stress material or a compressive stress material for the inner layer 151, and to adjust the thickness of the first spacer 150*b*-1 or the second spacer 150-2, so that the first and second memory cells 140-1 and 140-2 may have substantially the same resistance. Accordingly, the memory device 100*b* may have enhanced reliability. In the case where the first and second spacers 150b-1 and 150-2 are formed to have the multi-layered structure, a conformal deposition technique (e.g., ALD) may be used to form the first and second spacers 150b-1 and 150-2.

Figure 9:
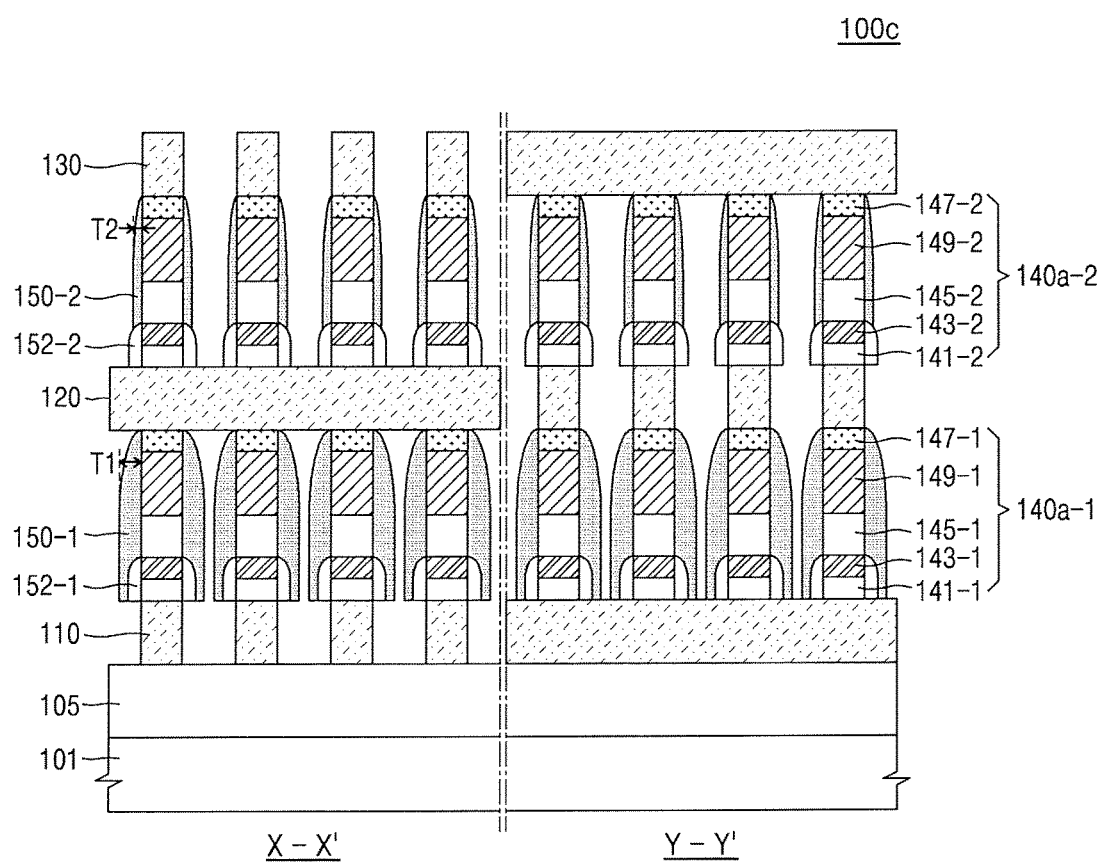

Referring to FIG. 9, a memory device 100c according to an exemplary embodiment of the inventive concept may be different from the memory device 100 of FIG. 3 in terms of positions of the heating electrodes 147-1 and 147-2 of the first and second memory cells 140a-1 and 140a-2. For example, in the memory device 100 of FIG. 3, the heating electrodes 147-1 and 147-2 may be arranged between the intermediate electrodes 145-1 and 145-2 and the variable resistance patterns 149-1 and 149-2. By comparison, in the memory device 100c according to the present embodiment, the heating electrode 147-1 of the first memory cell 140a-1 may be arranged between the variable resistance pattern 149-1 and the second electrode line 120, and the heating electrode 147-2 of the second memory cell 140a-2 may be arranged between the variable resistance pattern 149-2 and the third electrode line 130.

Since, as described above, the heating electrodes 147-1 and 147-2 may be used to heat the variable resistance patterns 149-1 and 149-2, the heating electrodes 147-1 and 147-2 may be provided at positions, allowing them to be in contact with the variable resistance patterns 149-1 and 149-2, respectively. Accordingly, the heating electrodes 147-1 and 147-2 may be provided on or under the variable resistance patterns 149-1 and 149-2, respectively. Meanwhile, the heating electrodes 147-1 and 147-2 may be provided on the variable resistance patterns 149-1 and 149-2, respectively, and this may suppress or prevent heat of the heating electrodes 147-1 and 147-2 from being transferred to the selection devices 143-1 and 143-2. Also, in the case where the heating electrodes 147-1 and 147-2 are provided on the variable resistance patterns 149-1 and 149-2, they may prevent the variable resistance patterns 149-1 and 149-2 from being contaminated or etched when a patterning process is performed to form the third electrode lines 130. Similar to the memory device 100 of FIG. 3, in the memory device 100c, the thickness of the first spacer 150-1 or the second spacer 150-2 may be adjusted so that the first and second memory cells 140a-1 and 140a-2 may have substantially the same resistance. Alternatively, or in addition, at least one of the first spacer 150-1 and the second spacer 150-2 may independently comprise one of a material exerting a compressive stress and a material exerting a tensile stress on the corresponding variable resistance pattern 149-1 and 149-2, and the compressive or tensile stress property of the first spacer 150-1 or the second spacer 150-2 may be adjusted so that the first and second memory cells 140a-1 and 140a-2 may have substantially the same resistance. Accordingly, the memory device 100c may have enhanced reliability.

Figure 10:
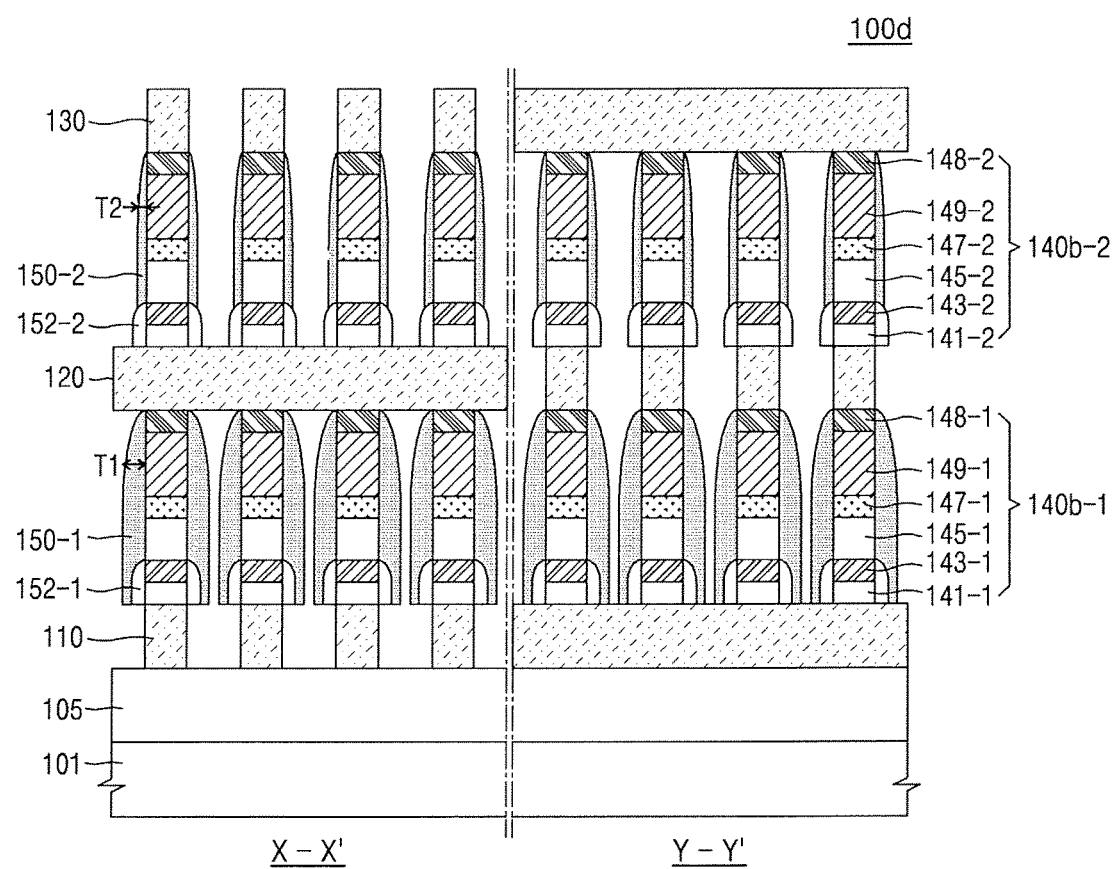

Referring to FIG. 10, a memory device 100d according to an exemplary embodiment of the inventive concept may be different from the memory device 100 of FIG. 3, in that the upper electrodes 148-1 and 148-2 are additionally formed. For example, in the memory device 100 of FIG. 3, the variable resistance patterns 149-1 of the first memory cells 140-1 may be directly connected to the second electrode lines 120, and the variable resistance patterns 149-2 of the second memory cells 140-2 may be directly connected to the third electrode lines 130. By comparison, the memory device 100d according to the present embodiment may include first memory cells 140b-1, which include the upper electrodes 148-1 provided between the variable resistance pattern 149-1 and the second electrode lines 120, and second memory cells 140b-2, which include the upper electrodes 148-2 provided between the variable resistance pattern 149-2 and the third electrode lines 130.

The upper electrodes 148-1 and 148-2 may serve as current paths, like the lower and intermediate electrodes 141-1, 141-2, 145-1, and 145-2. Also, the upper electrodes 148-1 and 148-2 may prevent the variable resistance patterns 149-1 and 149-2 from being contaminated or etched when a patterning process is performed to form the third electrode lines 130. Furthermore, the upper electrodes 148-1 and 148-2 may prevent a contact failure between the variable resistance patterns 149-1 and 149-2 and the third electrode lines 130. The upper electrodes 148-1 and 148-2 may be formed of the same conductive material as that of the lower and intermediate electrodes 141-1, 141-2, 145-1, and 145-2. Similar to the memory device 100 of FIG. 3, in the memory device 100d, the thickness of the first spacer 150-1 or the second spacer 150-2 may be adjusted so that the first and second memory cells 140b-1 and 140b-2 may have substantially the same resistance. Alternatively, or in addition, at least one of the first spacer 150-1 and the second spacer 150-2 may independently comprise one of a material exerting a compressive stress and a material exerting a tensile stress on the corresponding variable resistance pattern 149-1 and 149-2, and the compressive or tensile stress property of the first spacer 150-1 or the second spacer 150-2 may be adjusted so that the first and second memory cells 140b-1 and 140b-2 may have substantially the same resistance. Accordingly, the memory device 100d may have enhanced reliability.

Figure 11:
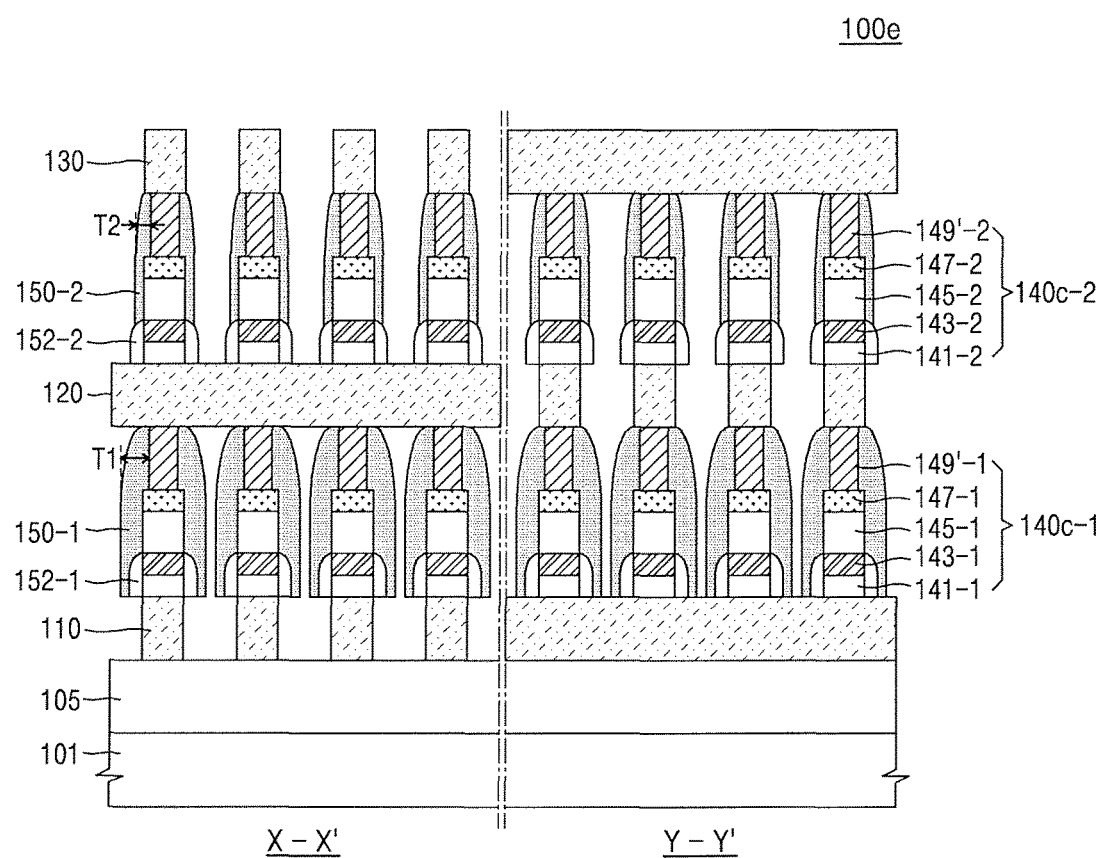

Referring to FIG. 11, a memory device 100e according to an exemplary embodiment of the inventive concept may be different from the memory device 100 of FIG. 3, in that the memory device 100e may include variable resistance patterns 149'-1 and 149'-2 that are formed to be narrower than other patterns. For example, in the memory device 100 of FIG. 3, the variable resistance patterns 149-1 and 149-2 may be formed to have a width substantially the same as those of other patterns (e.g., the heating electrodes 147-1 and 147-2). By comparison, in the memory device 100e according to the present embodiment, the variable resistance patterns 149'-1 and 149'-2 may be formed to have a smaller width than those of other patterns (e.g., the heating electrodes 147-1 and 147-2).

Meanwhile, given that the memory cells 140c-1 and 140c-2 of the memory device 100e have a pillar shape, a horizontal sectional area of each of the variable resistance patterns 149'-1 and 149'-2 may be smaller than that of each of the other patterns (e.g., the heating electrodes 147-1 and 147-2).

Reliability of the memory device 100e may be strongly dependent on a structure or size of the variable resistance pattern 149'-1 or 149'-2. Thus, the variable resistance patterns 149'-1 and 149'-2 may be formed using a different method from that for the other patterns and thus may have a different size from those of the other patterns. Of course, the variable resistance patterns 149'-1 and 149'-2 may be formed to have a larger size than those of the other patterns. Similar to the memory device 100 of FIG. 3, in the memory device 100e, the thickness of the first spacer 150-1 or the second spacer 150-2 may be adjusted so that the first and second memory cells 140c-1 and 140c-2 may have substantially the same resistance. Alternatively, or in addition, at least one of the first spacer 150-1 and the second spacer 150-2 may independently comprise one of a material exerting a compressive stress and a material exerting a tensile stress on the corresponding variable resistance pattern 149'-1 and 149'-2, and the compressive or tensile stress property of the first spacer 150-1 or the second spacer 150-2 may be adjusted so that the first and second memory cells 140c-1 and 140c-2 may have substantially the same resistance. Accordingly, the memory device 100e may have enhanced reliability.

Although not shown, the selection devices 143-1 and 143-2 may have a different size from those of the other patterns.

Figure 12:
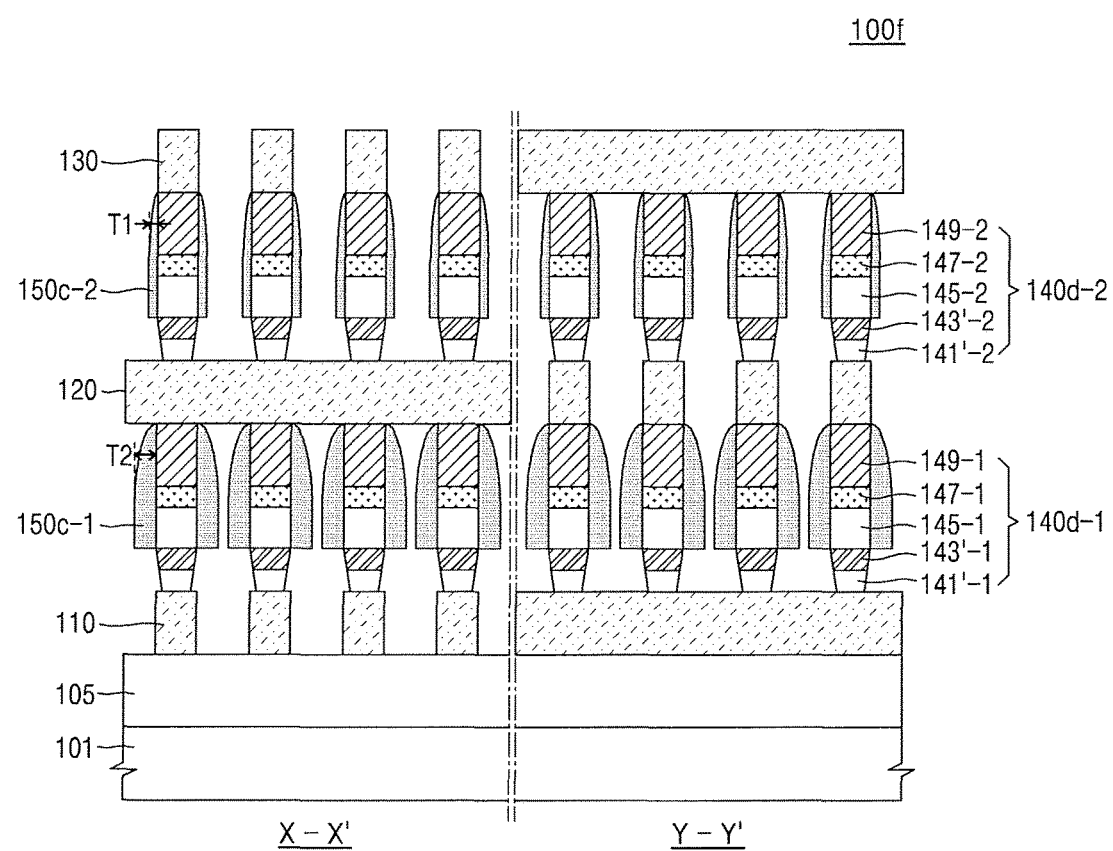

Referring to FIG. 12, a memory device 100f according to an exemplary embodiment of the inventive concept may be different from the memory device 100 of FIG. 3, in that the memory device 100f may include lower electrodes 141'-1 and 141'-2 and selection devices 143'-1 and 143'-2 that are formed in the damascene structure. As described above, the memory cells 140d-1 and 140d-2 may be formed via an etching process or a damascene process.

The etching process may include sequentially forming layers constituting the memory cells and then etching the layers using a mask pattern to form patterns constituting the memory cells. In the case where the etching process is used to form the memory cells, each of the memory cells may be formed to have a narrow upper portion and a wide lower portion. By comparison, the damascene process may include forming an insulating layer, patterning the insulating layer using a mask pattern to form trenches in the insulating layer, and then, filling the trenches with layers constituting the memory cells. In the case where the damascene process is used to form the memory cells, each of the memory cells may be formed to have a wide upper portion and a narrow lower portion. However, in the case of the damascene process, it may be difficult to sequentially form a plurality of layers in the trench, and thus, the damascene process may be generally applied to one or two layers, and other layers may be patterned using the etching process.

In the memory device 100f according to the present embodiment, the lower electrodes 141'-1 and 141'-2 and the selection devices 143'-1 and 143'-2 may be formed via the damascene process, and the intermediate electrodes 145-1 and 145-2, the heating electrodes 147-1 and 147-2 and the variable resistance patterns 149-1 and 149-2 provided thereon may be formed via the etching process. Accordingly, the lower electrodes 141'-1 and 141'-2 and the selection devices 143'-1 and 143'-2 may be formed to have a downward decreasing width.

By precisely controlling an etching step in the damascene process, the side surface of the memory cells 140d-1 and 140d-2 may be formed to be substantially perpendicular to the top surface of the substrate 101. In this case, the upper and lower portions of each of the lower electrodes 141'-1 and 141'-2 and the selection devices 143'-1 and 143'-2 may have substantially the same width. Meanwhile, in order to clearly show that the lower electrodes 141'-1 and 14'1-2 and the selection devices 143'-1 and 143'-2 are formed via the damascene process, the slope of the side surface of them is exaggeratedly illustrated in FIG. 12.

In the memory device 100f according to the present embodiment, since the lower electrodes 141'-1 and 141'-2 and the selection devices 143'-1 and 143'-2 are formed via the damascene process, the spacers 150c-1 and 150c-2 may be formed on only the side surfaces of the intermediate electrodes 145-1 and 145-2, the heating electrodes 147-1 and 147-2, and the variable resistance patterns 149-1 and 149-2. That is, although not shown, in the case where the lower electrodes 141'-1 and 141'-2 and the selection devices 143'-1 and 143'-2 are formed via the damascene process, the spacers 150c-1 and 150c-2 may not be formed on the side surfaces of the lower electrodes 141'-1 and 141'-2 and the selection devices 143'-1 and 143'-2, which are covered with a previously-formed insulating layer. In the present embodiment, the thickness of the first spacer 150c-1 or the second spacer 150c-2 may be adjusted so that the first and second memory cells 140d-1 and 140d-2 may have substantially the same resistance. Alternatively, or in addition, at least one of the first spacer 150c-1 and the second spacer 150c-2 may independently comprise one of a material exerting a compressive stress and a material exerting a tensile stress on the corresponding variable resistance pattern 149-1 and 149-2, and the compressive or tensile stress property of the first spacer 150c-1 or the second spacer 150c-2 may be adjusted so that the first and second memory cells 140d-1 and 140d-2 may have substantially the same resistance. Accordingly, the memory device 100f may have enhanced reliability.

Figure 13:
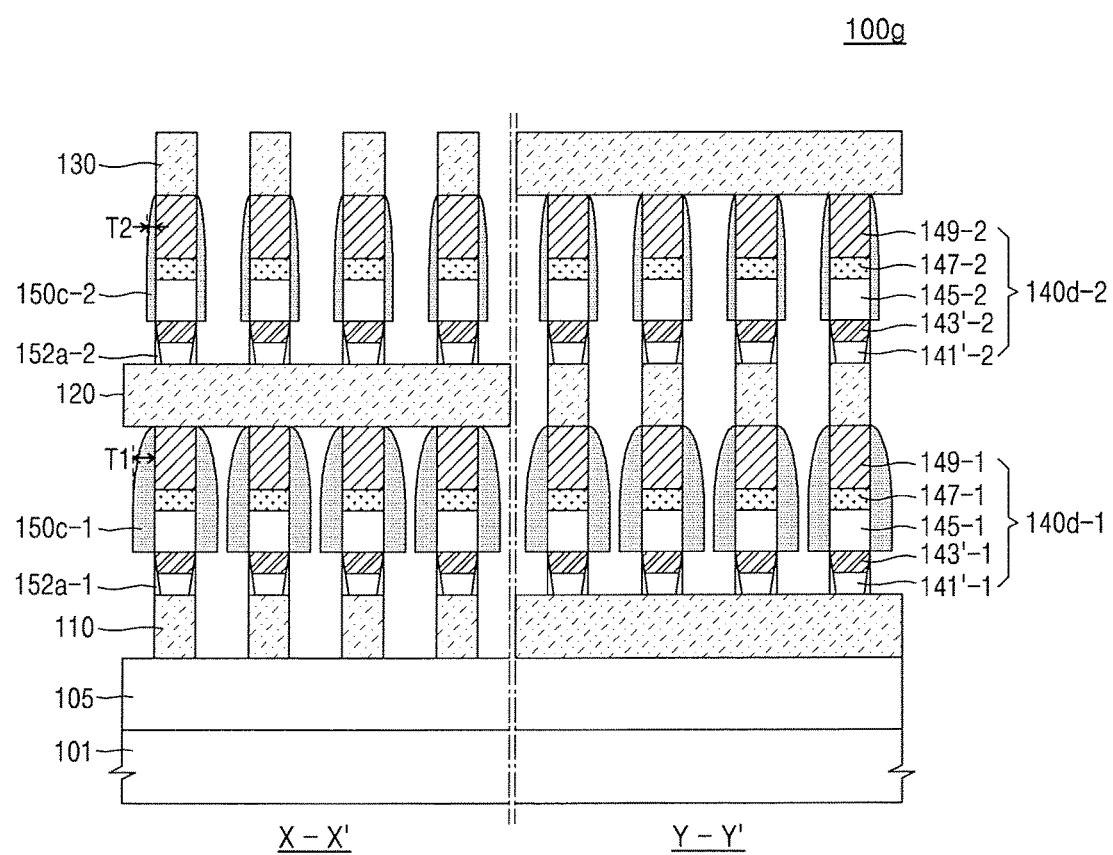

Referring to FIG. 13, a memory device 100g according to an exemplary embodiment of the inventive concept may be similar to the memory device 100f of FIG. 12, in that the lower electrodes 141'-1 and 141'-2 and the selection devices 143'-1 and 143'-2 are formed in the damascene structure. However, in the memory device 100g according to the present embodiment, lower spacers 152a-1 and 152a-2 may be formed on the side surfaces of the lower electrodes 141'-1 and 141'-2 and the selection devices 143'-1 and 143'-2.

In the case of the memory device 100g according to the present embodiment, when the lower electrodes 141'-1 and 141'-2 and the selection devices 143'-1 and 143'-2 are formed via a damascene process, a spacer may be formed on a side surface of a trench, and then, the lower electrodes 141'-1 and 141'-2 and the selection devices 143'-1 and 143'-2 may be formed in the trench provided with the spacer. Accordingly, the memory device 100g according to the present embodiment may include the lower spacers 152a-1 and 152a-2, which are formed on the side surfaces of the lower electrodes 141'-1 and 141'-2 and the selection devices 143'-1 and 143'-2.

In the memory device 100g according to the present embodiment, by controlling thicknesses of the lower spacers 152a-1 and 152a-2, current characteristics (e.g., a threshold voltage) of the selection devices 143'-1 and 143'-2 may be controlled. Of course, resistance characteristics of the memory cells 140d-1 and 140d-2 or the variable resistance patterns 149-1 and 149-2 may be controlled by adjusting the thicknesses of the spacers 150c-1 and 150c-2. For example, the thickness of the first spacer 150c-1 or the second spacer 150c-2 may be adjusted so that the first and second memory cells 140d-1 and 140d-2 may have substantially the same resistance. Alternatively, or in addition, at least one of the first spacer 150c-1 and the second spacer 150c-2 may independently comprise one of a material exerting a compressive stress and a material exerting a tensile stress on the corresponding variable resistance pattern 149-1 and 149-2, and the compressive or tensile stress property of the first spacer 150c-1 or the second spacer 150c-2 may be adjusted so that the first and second memory cells 140d-1 and 140d-2 may have substantially the same resistance. Accordingly, the memory device 100g may have enhanced reliability.

Figure 14:
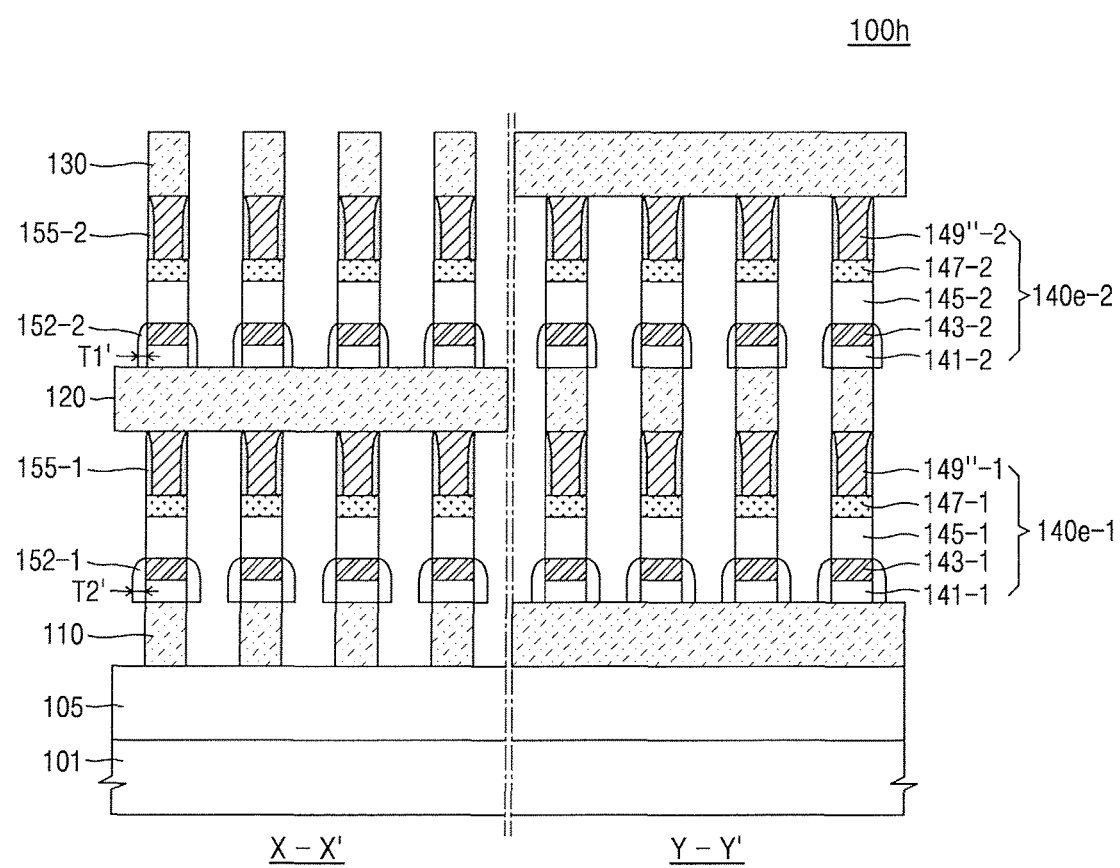

Referring to FIG. 14, a memory device 100h according to an exemplary embodiment of the inventive concept may be different from the memory device 100 of FIG. 3, in that the variable resistance patterns 149"-1 and 149"-2 are formed in the damascene structure. In more detail, in the memory device 100h according to the present embodiment, the lower electrodes 141-1 and 141-2, the selection devices 143-1 and 143-2, the intermediate electrodes 145-1 and 145-2, and the heating electrodes 147-1 and 147-2 may be formed via an etching process, and the variable resistance patterns 149"-1 and 149"-2 may be formed via a damascene process. In addition, the inner spacers 152-1 and 152-2 may be formed on the side surfaces of the lower electrodes 141-1 and 141-2 and the selection devices 143-1 and 143-2. In an exemplary embodiment of the inventive concept, the inner spacers 152-1 and 152-2 may be omitted.

In the memory device 100*h* according to the present embodiment, upper spacers 155-1 and 155-2 may be formed on the side surfaces of the variable resistance patterns 149"-1 and 149"-2. The upper spacers 155-1 and 155-2 may be formed by using the same method as that for the lower spacers 152*a*-1 and 152*a*-2 of the memory device 100*g* of FIG. 13. For example, trenches may be formed on an insulating layer, and then, the upper spacers 155-1 and 155-2 may be formed on side surfaces of the trenches. In this case, the variable resistance patterns 149"-1 and 149"-2 may be formed to fill remaining spaces of the trenches provided with the upper spacers 155-1 and 155-2. In an exemplary embodiment of the inventive concept, the upper spacers 155-1 and 155-2 may be omitted.

The thicknesses of the upper spacers 155-1 and 155-2 may be adjusted to enhance resistance characteristics of the variable resistance patterns 149"-1 and 149"-2. For example, the thickness of the upper spacer 155-1 or the upper spacer 155-2 may be adjusted so that the first and second memory cells 140*e*-1 and 140*e*-2 may have substantially the same resistance. Alternatively, or in addition, at least one of the first spacer 155-1 and the second spacer 155-2 may independently comprise one of a material exerting a compressive stress and a material exerting a tensile stress on the corresponding variable resistance pattern 149"-1 and 149"-2, and the compressive or tensile stress property of the first spacer 155-1 or the second spacer 155-2 may be adjusted so that the first and second memory cells 140*e*-1 and 140*e*-2 may have substantially the same resistance. Accordingly, the memory device 100*h* may have enhanced reliability. Also, the thicknesses of the inner spacers 152-1 and 152-2 may be adjusted to enhance the current characteristics of the selection devices 143-1 and 143-2. That is, in the memory device 100*h* according to the present embodiment, the electric characteristics of the variable resistance patterns 149"-1 and 149"-2 and the selection devices 143-1 and 143-2 can be independently controlled.

To reduce complexity in the drawings, the side surfaces of the upper spacers 155-1 and 155-2 are illustrated in FIG. 14 to be almost perpendicular to the top surface of the substrate 101. However, in an exemplary embodiment of the inventive concept, the side surfaces of the upper spacers 155-1 and 155-2 may be formed to be slightly inclined at an angle to the top surface of the substrate 101. For example, in the case where the damascene process is used to form the upper spacers 155-1 and 155-2 and the variable resistance patterns 149"-1 and 149"-2, the upper spacers 155-1 and 155-2 may be formed to have a decreasing width in a downward direction.

Figure 15A:
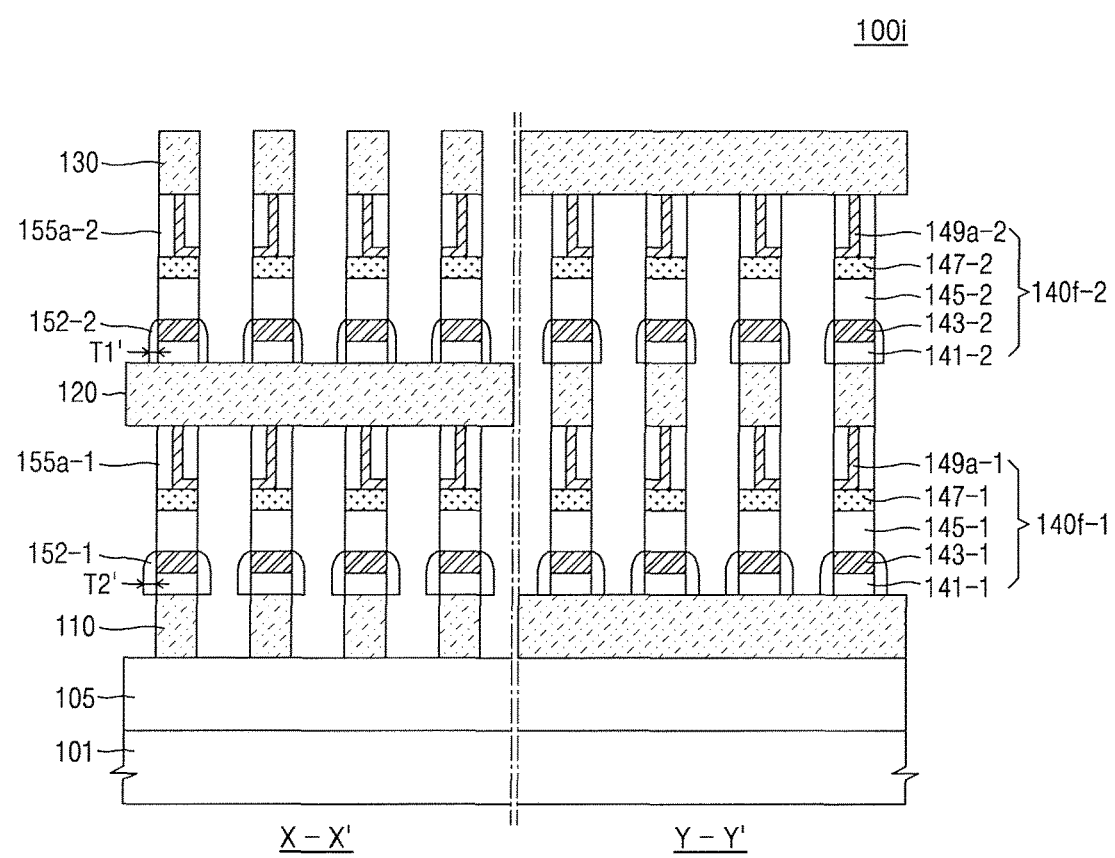

Referring to FIG. 15A, a memory device 100*i* according to an exemplary embodiment of the inventive concept may be different from the memory device 100*h* of FIG. 14, in that the memory device 100*i* may include variable resistance patterns 149*a*-1 and 149*a*-2 that are formed in the damascene structure but have an "L"-shaped structure. In more detail, in the memory device 100*i* according to the present embodiment, the lower electrodes 141-1 and 141-2, the selection devices 143-1 and 143-2, the intermediate electrodes 145-1 and 145-2, and the heating electrodes 147-1 and 147-2 may be formed via an etching process, and the variable resistance patterns 149*a*-1 and 149*a*-2 may be formed via a damascene process. In addition, the inner spacers 152-1 and 152-2 may be formed on the side surfaces of the lower electrodes 141-1 and 141-2 and the selection devices 143-1 and 143-2. In an exemplary embodiment of the inventive concept, the inner spacers 152-1 and 152-2 may be omitted.

In the memory device 100*i* according to the present embodiment device, the upper spacers 155*a*-1 and 155*a*-2 may be formed on the side surfaces of the variable resistance patterns 149*a*-1 and 149*a*-2. However, since the variable resistance patterns 149*a*-1 and 149*a*-2 have the "L"-shaped structure, the upper spacers 155*a*-1 and 155*a*-2 may be formed to have an asymmetric structure. In the case where the damascene process is used to form the variable resistance patterns 149*a*-1 and 149*a*-2 with the "L"-shaped structure, an insulating layer may be formed on the heating electrodes 147-1 and 147-2, and then, trenches may be formed in the insulating layer. Here, the trench may be formed to be overlapped with adjacent cells from among the memory cells 140*f*-1 and 140*f*-2. Thereafter, a first layer, which is to be used as the variable resistance pattern, may be thinly formed on an inner surface of the trench and on the insulating layer, and then, a second layer, which is to be used as the upper spacer may be formed on the first layer. Next, a planarization process (e.g., chemical mechanical polishing (CMP)) may be performed to expose a top surface of the insulating layer. After the planarization process, mask patterns may be formed to be aligned with the memory cells 140*f*-1 and 140*f*-2, and then, the first and second layers may be etched using the mask patterns. As a result, the variable resistance patterns 149*a*-1 and 149*a*-2 having the "L"-shaped structure and the upper spacers 155*a*-1 and 155*a*-2 may be formed.

In the memory device 100*i* according to the present embodiment, the thicknesses of the upper spacers 155*a*-1 and 155*a*-2 may be adjusted to enhance the resistance characteristics of the variable resistance patterns 149*a*-1 and 149*a*-2. For example, the thickness of the upper spacer 155*a*-1 or the upper spacer 155*a*-2 may be adjusted so that the first and second memory cells 140*f*-1 and 140*f*-2 may have substantially the same resistance. Alternatively, or in addition, at least one of the first spacer 155*a*-1 and the second spacer 155*a*-2 may independently comprise one of a material exerting a compressive stress and a material exerting a tensile stress on the corresponding variable resistance pattern 149*a*-1 and 149*a*-2, and the compressive or tensile stress property of the first spacer 155*a*-1 or the second spacer 155*a*-2 may be adjusted so that the first and second memory cells 140*f*-1 and 140*f*-2 may have substantially the same resistance. Accordingly, the memory device 100*i* may have enhanced reliability. Also, the thicknesses of the inner spacers 152-1 and 152-2 may be adjusted to enhance the current characteristics of the selection devices 143-1 and 143-2.

Figure 15B:
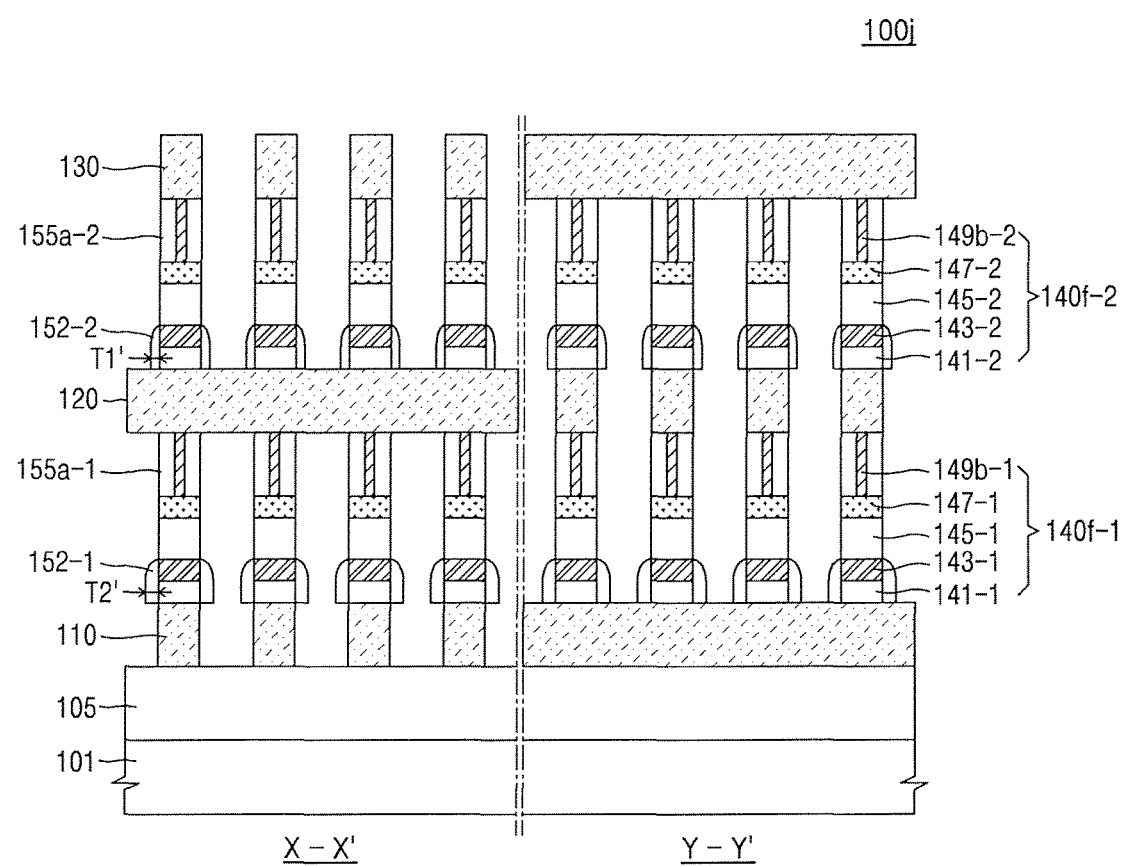

Referring to FIG. 15B, a memory device 100*j* according to an exemplary embodiment of the inventive concept may be different from the memory device 100*i* of FIG. 15A, in that the memory device 100*j* may include variable resistance patterns 149*b*-1 and 149*b*-2 that are formed to have a dash ("-") structure. The dash-shaped ("-") structure of the variable resistance patterns 149*b*-1 and 149*b*-2 may be formed using a similar method to that for the "L"-shaped structure. For example, a first layer, which is to be used as the variable resistance pattern, may be thinly formed on an inner surface of the trench and on the insulating layer, and then, an anisotropic etching process may be performed to have a portion of the first layer remain on a side surface of the trench. Thereafter, a second layer may be formed to cover the remaining portion of the first layer. Next, a planarization process (e.g., chemical mechanical polishing (CMP)) may be performed to expose a top surface of the insulating layer. After the planarization process, mask patterns may be formed to be aligned with the memory cells 140f-1 and 140f-2, and then, the second layer may be etched using the mask patterns. As a result, the variable resistance patterns 149b-1 and 149b-2 having the dash ("-") structure and the upper spacers 155a-1 and 155a-2 may be formed.

To distinguish other structures of the variable resistance pattern from the "L"-shaped structure and the dash-shaped ("-") structure of FIGS. 15A and 15B respectively, the structures of the variable resistance patterns according to the previous embodiments (e.g., of FIGS. 1 to 14) will be referred to as a 'pillar structure', and the variable resistance pattern with a large side surface slope will be referred to as a 'pyramid structure'. Meanwhile, this classification may be applied to not only the variable resistance pattern but also to the selection device; that is, the selection device may be formed to have one of the pillar structure, the "L"-shaped structure, the pyramid structure, and the dash-shaped ("-") structure. In the present embodiment, the thickness of the upper spacer 155a-1 or the upper spacer 155a-2 may be adjusted so that the first and second memory cells 140f-1 and 140f-2 may have substantially the same resistance. Alternatively, or in addition, at least one of the first spacer 155a-1 and the second spacer 155a-2 may independently comprise one of a material exerting a compressive stress and a material exerting a tensile stress on the corresponding variable resistance pattern 149b-1 and 149b-2, and the compressive or tensile stress property of the first spacer 155a-1 or the second spacer 155a-2 may be adjusted so that the first and second memory cells 140f-1 and 140f-2 may have substantially the same resistance. Accordingly, the memory device 100j may have enhanced reliability.

Until now, various structures of the memory device have been described. However, the inventive concept is not limited thereto. For example, the inventive concept may be applied to realize any 3D cross-point stack structure of a memory device, in which spacers having different thicknesses are formed on side surfaces of memory cells that are positioned at different levels.

Figure 16:
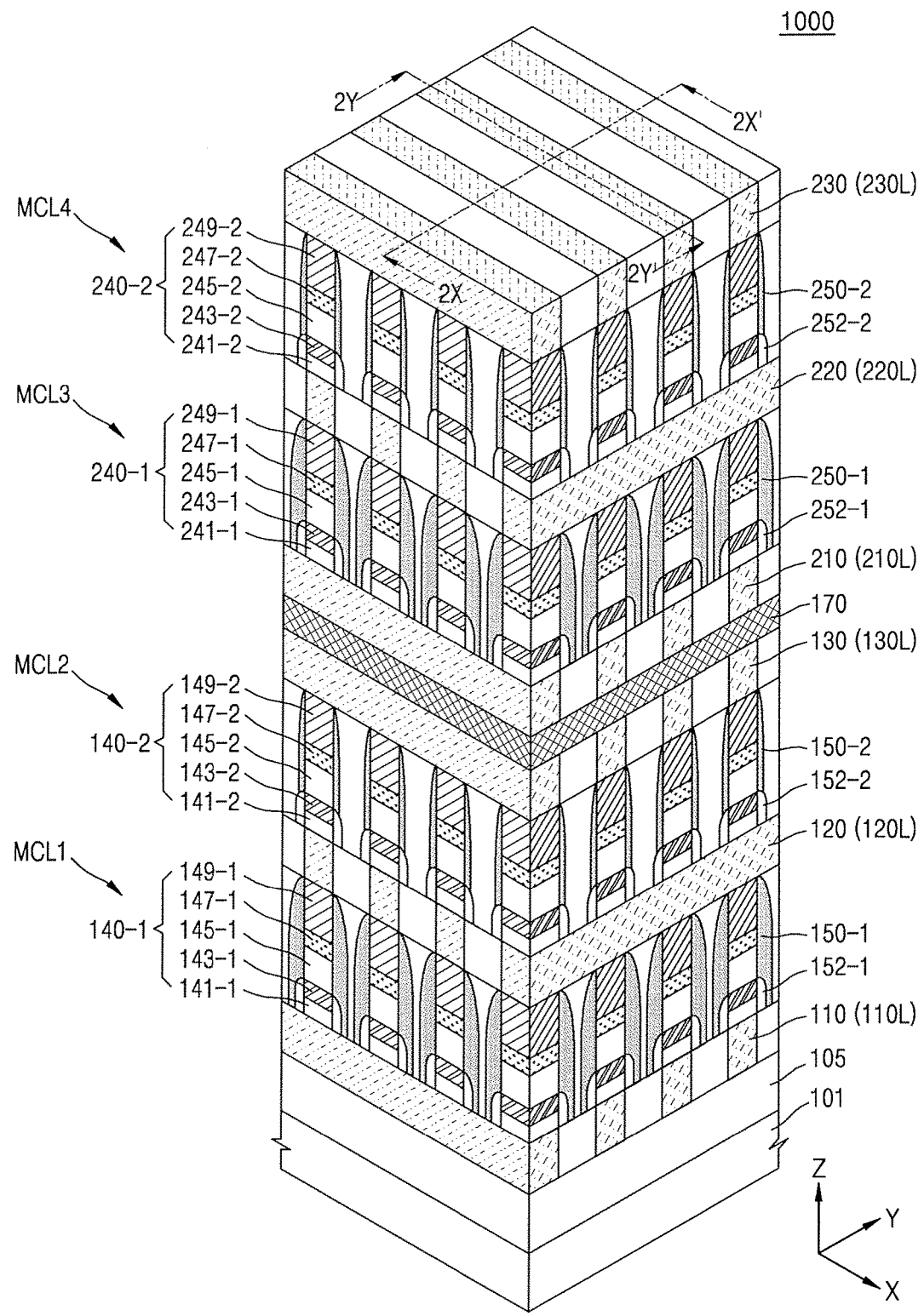
FIG. 16 is a perspective view of a memory device according to an exemplary embodiment of the inventive concept.
Figure 17:
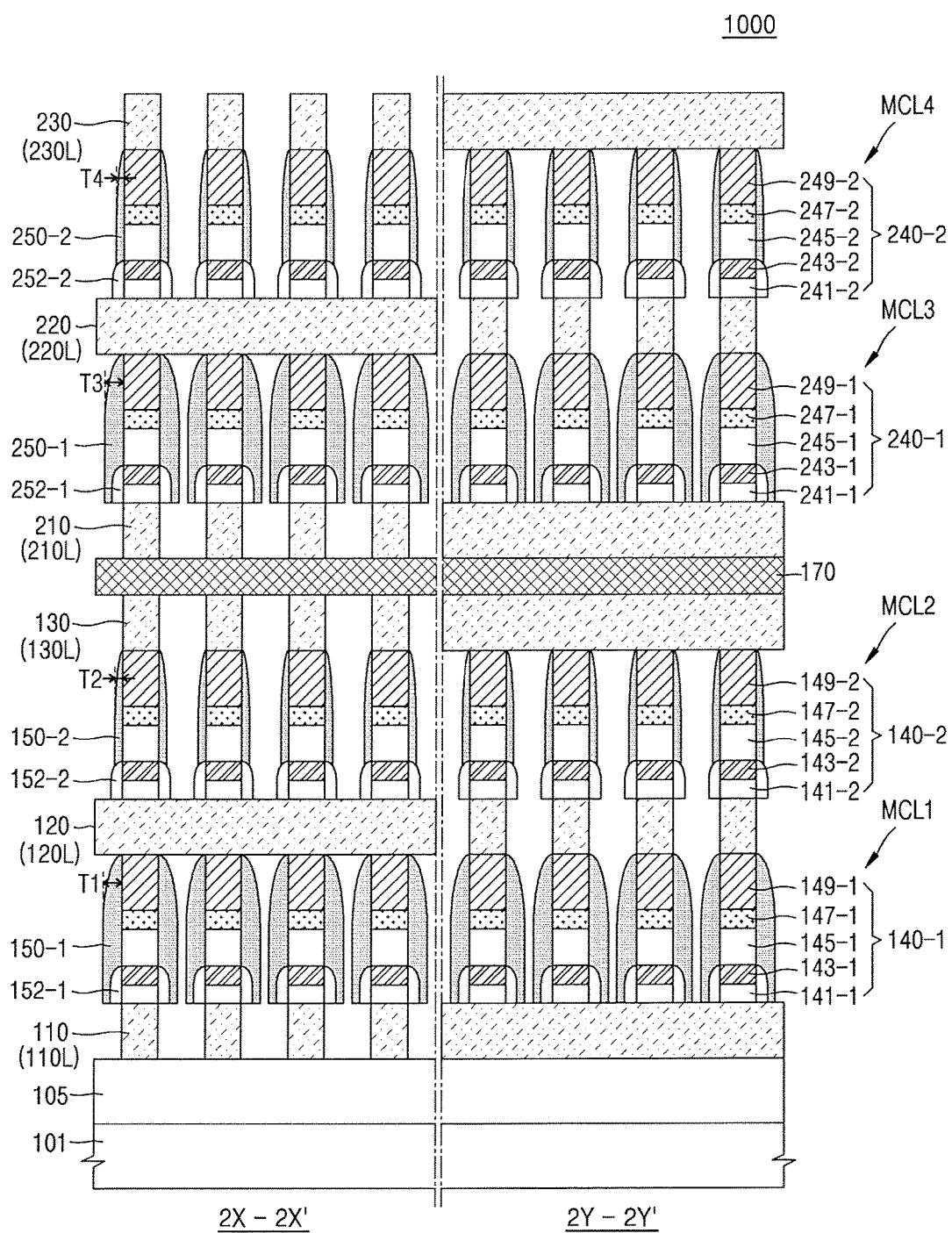
FIG. 17 is a sectional view taken along lines 2X-2X' and 2Y-2Y' of FIG. 16.

FIG. 16 is a perspective view of a memory device according to an exemplary embodiment of the inventive concept, and FIG. 17 is a sectional view taken along lines 2X-2X' and 2Y-2Y' of FIG. 16. In the description that follows, descriptions of features identical to those of FIGS. 2 to 3 will be kept to a minimum or omitted in order to avoid redundancy.

Referring to FIGS. 16 and 17, a memory device 1000 according to an exemplary embodiment of the invent concept may include four memory cell layers MCL1, MCL2, MCL3, and MCL4, which are stacked on the substrate 101, thereby having a four-layer structure. For example, the first memory cell layer MCL1 may be provided between the first electrode line layer 110L and the second electrode line layer 120L, and the second memory cell layer MCL2 may be provided between the second and third electrode line layers 120L and 130L. A second interlayered insulating layer 170 may be formed on the third electrode line layer 130L, and a first upper electrode line layer 210L, a second upper electrode line layer 220L, and a third upper electrode line layer 230L may be provided on the second interlayered insulating layer 170. The first upper electrode line layer 210L may include first upper electrode lines 210 having a structure substantially the same as that of the first electrode lines 110, the second upper electrode line layer 220L may include second upper electrode lines 220 having a structure substantially the same as that of the second electrode lines 120, the third upper electrode line layer 230L may include third upper electrode lines 230 having a structure substantially the same as that of the first or third electrode lines 110 or 130. A first upper memory cell layer MCL3 may be provided between the first and second upper electrode line layers 210L and 220L, and a second upper memory cell layer MCL4 may be provided between the second and third upper electrode line layers 220L and 230L.

The first, second, and third electrode line layers 110L, 120L, and 130L and the first and second memory cell layers MCL1 and MCL2 may have substantially the same features as those described with reference to FIGS. 2 and 3. The first, second, and third upper electrode line layers 210L, 220L, and 230L and the first and second upper memory cell layers MCL3 and MCL4 may also have features substantially the same as those of the first, second, and third electrode line layers 110L, 120L, and 130L and the first and second memory cell layers MCL1 and MCL2, except that they are provided on the second interlayered insulating layer 170, not on the first interlayered insulating layer 105. Thus, a detailed description of each element will be omitted.

Since the third upper electrode lines 230 of the third upper electrode line layer 230L and the first upper electrode lines 210 of the first upper electrode line layer 210L may include a structure substantially the same as that of the first electrode lines 110, the third upper electrode line layer 230L may be viewed as the first upper electrode line layer. Thus, the memory device 1000 may be viewed as to have two first upper electrode line layers and one second upper electrode line layer, and each of the first and second upper memory cell layers MCL3 and MCL4 may be positioned between one of the two first upper electrode line layers and the second upper electrode line layer. For a memory device including 6 memory cell layers, a third interlayer insulating layer may be provided on the above described structure, and then additional first, second, and first upper electrode line layers may be sequentially stacked on the third interlayer insulating layer. Each of the two additional upper memory cell layers may be positioned between one of the two additional first upper electrode line layers and the additional second upper electrode line layer.

The memory device 1000 according to the present embodiment may have a structure, which may be realized by additionally forming the second interlayered insulating layer 170 and the double-layer structure, which is positioned on the substrate 101 of the memory device 100 shown in FIGS. 2 and 3. However, the structure of the memory device 1000 according to the present embodiment is not limited thereto. For example, the memory device 1000 according to the present embodiment may have a structure, which may be realized by additionally forming the double-layer structure, which is positioned on the substrate 101 of each of the memory devices 100a-100j of FIGS. 7 to 14, 15A, and 15B, along with the second interlayered insulating layer 170. In an exemplary embodiment of the inventive concept, the memory device 1000 according to the present embodiment may be configured in such a way that the memory device 100 of FIG. 3 is provided below the second interlayered insulating layer 170 and the memory device 100a of FIG. 7 is provided on the second interlayered insulating layer 170, thereby having a hybrid structure. However, structures provided on or below the second interlayered insulating layer 170 may be configured to have the same double-layer structure, and this may reduce a vertical variation in electrical characteristics of memory cells.

The memory device 1000 according to the present embodiment may be configured to include the four memory cell layers MCL1, MCL2, MCL3, and MCL4 (i.e., to have the four-layer structure), but the inventive concept is not limited thereto. For example, the inventive concept may be applied to realize any 3D cross-point stack structure of a memory device that is formed by stacking the double-layer structure at least three times, along with an interlayered insulating layer. Here, in such a 3D memory device, side surfaces of the memory cells may be covered with upper-level spacers, which are provided on common electrode lines (e.g., the second electrode lines 120), and lower-level spacers, which are provided under the common electrode lines and have a thickness different from the upper-level spacers.

Figure 18:
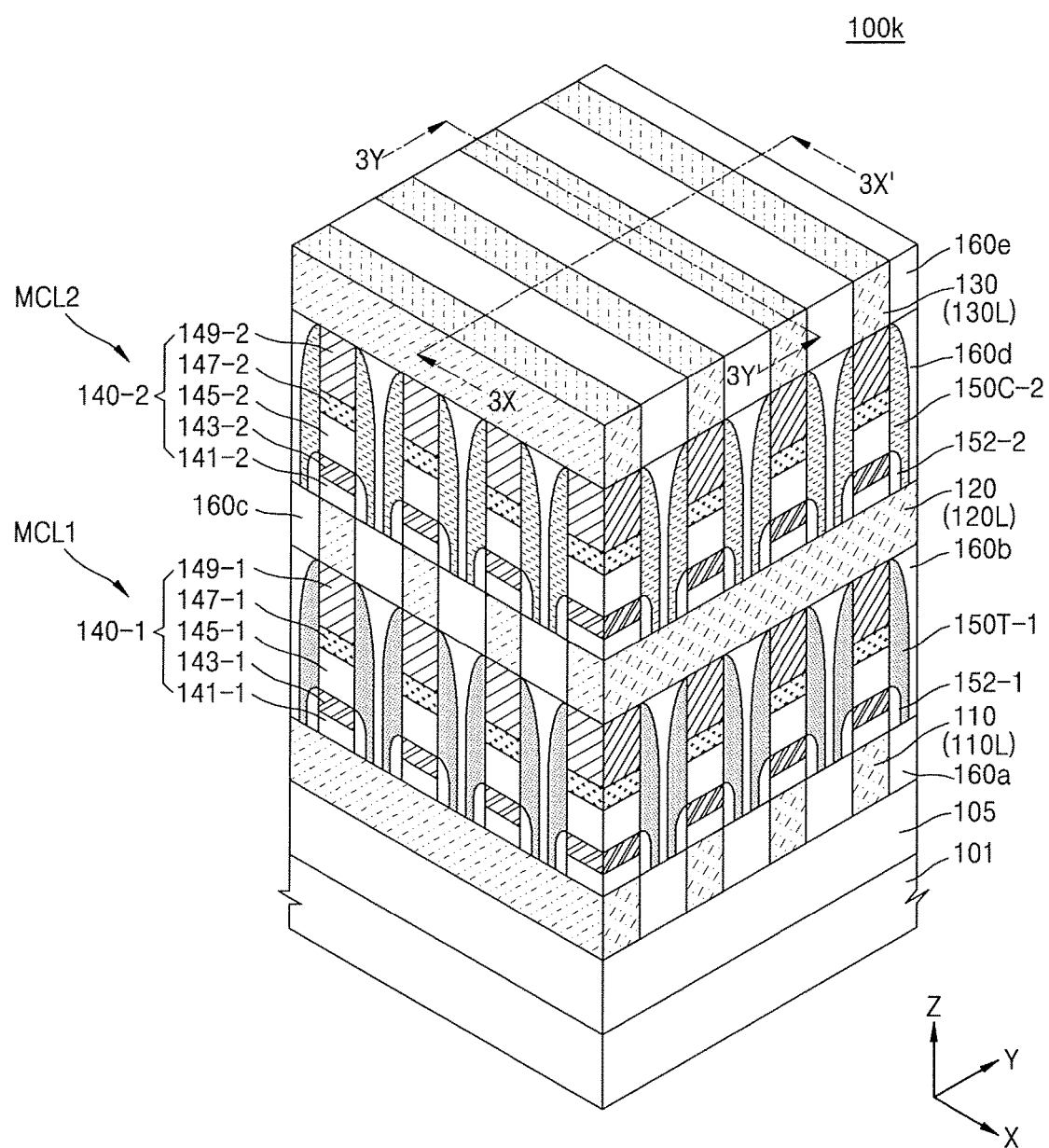
FIG. 18 is a perspective view of a memory device according to an exemplary embodiment of the inventive concept.
Figure 19:
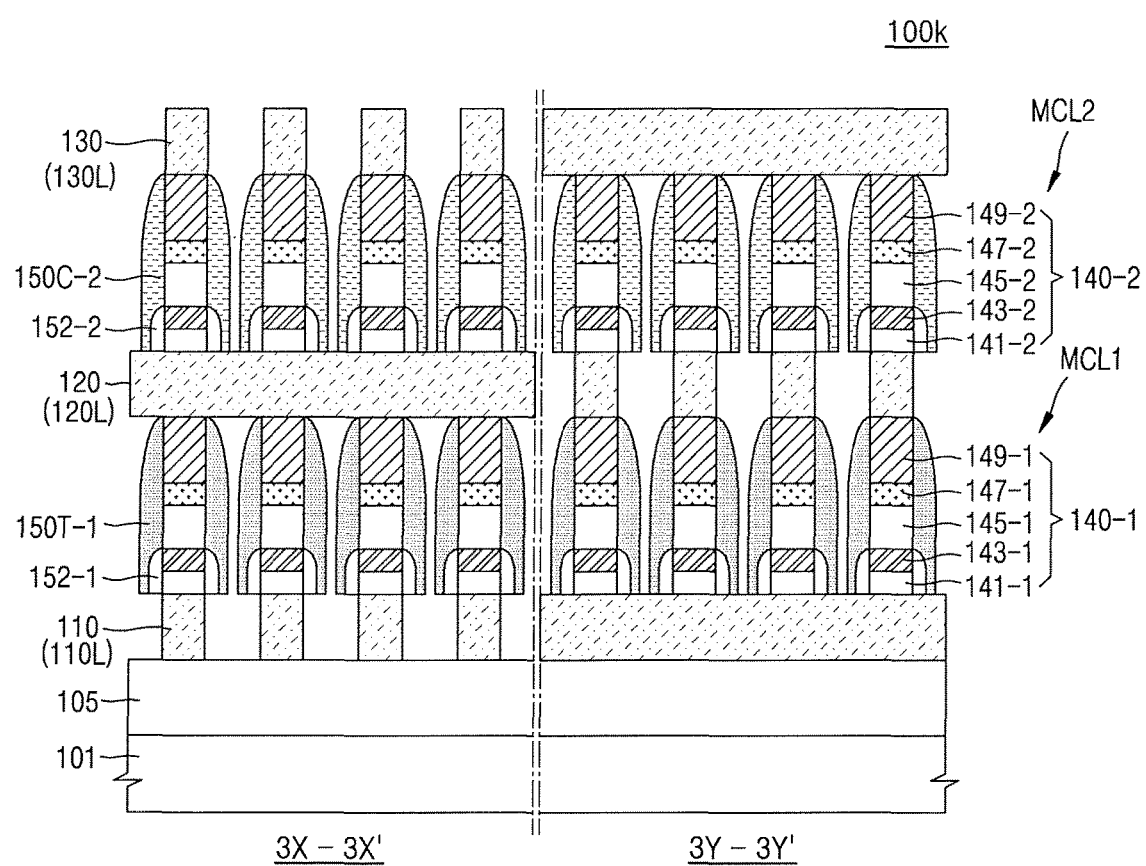
FIG. 19 is a sectional view taken along lines 3X-3X' and 3Y-3Y' of FIG. 18.

FIG. 18 is a perspective view of a memory device according to an exemplary embodiment of the inventive concept, and FIG. 19 is a sectional view taken along lines 3X-3X' and 3Y-3Y' of FIG. 18. In the description that follows, descriptions of features identical to those of FIGS. 2 to 3 will be kept to a minimum or omitted in order to avoid redundancy.

Referring to FIGS. 18 and 19, a memory device 100k according to an exemplary embodiment of the inventive concept may be similar to the memory device 100 of FIGS. 2 and 3, in that the memory device 100k may be configured to include two memory cell layers MCL1 and MCL2 (i.e., to have a double-layer structure). However, in the memory device 100k according to the present embodiment, first spacers 150T-1 of the first memory cells 140-1 and second spacers 150C-2 of the second memory cells 140-2 may be provided to have substantially the same thickness but to have material properties different from each other. For example, the first spacer 150T-1 may have a tensile stress property, and the second spacer 150C-2 may have a compressive stress property. In other words, the first spacer 150T-1 may be configured to exert the tensile stress on the first memory cell 140-1 (in particular, to the variable resistance pattern 149-1) enclosed therewith, and the second spacer 150C-2 may be configured to exert the compressive stress on the second memory cells 140-2 (in particular, the variable resistance pattern 149-2) enclosed therewith.

According to experimental results, when the compressive stress was exerted on the first and second memory cells 140-1 and 140-2, there was an increase in resistance (e.g., set resistance) thereof, whereas when the tensile stress was exerted, there was a reduction in resistance (e.g., set resistance). Accordingly, by forming a spacer with the tensile stress property on a memory cell of high resistance, resistance of the memory cell may be reduced. Furthermore, by forming a spacer with the compressive stress property on a memory cell of low resistance, a vertical variation in electrical characteristics of memory cells that are provided at different levels or layers may be reduced.

In the case where spacers with the same thickness and the same material property are formed on the side surfaces of the first and second memory cells 140-1 and 140-2, resistance of the first memory cells 140-1 may be higher than those of the second memory cells 140-2. In such a case, by providing the first spacer 150T-1 with the tensile stress property on the side surface of the first memory cell 140-1, the set resistance of the first memory cell 140-1 may be reduced. Furthermore, by providing the second spacer 150C-2 with the compressive stress property on the side surface of the second memory cell 140-2, the set resistance of the second memory cell 140-2 may increase. That is, in the case where the material property of the spacer is adjusted in consideration of resistance characteristics of the first and second memory cells 140-1 and 140-2, the resistance characteristics of the first and second memory cells 140-1 and 140-2 may be enhanced.

In the memory device 100k according to the present embodiment, the first spacers 150T-1 with the tensile stress property may be formed on the side surfaces of the first memory cells 140-1, and the second spacers 150C-2 with the compressive stress property may be formed on the side surfaces of the second memory cells 140-2. Accordingly, it may enhance resistance characteristics of the first and second memory cells 140-1 and 140-2, and consequently, may reduce a vertical variation in electrical characteristics of memory cells provided at different levels or layers. Of course, depending on the resistance characteristics of the first and second memory cells 140-1 and 140-2, the first spacer 150T-1 with the tensile stress property may be formed on the side surfaces of the second memory cells 140-2, and the second spacer 150C-2 with the compressive stress property may be formed on the side surfaces of the first memory cells 140-1.

Figure 20:
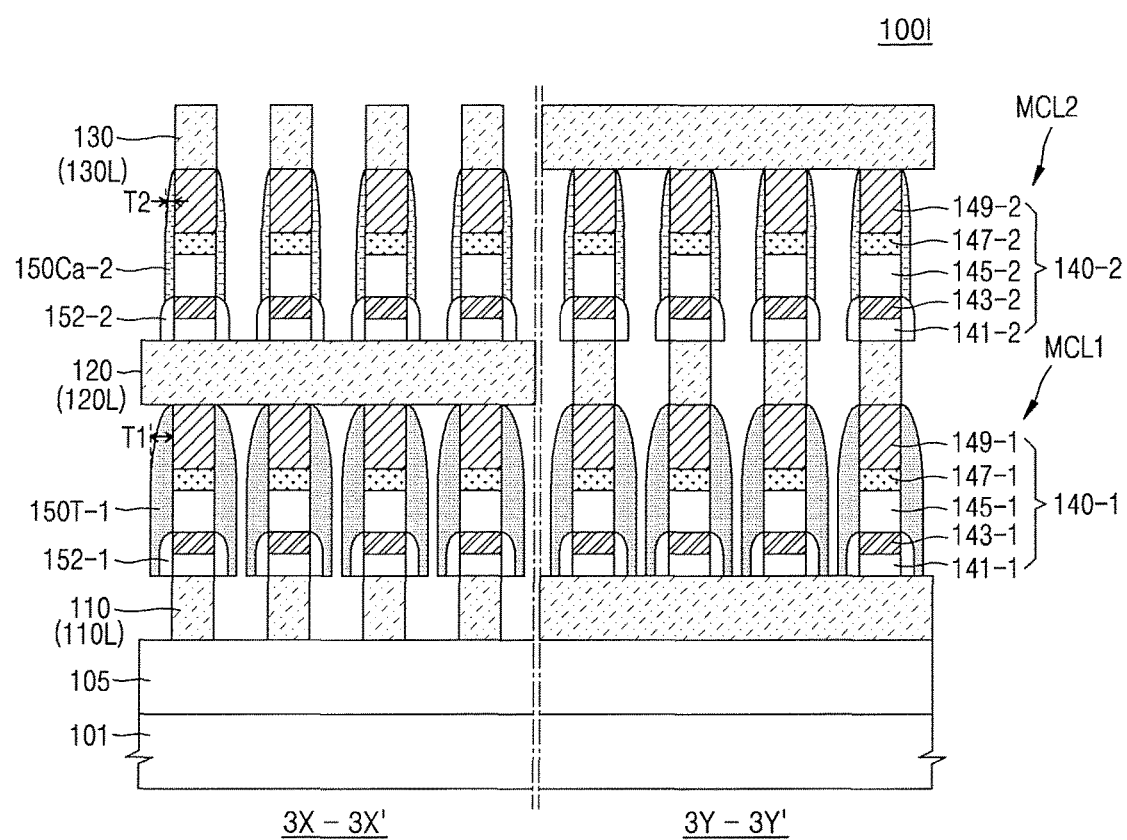
FIG. 20 is a sectional view of a memory device according to an exemplary embodiment of the inventive concept and corresponding to the sectional view of FIG. 17.

FIG. 20 is a sectional view of a memory device according to an exemplary embodiment of the inventive concept and corresponding to the sectional view of FIG. 19. In the description that follows, descriptions of features identical to those of FIGS. 2, 3, 16, 17, 18, and 19 will be kept to a minimum or omitted in order to avoid redundancy.

Referring to FIG. 20, a memory device 100l according to an exemplary embodiment of the inventive concept may be different from the memory device 100k of FIG. 19, in that the memory device 100l may include second spacers 150Ca-2 formed to have a different thickness from that of the first spacer 150T-1. For example, in the memory device 100l according to the present embodiment, the first spacers 150T-1 of the first memory cells 140-1 may have a tensile stress property, and the second spacers 150Ca-2 of the second memory cells 140-2 may have a compressive stress property. In addition, as shown in FIG. 20, the first spacer 150T-1 may be formed to have the first thickness T1 greater than a thickness (e.g., the second thickness T2) of the second spacer 150Ca-2.

Since the first spacer 150T-1 with the tensile stress property is thickly formed, the resistance of the first memory cells 140-1 may effectively decrease. For example, in certain cases, there may be a large difference in resistance between the first and second memory cells 140-1 and 140-2, and it may be necessary to form a spacer protecting the first and second memory cells 140-1 and 140-2. In such cases, by thickly forming the first spacers 150T-1 with the tensile stress property on the side walls of the first memory cells 140-1 having high resistance and forming the second spacer 150Ca-2 with the compressive stress property on the side walls of the second memory cells 140-2, the variation in resistance characteristics between the first and second memory cells 140-1 and 140-2 may be reduced or minimized.

In the memory device 100l according to the present embodiment, by adjusting a material property and a thickness of a spacer, resistance characteristics of the first and second memory cells 140-1 and 140-2 may be more precisely controlled. Accordingly, in the memory device 100l according to the present embodiment, a vertical variation in resistance of the first and second memory cells 140-1 and 140-2 may be reduced or minimized.

As described above, in the memory device 100*l* according to the present embodiment, the spacers with different material properties and different thicknesses may be applied to the memory cells located at different levels or layers, but the inventive concept is not limited thereto. For example, the spacers of the memory devices 100*a*-100*j* of FIGS. 7 to 15B may also be configured to have at least two different material properties. Furthermore, the technical concept is not limited to the above-described structures of the memory devices. For example, the inventive concept may be applied to realize any memory device, which is configured to have a 3D cross-point stack structure, and in which the spacers with different material properties are used for the memory cells 140-1 and 140-2 at different levels or layers.

Figure 21:
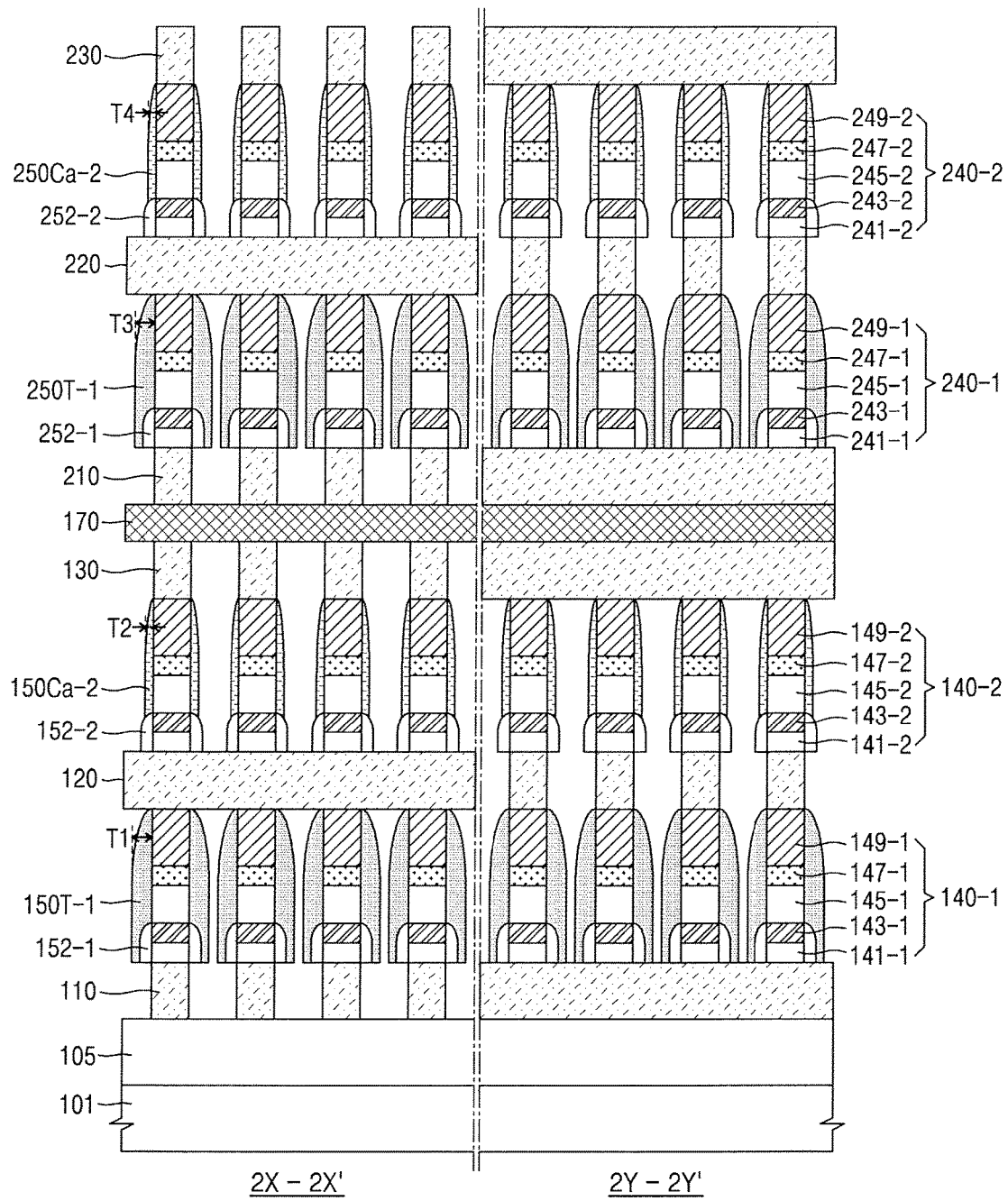
FIG. 21 is a sectional view of a memory device according to an exemplary embodiment of the inventive concept and corresponding to the sectional view of FIG. 19.

FIG. 21 is a sectional view of a memory device according to an exemplary embodiment of the inventive concept and corresponding to the sectional view of FIG. 17. In the description that follows, descriptions of features identical to those of FIGS. 2, 3, 16, 17, 18, 19, and 20 will be kept to a minimum or omitted in order to avoid redundancy.

Referring to FIG. 21, a memory device 1000*a* according to an exemplary embodiment of the inventive concept may be similar to the memory device 1000 of FIG. 17, in that the memory device 1000*a* may be provided to have a four-layer structure. However, the memory device 1000*a* according to the present embodiment may be different from the memory device 1000 of FIG. 17, in that the memory device 1000*a* may include memory cells 140-1, 140-2, 240-1, and 240-2 covered with spacers having different material properties. For example, in the memory device 1000*a* according to the present embodiment, the spacers 150T-1 and 250T-1 with the tensile stress property may be formed on the side surfaces of the first memory cells 140-1 and the first upper memory cells 240-1, and the spacers 150Ca-2 and 250Ca-2 with the compressive stress property may be formed on the side surfaces of the second memory cells 140-2 and the second upper memory cells 240-2. Here, the spacers 150T-1 and 250T-1 with the tensile stress property may be formed to a first thickness T1, and the spacers 150Ca-2 and 250Ca-2 with the compressive stress property may be formed to have a second thickness T2 that is smaller than the first thickness T1.

The memory device 1000*a* according to the present embodiment may have a four-layer structure, which may be realized by additionally stacking an upper structure, which is positioned on the substrate 101 of the memory device 100*l* of FIG. 20, along with the second interlayered insulating layer 170, on the memory device 100*l*. However, the structure of the memory device 1000*a* is not limited thereto. For example, the four-layer structure of the memory device may be realized by additionally providing an upper structure, which is positioned on the substrate 101 of the memory device 100*k* of FIG. 19, along with the second interlayered insulating layer 170, on the memory device 100*k*. Also, the four-layer structure of the memory device may be realized by additionally providing an upper structure, which is positioned on the substrate 101 of each of the memory devices 100*a*-100*j* of FIGS. 7 to 14, 15A, and 15B, and in which the spacers with different material properties are provided, along with the second interlayered insulating layer 170, on each of the memory devices 100*a*-100*j*. In addition, the thicknesses and material properties of the spacers of the memory devices 100*a*-100*j* of FIGS. 7 to 14, 15A, and 15B having four-layer structure may be properly provided and adjusted, so that the variation in resistance characteristics among these four memory cells may be reduced or minimized, and may result in these four memory cells having substantially the same resistance.

The inventive concept is not limited to the afore-described structures of the memory device. For example, the inventive concept may be applied to realize any 3D cross-point stack structure of a memory device that is formed by stacking the double-layer structure at least three times, along with an interlayered insulating layer. Here, in such a 3D memory device, side surfaces of the memory cells may be covered with upper-level spacers, which are provided on common electrode lines (e.g., the second electrode lines 120), and lower-level spacers, which are provided under the common electrode lines and have a material property different from the upper-level spacers.

FIGS. 22A to 22L are sectional views for describing a process of fabricating a memory device (e.g., of FIG. 3) according to an exemplary embodiment of the inventive concept. In the description that follows, descriptions of features identical to those of FIGS. 1 to 21 will be kept to a minimum or omitted in order to avoid redundancy.

Figure 22A:
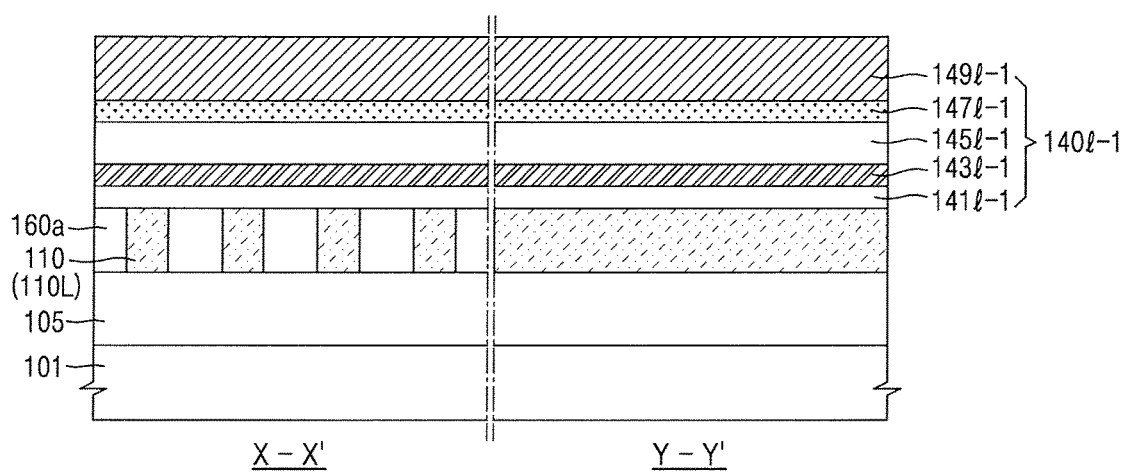
FIGS. 22A to 22L are sectional views for describing a process of fabricating a memory device (e.g., of FIG. 3) according to an exemplary embodiment of the inventive concept.

Referring to FIG. 22A, the interlayered insulating layer 105 may be formed on the substrate 101. The interlayered insulating layer 105 may be formed of or include, for example, silicon oxide or silicon nitride. However, the material for the interlayered insulating layer 105 is not limited thereto. Thereafter, the first electrode line layer 110L may be formed on the interlayered insulating layer 105, and the first electrode line layer 110L may include a plurality of the first electrode lines 110, which extend in the first direction X and are spaced apart from each other in the second direction Y. The formation of the first electrode lines 110 may include a patterning step using an etching process or a damascene process. The first electrode lines 110 may be formed of the same material as that described with reference to FIGS. 2 and 3. The first insulating layer 160*a* may be formed between the first electrode lines 110 to extend in the first direction X.

A lower electrode layer 1411-1, a selection device layer 1431-1, a second intermediate electrode layer 1451-1, a heating electrode layer 1471-1, and a variable resistance pattern layer 1491-1 may be sequentially stacked on the first electrode line layer 110L and the first insulating layer 160*a* to form a first stack 1401-1. Each of the layers constituting the first stack 1401-1 may be the same as the corresponding one in FIGS. 2 and 3 in terms of its material or function.

Figure 22B:
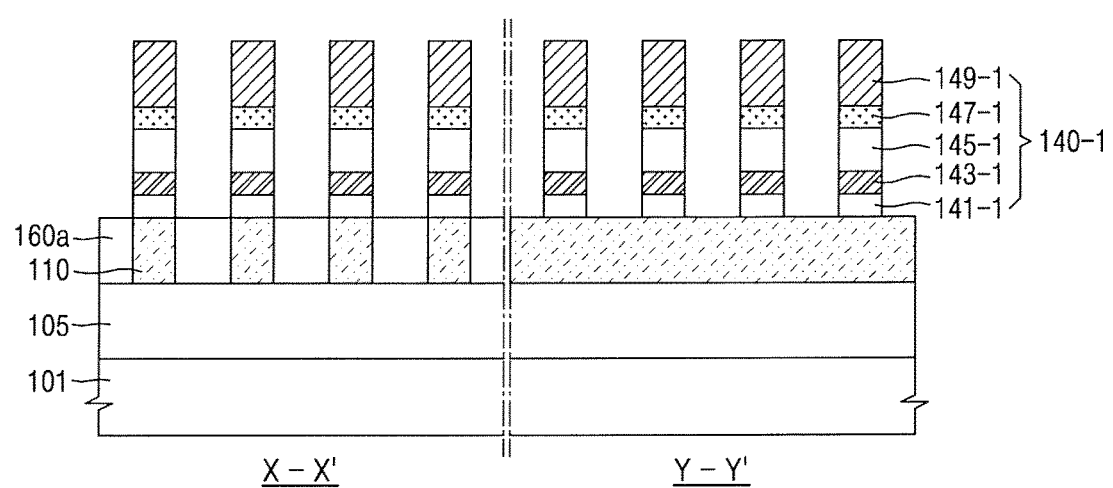

Referring to FIG. 22B, after the formation of the first stack 1401-1, mask patterns, which are spaced apart from each other in the first and second directions X and Y, may be formed on the first stack 1401-1. Next, the first stack 1401-1 may be etched using the mask patterns as an etch mask to partially expose top surfaces of the first insulating layer 160*a* and the first electrode lines 110. As a result, a plurality of the first memory cells 140-1 may be formed on the substrate 101.

The first memory cells 140-1 may be formed to have the same arrangement as the mask patterns. That is, the first memory cells 140-1 may be spaced apart from each other in the first and second directions X and Y. Furthermore, the first memory cells 140-1 may be electrically connected to the first electrode lines 110 thereunder. Each of the first memory cells 140-1 may include the lower electrode 141-1, the selection device 143-1, the second intermediate electrode 145-1, the heating electrode 147-1, and the variable resistance pattern 149-1 sequentially stacked on the first electrode line 110. After the formation of the memory cells 140-1, the mask patterns may be removed via an ashing and/or strip process.

Figure 22C:
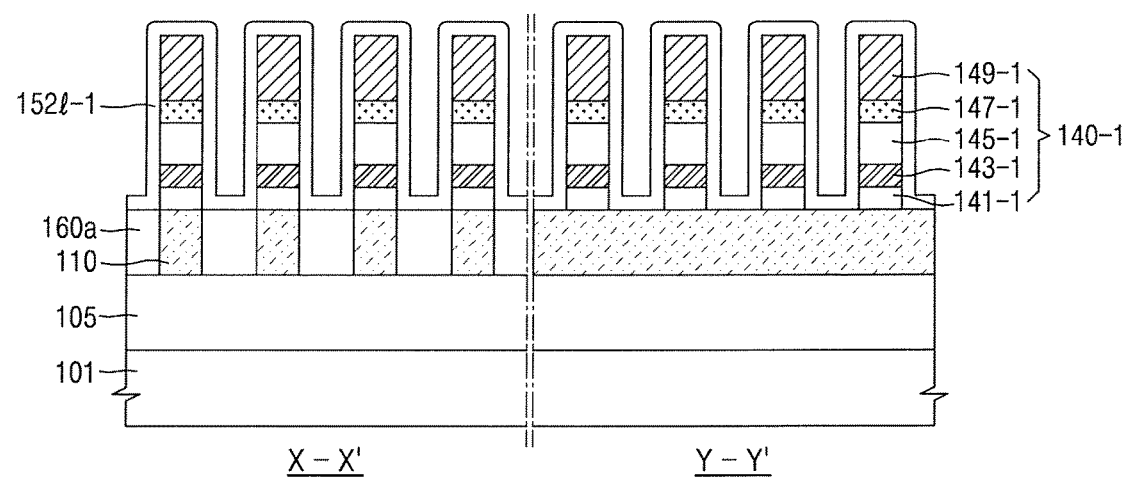

Referring to FIG. 22C, an inner spacer layer 1521-1 may be formed to a uniform thickness on the first memory cells 140-1, the first insulating layer 160a, and the first electrode lines 110. The inner spacer layer 1521-1 may be formed by using a suitable conformal deposition technique (e.g., CVD or ALD). The inner spacer layer 1521-1 may be the same as the inner spacers 152-1 and 152-2 of FIGS. 2 and 3 in terms of its material or function.

Figure 22D:
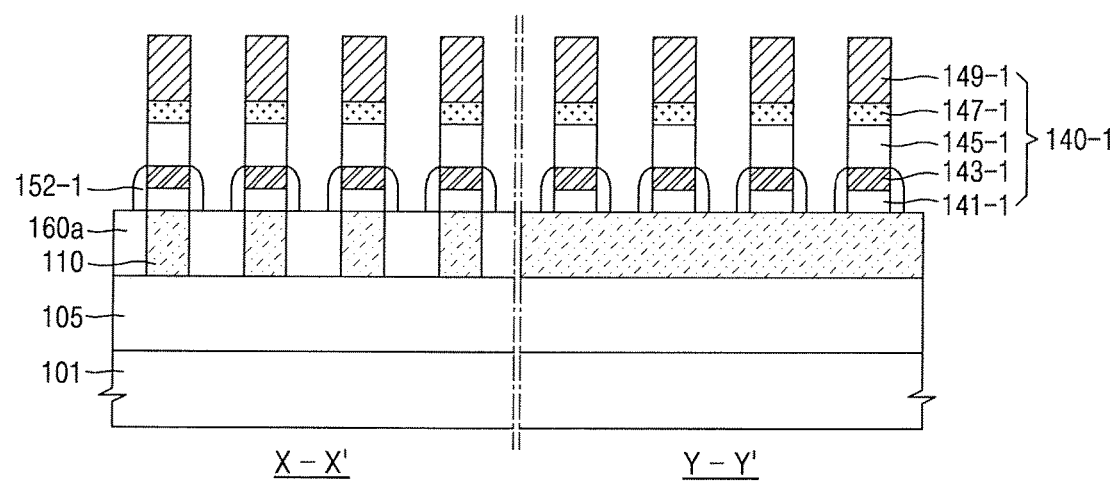

Referring to FIG. 22D, the inner spacer layer 1521-1 may be etched using, for example, an etch-back process and/or a dry etching process to have portions of the inner spacer layer 1521-1 remain on the side surfaces of the lower electrode 141-1 and the selection device 143-1, and to remove the other portions from other regions. The portions of the inner spacer layer 1521-1 remaining on the side surfaces of the lower electrode 141-1 and the selection device 143-1 may constitute the first inner spacers 152-1.

Figure 22E:
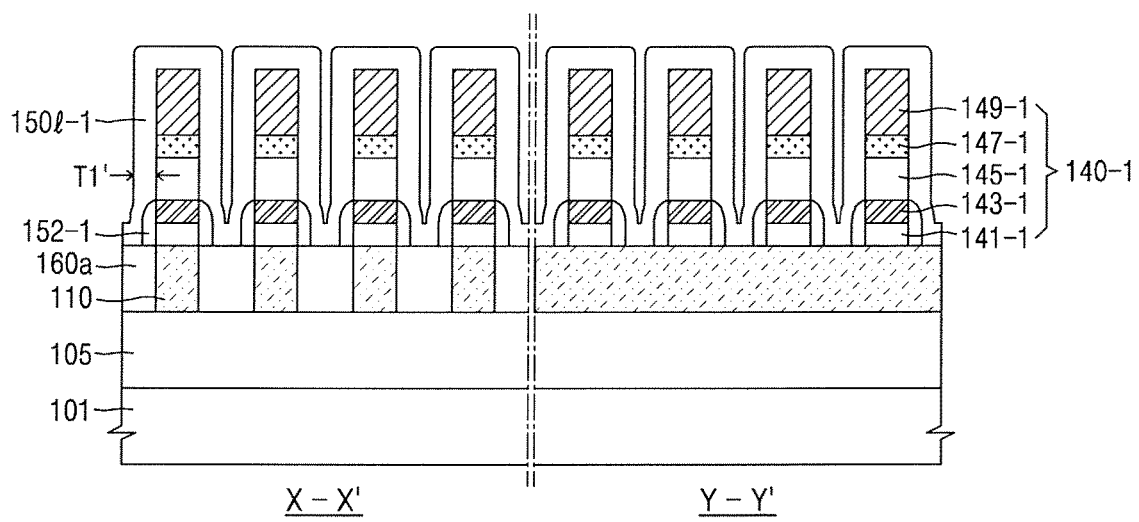

Referring to FIG. 22E, a first spacer layer 1501-1 may be formed to a uniform thickness on the first memory cells 140-1, the first insulating layer 160a, the first electrode lines 110, and the first inner spacers 152-1. The first spacer layer 1501-1 may be formed by using a suitable conformal deposition technique (e.g., CVD or ALD) and may be substantially the same as the spacers 150-1 and 150-2 of FIGS. 2 and 3 in terms of its material or function.

The first spacer layer 1501-1 may be formed to have a first initial thickness T1'. The first initial thickness T1' may be suitably determined in consideration of a first thickness T1 of the first spacer 150-1, which is to be determined as a result of a subsequent etching process.

Figure 22F:
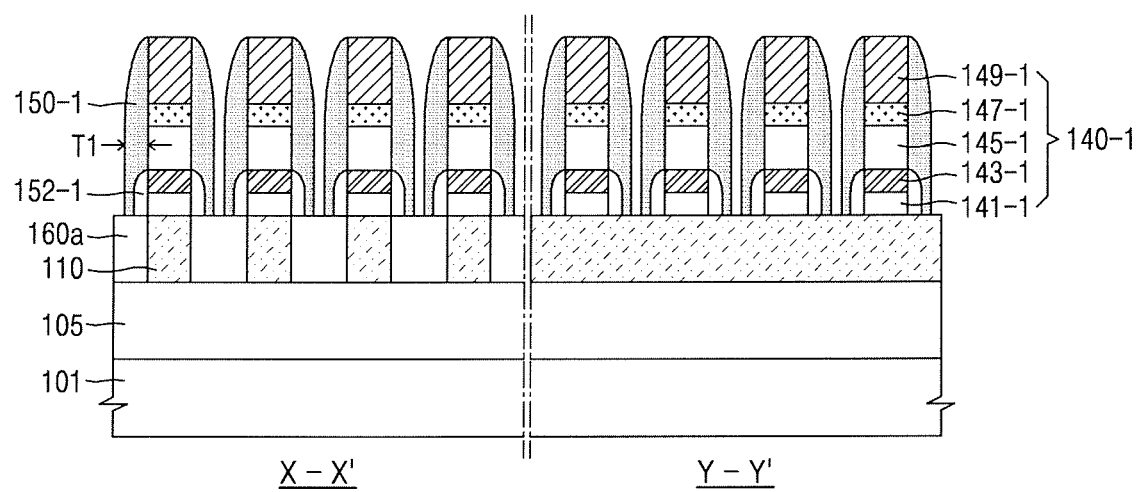

Referring to FIG. 22F, the first spacer layer 1501-1 may be etched using, for example, an etch-back process and/or a dry etching process, and thus, the first spacers 150-1 may be formed on the side surfaces of the first memory cells 140-1. As described above, the first spacer 150-1 may be formed to have the first thickness T1 and to cover the first inner spacer 152-1.

Figure 22G:
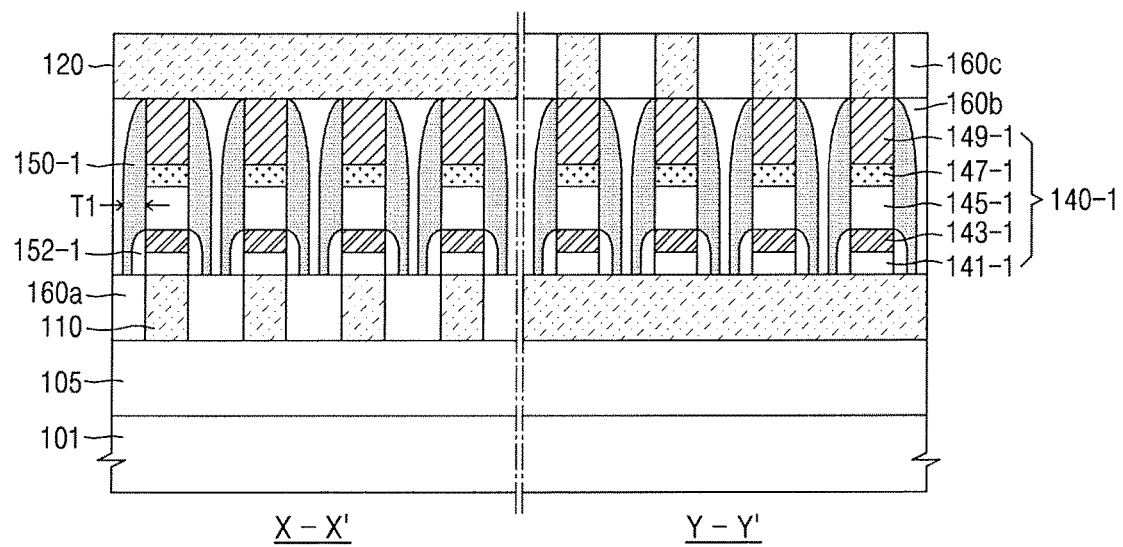

Referring to FIG. 22G, the second insulating layer 160b may be formed to fill a space between the first memory cells 140-1. The second insulating layer 160b may be formed of an insulating material (e.g., oxide or nitride) that may be the same as or different from that of the first insulating layer 160a. The insulating layer may be formed to a thickness that is large enough to completely fill gap regions between the first memory cells 140-1, and then a chemical-mechanical polishing (CMP) process may be performed to expose the top surface of the variable resistance pattern 149-1 and thereby to form the second insulating layer 160b.

The second electrode lines 120 may be formed by forming a conductive layer for the second electrode line layer and patterning the conductive layer using an etching process. The second electrode lines 120 may extend in the second direction Y and may be spaced apart from each other in the first direction X. The third insulating layer 160c extending in the second direction Y may be provided between the second electrode lines 120.

As described above, the second electrode lines 120 may be formed via an etching process, but the inventive concept is not limited thereto. For example, the second electrode lines 120 may be formed via a damascene process. The damascene process for forming the second electrode lines 120 may include forming an insulating layer on the first memory cells 140-1 and the second insulating layer 160b and etching the insulating layer to form trenches extending in the second direction Y and exposing the top surface of the variable resistance pattern 149-1. Thereafter, a conductive material may be formed to fill the trenches, and the second electrode lines 120 may be formed by planarizing the conductive material. In an exemplary embodiment of the inventive concept, the insulating layer filling the gap regions between the first memory cells 140-1 may be formed to be thick enough to form the trenches therein, and the second electrode lines 120 may be formed in the trench. In this case, the second and third insulating layers 160b and 160c may be formed of the same material and may be connected to each other, thereby having a single-body structure.

Figure 22H:
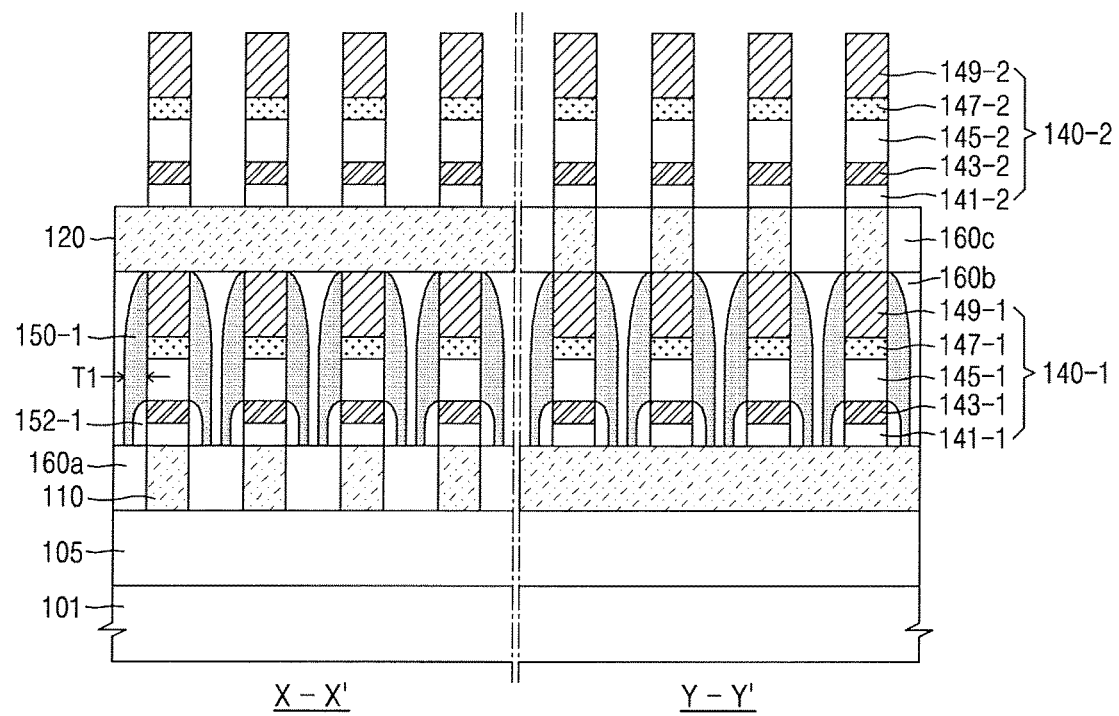

Referring to FIG. 22H, a second stack, which has the same structure as that of the first stack 1401-1 of FIG. 22A, may be formed on the second electrode lines 120. The second stack may be patterned to form the second memory cells 140-2, which are spaced apart from each other in the first and second directions X and Y and are electrically connected to the second electrode lines 120. Similar to the first memory cells 140-1, each of the second memory cells 140-2 may include the lower electrode 141-2, the selection device 143-2, the second intermediate electrode 145-2, the heating electrode 147-2, and the variable resistance pattern 149-2 sequentially stacked on the second electrode line 120.

Figure 22I:
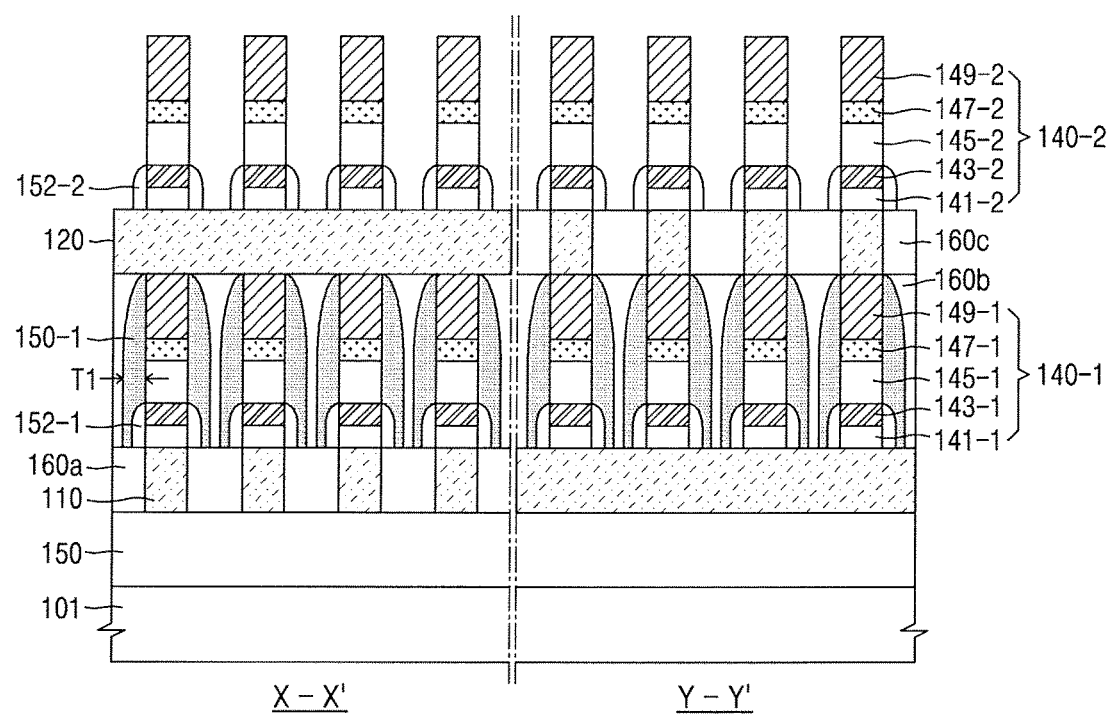

Referring to FIG. 22I, the second inner spacers 152-2 may be formed on the side surfaces of the second memory cells 140-2. The second inner spacers 152-2 may be formed by using the same method as that for the first inner spacers 152-1 described with reference to FIGS. 22C and 22D. Each of the second inner spacers 152-2 may be formed to cover side surfaces of the lower electrode 141-2 and the selection device 143-2.

Figure 22J:
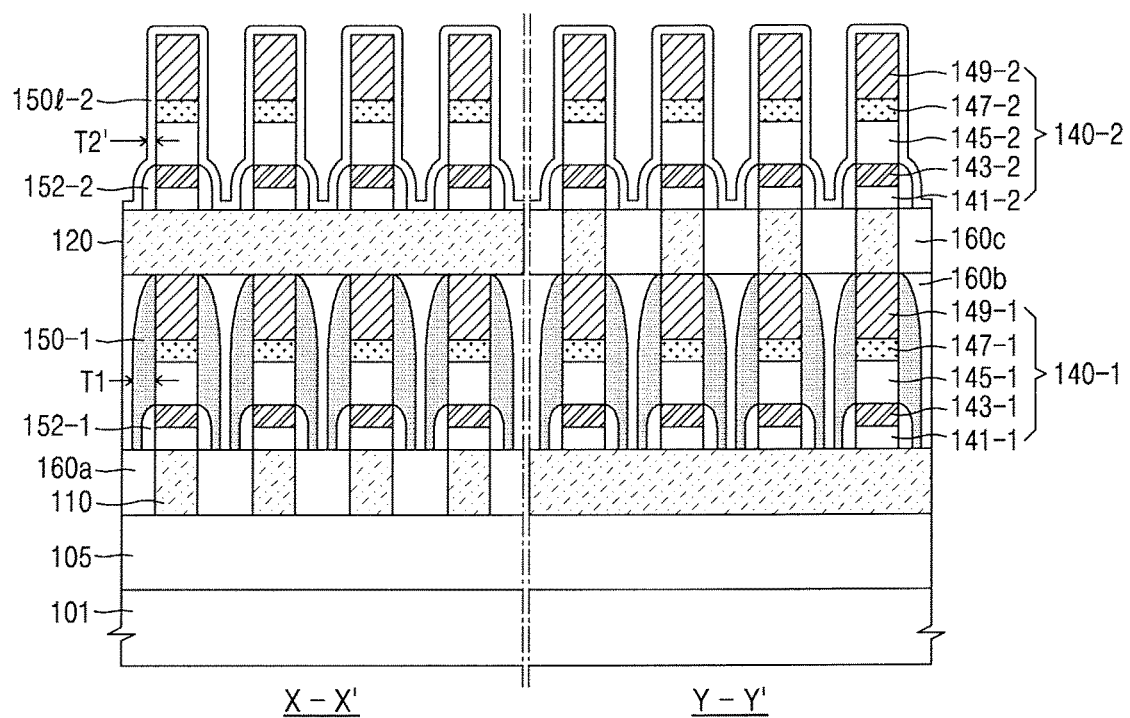

Referring to FIG. 22J, a second spacer layer 1501-2 may be formed to a uniform thickness on the second memory cells 140-2, the third insulating layer 160c, the second electrode lines 120, and the second inner spacers 152-2. The second spacer layer 1501-2 may be formed by using a suitable conformal deposition technique (e.g., CVD or ALD) and may be substantially the same as the spacers 150-1 and 150-2 of FIGS. 2 and 3 in terms of its material or function.

The second spacer layer 1501-2 may be formed to have an initial second thickness T2'. The initial second thickness T2' may be suitably determined in consideration of a second thickness T2 of the second spacer 150-2, which is to be determined as a result of a subsequent etching process.

Figure 22K:
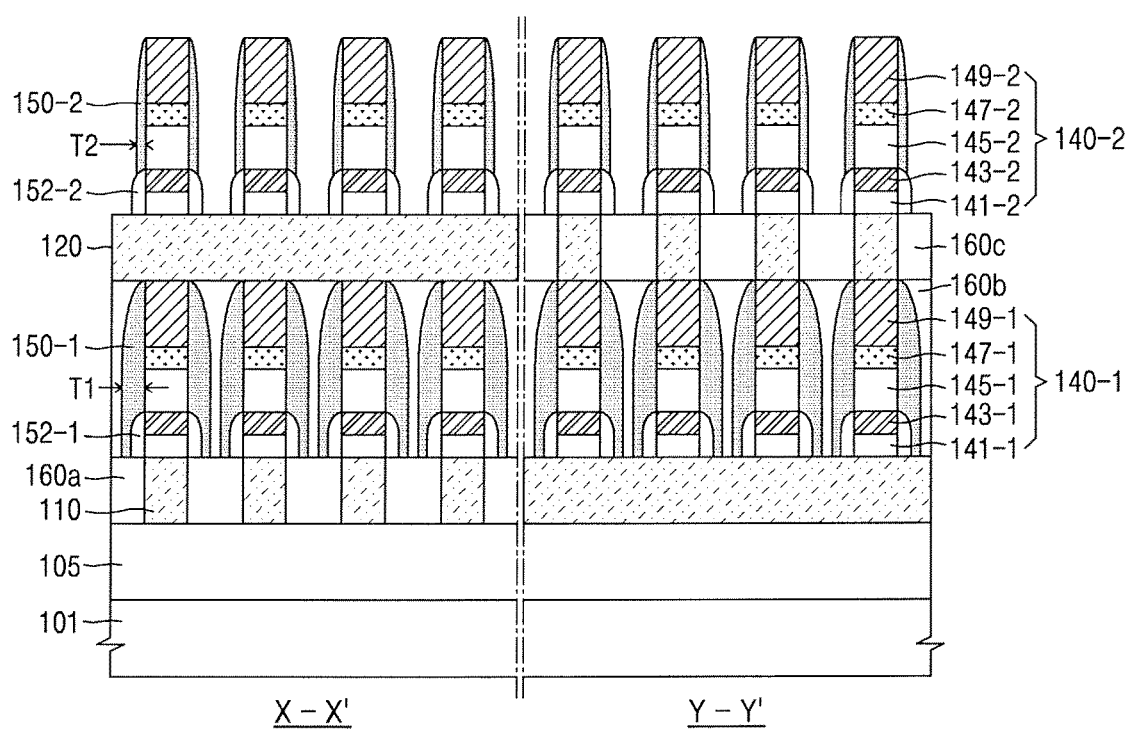

Referring to FIG. 22K, the second spacer layer 1501-2 may be etched using, for example, an etch-back process and/or a dry etching process to form the second spacers 150-2 on the side surfaces of the second memory cells 140-2. As described above, the second spacer 150-2 may have the second thickness T2. As shown in FIG. 22K, the second spacer 150-2 may not cover the second inner spacer 152-2. The second spacer 150-2 may only cover the side surfaces of the second intermediate electrode 145-2, the heating electrode 147-2, and the variable resistance pattern 149-2. However, in an exemplary embodiment of the inventive concept, the second spacer 150-2 may be formed to cover the second inner spacer 152-2.

Figure 22L:
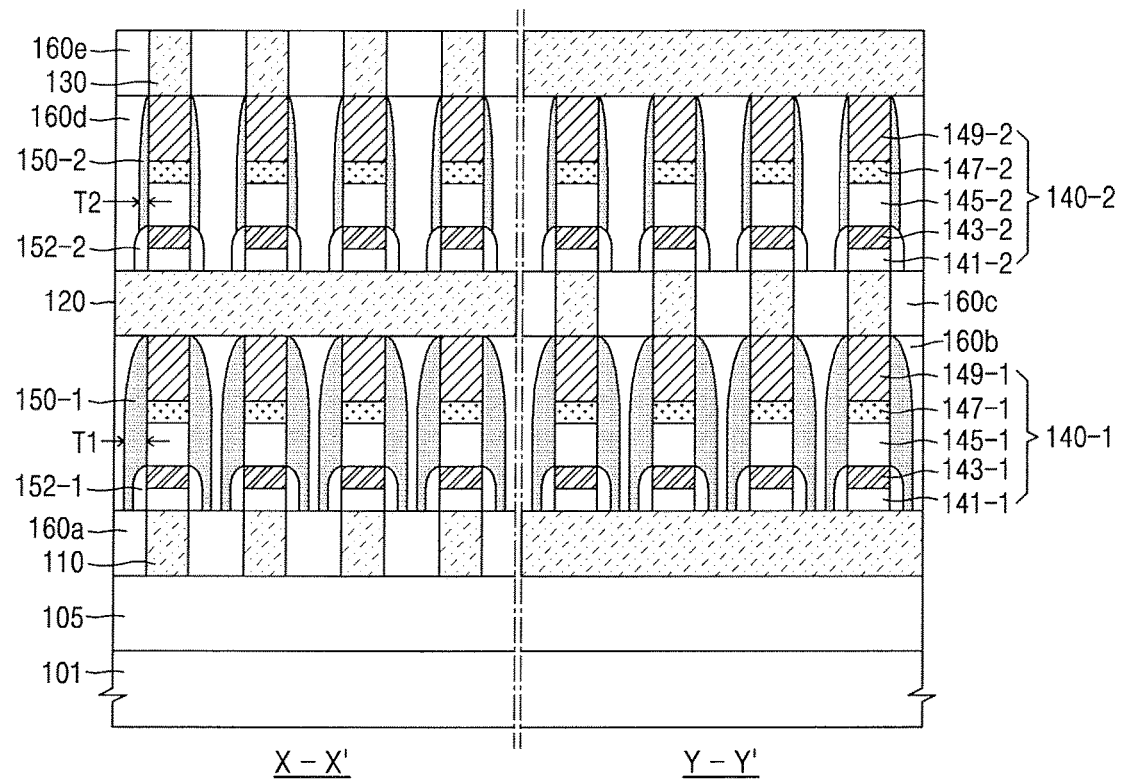

Referring to FIG. 22L, the fourth insulating layer 160d may be formed to fill gap regions between the second memory cells 140-2, and then, the third electrode lines 130 may be formed on the second memory cells 140-2 and the fourth insulating layer 160d. The resulting structure provided with the third electrode lines 130 may be the same as that of the memory device 100 of FIG. 3. The third electrode lines 130 may be formed by using a similar method to that for the second electrode lines 120 described with reference to FIG. 22G. However, like the first electrode lines 110, the third electrode lines 130 may extend in the first direction X and may be spaced apart from each other in the second direction Y, and the fifth insulating layer 160e extending the first direction X may be provided between the third electrode lines 130. In an exemplary embodiment of the inventive concept, the fourth insulating layer 160d and the fifth insulating layer 160e may be formed to have a single-body structure.

Thereafter, the second interlayered insulating layer 170 may be formed on the third electrode lines 130, and the process steps of FIGS. 22A to 22L may be performed again on the second interlayered insulating layer 170 to realize the memory device 1000 of the four-layer structure described with reference to FIG. 17. Furthermore, the process steps may be further performed to realize a memory device having a six-or-more layer structure.

Figure 23A:
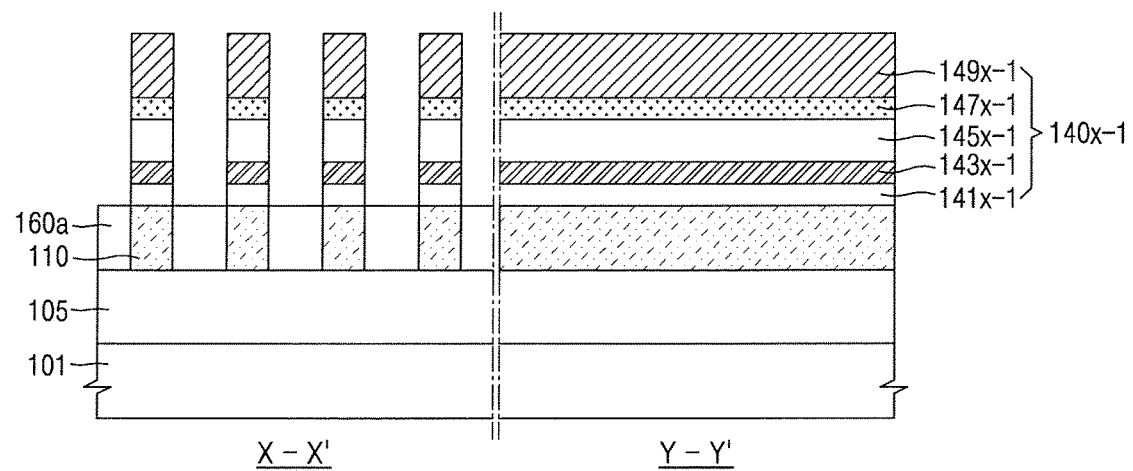
FIGS. 23A to 23C are sectional views for describing a process of fabricating a memory device (e.g., of FIG. 3) according to an exemplary embodiment of the inventive concept.
Figure 23B:
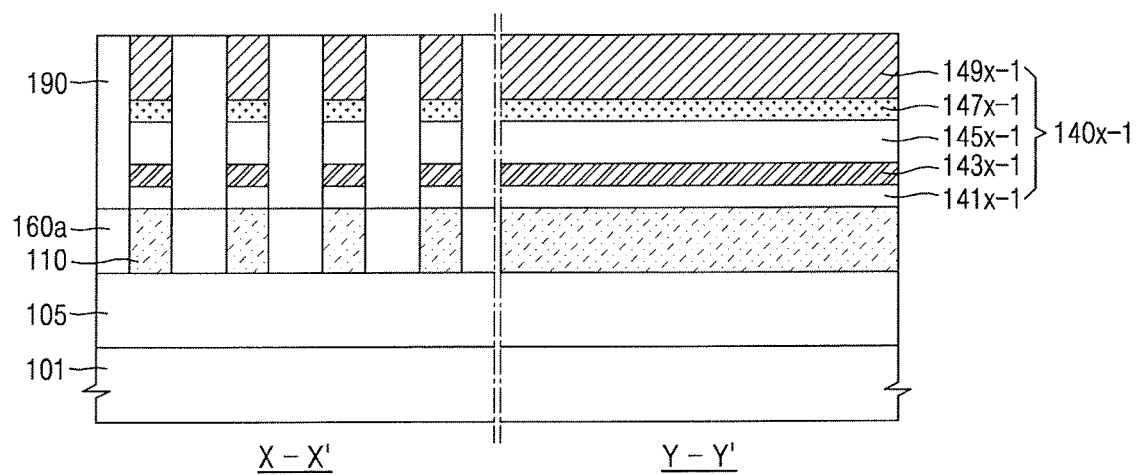
Figure 23C:
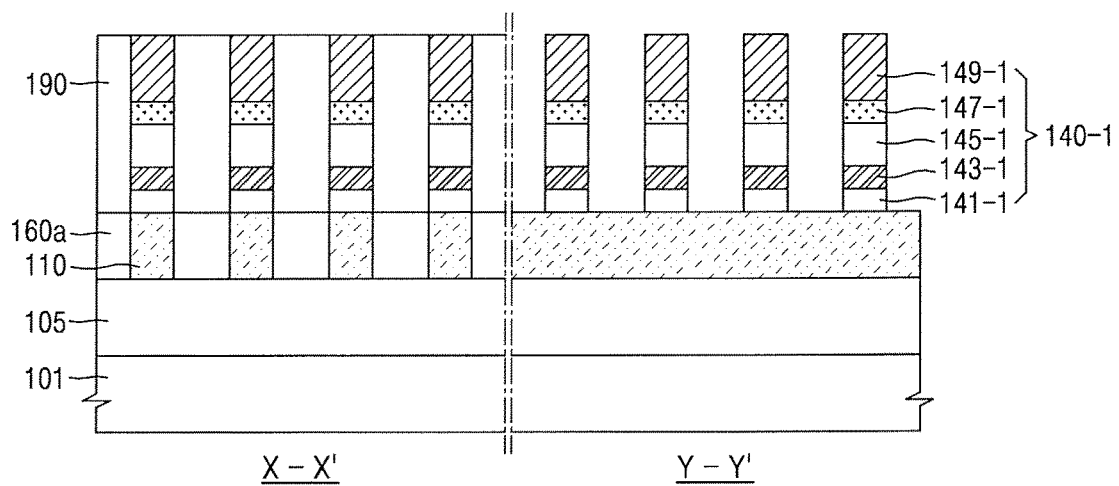

FIGS. 23A to 23C are sectional views for describing a process of fabricating a memory device (e.g., of FIG. 3) through a method different from that for the first memory cells 140-1 of FIG. 22B.

Referring to FIG. 23A, a patterning process using a line-shaped first mask pattern extending in the first direction X may be performed on the first stack 1401-1 (e.g., of FIG. 22A) to form a plurality of first line structures 140x-1, which extend in the first direction X and are spaced apart from each other in the second direction Y.

Referring to FIG. 23B, an insulating layer may be formed to fill gap regions between the first line structures 140x-1 and may be planarized to expose a top surface of a variable resistance pattern 149x-1. A first gap-fill layer 190 may be formed as a result of the planarization of the insulating layer.

Referring to FIG. 23C, a line-shaped second mask pattern extending in the second direction Y may be formed on the first line structures 140x-1 and the first gap-fill layer 190. The first line structures 140x-1 and the first gap-fill layer 190 may be etched using the second mask pattern to form a plurality of first memory cells 140-1 (e.g., of FIG. 22B) spaced apart from each other in the first and second directions X and Y. Thereafter, a remaining portion 190 of the first gap-fill layer may be removed to form the first memory cells 140-1 shown in FIG. 22B.

Figure 24:
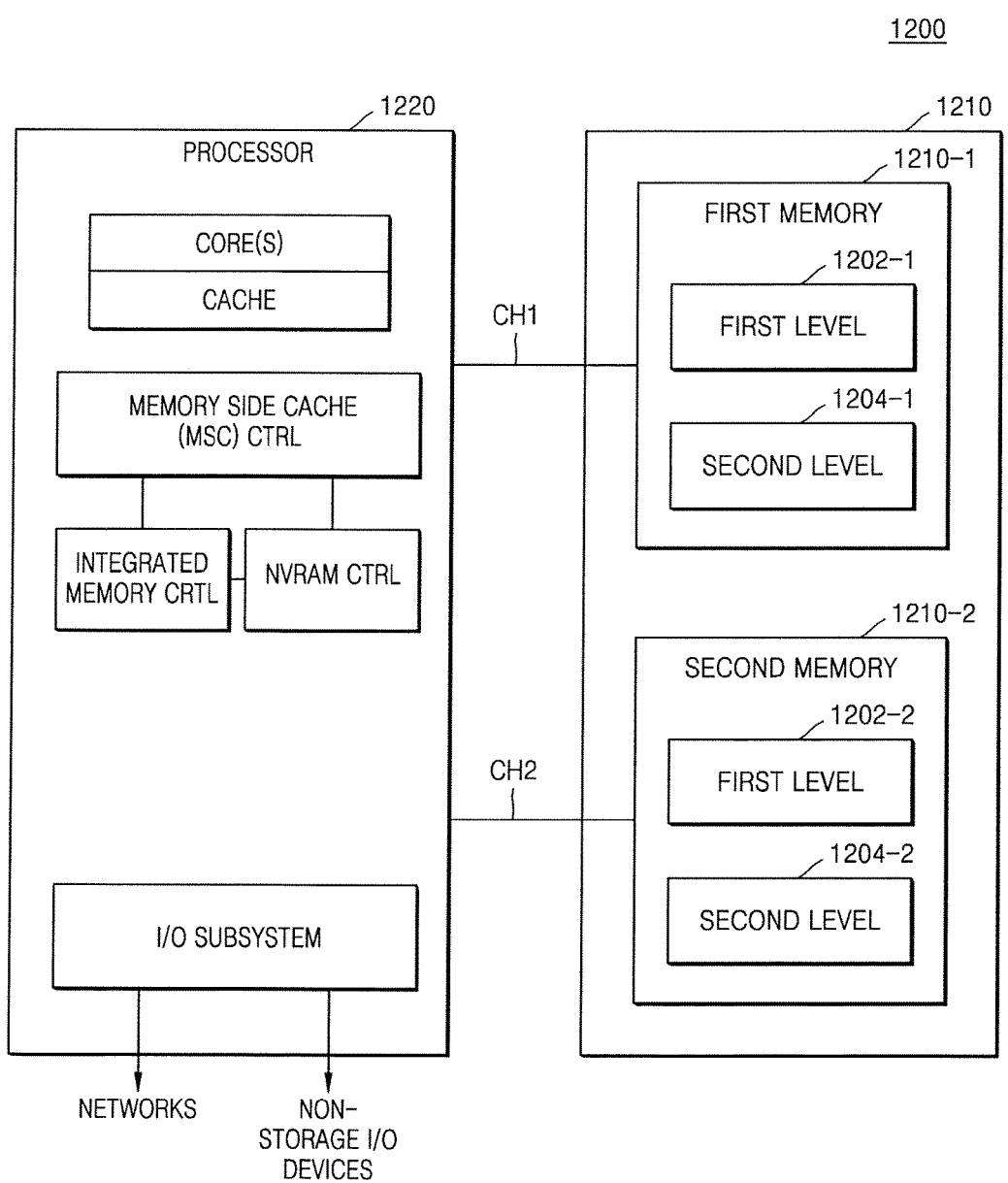
FIG. 24 is a block diagram of a computer system according to an exemplary embodiment of the inventive concept.

FIG. 24 is a block diagram of a computer system according to an exemplary embodiment of the inventive concept.

Referring to FIG. 24, a computer system 1200 may include a processor 1220 and a memory system 1210. The processor 1220 may include a plurality of cores, which are configured to execute commands and process data, and one or more processor caches, which are configured to store the commands and data. In addition, the processor may further include a memory controller configured to control the one or more caches and a memory device, which is provided in the memory system 1210. For example, the processor 1220 may include at least one of a memory-side cache (MSC) controller, a nonvolatile RAM controller, and an integrated memory controller. Meanwhile, the processor 1220 may include an I/O sub system, and the processor 1220 may communicate an external network and/or I/O devices through the I/O sub system.

The memory system 1210 may include a first memory device 1210-1 and a second memory device 1210-2. The first and second memory devices 1210-1 and 1210-2 may be classified based on which memory channels are used to connect them to the processor 1220. Thus, the memory channel may include at least one signal line connected to the processor. The first memory device 1210-1 may be connected to the processor 1220 through a first memory channel CH1. The first memory device 1210-1 may include two types of memory devices. For example, the first memory device 1210-1 may include a first level memory 1202-1 and a second level memory 1204-1. The first level memory 1202-1 may have a first operation speed (e.g., a first read access and a first write access speed). Also, the second level memory 1204-1 may have a second operation speed (e.g., a second read access speed and a second write access speed). Here, the first operation speed may be faster than the second operation speed. Meanwhile, the first level memory 1202-1 with a high operation speed may be used as a cache for temporarily storing commands or data to be stored in the second level memory 1204-1.

The second memory device 1210-2 may be connected to the processor 1220 through a second memory channel CH2. The second memory device 1210-2 may also include two types of memory devices. For example, the second memory device 1210-2 may include a first level memory 1202-2 and a second level memory 1204-2. The first level memory 1202-2 may have the first operation speed, and the second level memory 1204-2 may have the second operation speed. In the second memory device 1210-2, the first level memory 1202-2 with a high operation speed may be used as a cache for temporarily storing commands or data to be stored in the second level memory 1204-2.

Each of the first level memories 1202-1 and 1202-2 may include, for example, a DRAM device. Each of the second level memories 1204-1 and 1204-2 may include, for example, a nonvolatile RAM device. Here, the nonvolatile RAM device may include one of phase-change RAM (PRAM), ReRAM, and MRAM devices. In an exemplary embodiment of the inventive concept, the nonvolatile RAM may include at least one of the memory device 100 shown in FIGS. 1 to 3, the memory devices 100a-100j shown in FIGS. 7 to 14, 15A, and 15B, the memory device 1000 shown in FIGS. 16 and 17, the memory device 100k shown in FIGS. 18 and 19, the memory device 100l shown in FIG. 20, and the memory device 1000a shown in FIG. 21.

While the inventive concept has been particularly shown and described with reference to the exemplary embodiments of the inventive concept thereof, it will be understood that various changes in form and details may be made therein without departing from the spirit and scope of the following claims.

What is claimed is:

1. A memory device, comprising:
   a first electrode line layer provided on a substrate, the first electrode line layer comprising a plurality of first electrode lines which extend in a first direction and are spaced apart from each other;
   a second electrode line layer provided on the first electrode line layer, the second electrode line layer comprising a plurality of second electrode lines which extend in a second direction different from the first direction and are spaced apart from each other;
   a third electrode line layer provided on the second electrode line layer, the third electrode line layer comprising a plurality of first electrode lines;
   a first memory cell layer provided between the first and second electrode line layers, the first memory cell layer comprising a plurality of first memory cells arranged at respective intersections of the plurality of first electrode lines of the first electrode line layer and the plurality of second electrode lines;
   a second memory cell layer provided between the second and third electrode line layers, the second memory cell layer comprising a plurality of second memory cells arranged at respective intersections of the plurality of second electrode lines and the plurality of first electrode lines of the third electrode line layer;

a first spacer covering side surfaces of each of the plurality of first memory cells; and a second spacer covering side surfaces of each of the plurality of second memory cells, wherein each of the plurality of first and second memory cells comprises a selection device, an electrode, and a variable resistance pattern stacked in an upward or downward direction, and the first spacer has a thickness different from that of the second spacer.

2. The memory device of claim 1, wherein the thickness of each of the first and second spacers is a thickness measured in a direction normal to a side surface of the variable resistance pattern, and the thickness of the first or second spacer is adjusted so that the first and second memory cells have substantially the same resistance.

3. The memory device of claim 2, wherein the resistance is a set or reset resistance of the first and second memory cells.

4. The memory device of claim 3, wherein the set resistance of the first or second memory cells covered by the first or second spacer having a large thickness is substantially the same as the set resistance of the second memory cells or the first memory cells covered by the second spacer or the first spacer having a small thickness.

5. The memory device of claim 1, wherein each of the first and second memory cells comprises a heating electrode in contact with the variable resistance pattern.

6. The memory device of claim 1, wherein each of the first and second memory cells comprises a lower electrode in contact with the selection device, and side surfaces of the selection device and the lower electrode are covered by an inner spacer.

7. The memory device of claim 1, wherein one of the first and second spacers comprises a material exerting a compressive stress on the variable resistance pattern, and the other of the first and second spacers comprises a material exerting a tensile stress on the variable resistance pattern.

8. The memory device of claim 1, further comprising:

at least one first upper electrode line layer provided on the third electrode line layer, each of the at least one first upper electrode line layer comprising a plurality of first electrode lines;

at least one second upper electrode line layer provided on a corresponding one of the at least one first upper electrode line layer, each of the at least one second upper electrode line layer comprising a plurality of second electrode lines; and at least two upper memory cell layers provided between the first upper electrode line layer and the second upper electrode line layer, each of the at least two upper memory cell layers comprising a plurality of memory cells arranged at respective intersections of the plurality of first electrode lines of the first upper electrode line layer and the plurality of second electrode lines of the second upper electrode line layer.

9. The memory device of claim 1, wherein the variable resistance pattern comprises at least one of GeSbTe, InSbTe, and BiSbTe, or comprises a super lattice structure, in which GeTe and SbTe layers are alternately stacked.

10. The memory device of claim 1, wherein each of the first and second memory cells comprises a heating electrode in contact with the variable resistance pattern, and the heating electrode comprises a carbon-based conductive material.

11. The memory device of claim 1, wherein the selection device comprises one of an ovonic threshold switching (OTS) device, a diode, and a transistor.

12. The memory device of claim 1, wherein at least one of the selection device and the variable resistance pattern has one of a pillar structure, a pyramid structure, an "L"-shaped structure, and a dash-shaped structure.

13. A memory device, comprising:

a first electrode line layer provided on a substrate, the first electrode line layer comprising a plurality of first electrode lines which extend in a first direction and are spaced apart from each other;

a second electrode line layer provided on the first electrode line layer, the second electrode line layer comprising a plurality of second electrode lines which extend in a second direction different from the first direction and are spaced apart from each other;

a third electrode line layer provided on the second electrode line layer, the third electrode line layer comprising a plurality of first electrode lines;

a first memory cell layer provided between the first and second electrode line layers, the first memory cell layer comprising a plurality of first memory cells arranged at respective intersections of the plurality of first electrode lines of the first electrode line layer and the plurality of second electrode lines;

a second memory cell layer provided between the second and third electrode line layers, the second memory cell layer comprising a plurality of second memory cells arranged at respective intersections of the plurality of second electrode lines and the plurality of first electrode lines of the third electrode line layer;

a first spacer covering side surfaces of each of the plurality of first memory cells; and a second spacer covering side surfaces of each of the plurality of second memory cells, wherein each of the plurality of first and second memory cells comprises a selection device, an electrode, and a variable resistance pattern stacked in an upward or downward direction, and at least one of the first spacer and the second spacer comprises a material exerting a compressive or tensile stress on the variable resistance pattern.

14. The memory device of claim 13, wherein one of the first spacer and the second spacer comprises a material exerting a compressive stress on the variable resistance pattern, and the other comprises a material exerting a tensile stress on the variable resistance pattern.

15. The memory device of claim 13, wherein each of the first and second memory cells comprises a lower electrode in contact with the selection device, side surfaces of the selection device and the lower electrode are covered by an inner spacer, and at least one of the first spacer and the second spacer covers the inner spacer.

16. The memory device of claim 13, further comprising:

at least one first upper electrode line layer provided on the third electrode line layer, each of the at least one first upper electrode line layer comprising a plurality of first electrode lines;

at least one second upper electrode line layer provided on a corresponding one of the at least one first upper electrode line layer, each of the at least one second upper electrode line layer comprising a plurality of second electrode lines; and at least two upper memory cell layers provided between the first upper electrode line layer and the second upper electrode line layer, each of the at least two upper memory cell layers comprising a plurality of memory cells arranged at respective intersections of the plurality of first electrode lines of the first upper electrode line layer and the plurality of second electrode lines of the second upper electrode line layer.

17. An electronic apparatus, comprising:
a processor configured to perform commands and to process data;
a memory channel comprising at least one signal line connected to the processor;
a first memory device connected to the processor through the memory channel, the first memory device comprising a first level memory having a first operation speed and a nonvolatile property; and
a second memory device connected to the processor through the memory channel, the second memory device comprising a second level memory having a second operation speed that is faster than the first operation speed,
wherein the first level memory comprises at least two memory cell layers, each of which has a cross-point structure and comprises a plurality of memory cells,
each of the plurality of memory cells comprises a selection device, an electrode, and a variable resistance pattern, and
a first spacer covering the side surfaces of each of the plurality of memory cells in one of the at least two memory cell layers has a thickness different from that of a second spacer covering the side surfaces of each of the plurality of memory cells in at least one other of the at least two memory cell layers.

18. The electronic apparatus of claim 17, wherein the cross-point structure comprises:

a first electrode line layer comprising a plurality of first electrode lines, which extend in a first direction and are spaced apart from each other;
a second electrode line layer provided on or below the first electrode line layer, the second electrode line layer comprising a plurality of second electrode lines, which extend in a second direction different from the first direction and are spaced apart from each other; and
the plurality of memory cells arranged between the first electrode line layer and the second electrode line layer and at respective intersections of the plurality of first electrode lines and the plurality of second electrode lines,
wherein the first memory device comprises the at least two memory cell layers, which are realized by extending the cross-point structure in a third direction perpendicular to the first and second directions.

19. The electronic apparatus of claim 17, wherein each of the plurality of memory cells comprises a lower electrode in contact with the selection device,
side surfaces of the selection device and the lower electrode are covered by an inner spacer, and
the spacers covering the side surfaces of the plurality of memory cells cover the inner spacers.

20. The electronic apparatus of claim 17, wherein the first spacer covering the side surfaces of the plurality of memory cells in the one of the at least two memory cell layers comprises a material exerting a compressive stress on the variable resistance pattern, and
the second spacer covering the side surfaces of the plurality of memory cells in the at least one other of the at least two memory cell layers comprises a material exerting a tensile stress on the variable resistance pattern.

* * * * *